(12) United States Patent
Anderson et al.

(10) Patent No.: US 7,250,944 B2
(45) Date of Patent: Jul. 31, 2007

(54) GEOGRAPHIC VIEW OF A MODELLING SYSTEM

(75) Inventors: Mark Stephen Anderson, Edinburgh (AU); Dean Crawford Engelhardt, Edinburgh (AU); Damian Andrew Marriott, Edinburgh (AU); Suneel Singh Randhawa, Edinburgh (AU)

(73) Assignee: The Commonweath of Australia, Canberra (AU)

( * ) Notice: Subject to any disclaimer, the term of this patent is extended or adjusted under 35 U.S.C. 154(b) by 733 days.

(21) Appl. No.: 10/312,806

(22) PCT Filed: Apr. 30, 2002

(86) PCT No.: PCT/AU02/00531

§ 371 (c)(1),
(2), (4) Date: Mar. 21, 2003

(87) PCT Pub. No.: WO02/088927

PCT Pub. Date: Nov. 7, 2002

(65) Prior Publication Data

US 2004/0036721 A1 Feb. 26, 2004

(30) Foreign Application Priority Data

Apr. 30, 2001 (AU) .................................. PR4646

(51) Int. Cl.
*G06T 15/00* (2006.01)
(52) U.S. Cl. ...................... 345/419; 345/427; 709/203; 715/502
(58) Field of Classification Search ................ 346/419, 346/424, 427; 709/203, 209; 715/502
See application file for complete search history.

(56) References Cited

U.S. PATENT DOCUMENTS 5,434,978 A 7/1995 Dockter et al. ............. 709/230

(Continued)

FOREIGN PATENT DOCUMENTS

| WO | WO 99/44160 | 9/1999 |
| WO | WO 01/15017 | 3/2001 |
| WO | WO 0193599 | 12/2001 |
| WO | WO 02/088924 | 11/2002 |
| WO | WO 02/088925 | 11/2002 |
| WO | WO 02/088926 | 11/2002 |
| WO | WO 02/088988 | 11/2002 |

OTHER PUBLICATIONS

Campbell et al., Web3D in Ocean Science Learning Environments: Virtual Big Beef Creek, pp. 85-91; ACM proceeding, Feb. 2002.*

(Continued)

*Primary Examiner*—Phu K. Nguyen
(74) *Attorney, Agent, or Firm*—Beyer Weaver LLP

(57) ABSTRACT

Geo View is a three-dimensional virtual universe in which a real-world or virtual object may be represented by one or more virtual objects whose attributes are derived from attributes of the real-world object via a flexible user-specifiable mapping. Typically a two-dimensional plane located in three-dimensional space is used to visualize the universe of interest. The placement of virtual objects in the universe typically having a shape is governed by the absolute or relative geographical location of the real-world objects, and also by a flexible set of user-specified layout rules. In addition to the visualisation of various objects, the human observer can attach sounds to objects. The representation of real-world objects with rapidly time-changing attributes may be simplified by the use of Synthetic Strobes, flexible user-specified filters which shift changes in the visual attributes of a shape from one time-domain to another.

26 Claims, 19 Drawing Sheets

U.S. PATENT DOCUMENTS

| | | | | |
|---|---|---|---|---|
| 5,555,354 | A | 9/1996 | Strasnick et al. | 345/427 |
| 5,778,157 | A | 7/1998 | Oatman et al. | 706/50 |
| 5,790,789 | A | 8/1998 | Suarez | 709/202 |
| 5,801,696 | A | 9/1998 | Roberts | 715/781 |
| 5,802,296 | A | 9/1998 | Morse et al. | 709/209 |
| 5,907,328 | A | 5/1999 | Brush II et al. | 709/203 |
| 5,973,678 | A | 10/1999 | Stewart et al. | 345/184 |
| 6,034,692 | A | 3/2000 | Gallery et al. | 345/427 |
| 6,064,984 | A | 5/2000 | Ferguson et al. | 715/502 |
| 6,222,547 | B1 | 4/2001 | Schwuttke et al. | 345/419 |
| 6,842,175 | B1* | 1/2005 | Schmalstieg et al. | 345/427 |
| 6,930,681 | B2* | 8/2005 | Raskar et al. | 345/419 |
| 6,989,831 | B2* | 1/2006 | Ebersole et al. | 345/420 |
| 6,999,956 | B2* | 2/2006 | Mullins | 707/2 |
| 7,027,055 | B2* | 4/2006 | Anderson et al. | 345/473 |

OTHER PUBLICATIONS

Bass, T. (Apr. 2000). "Intrustion Detection Systems & Multisensor Fusion: Creating Cyberspace Situational Awareness," *Communications of the ACM* 43(4):99-105.

Spafford, E. and Zanboni, D. "Intrusion Detection Using Autonomous Agents," *Journal of Computer Networks* 34: 547-570, Jun. 2000.

* cited by examiner

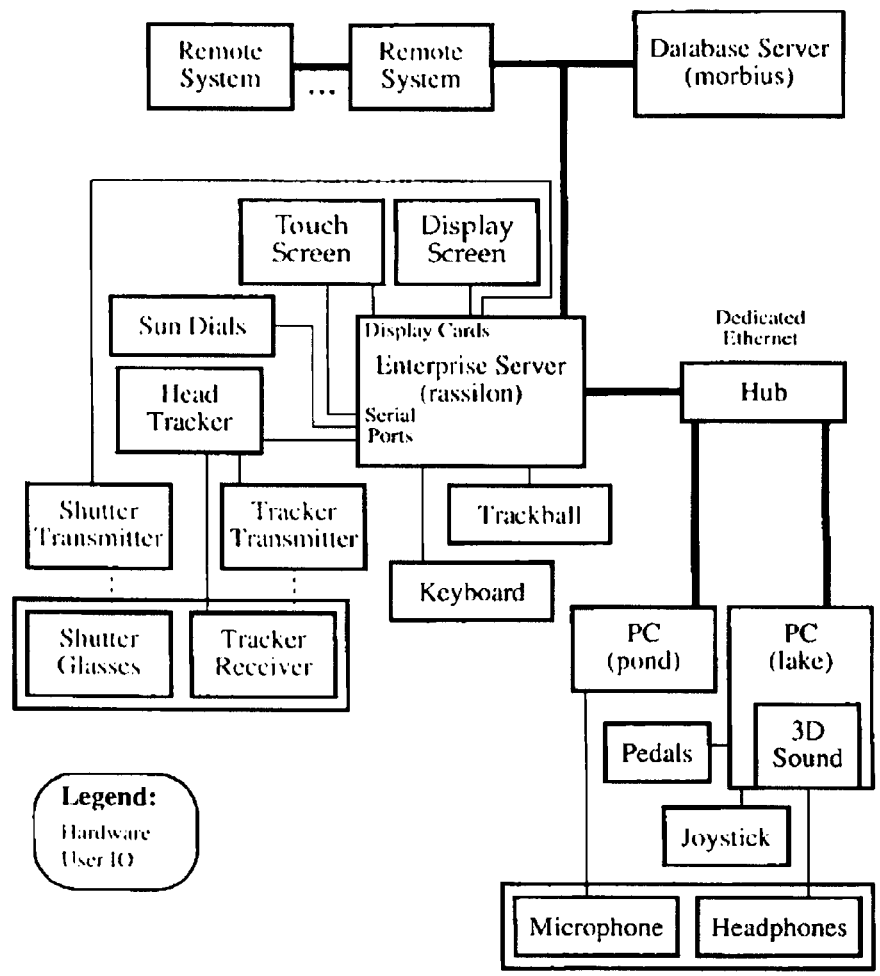
Figure 2 Hardware Component Architecture

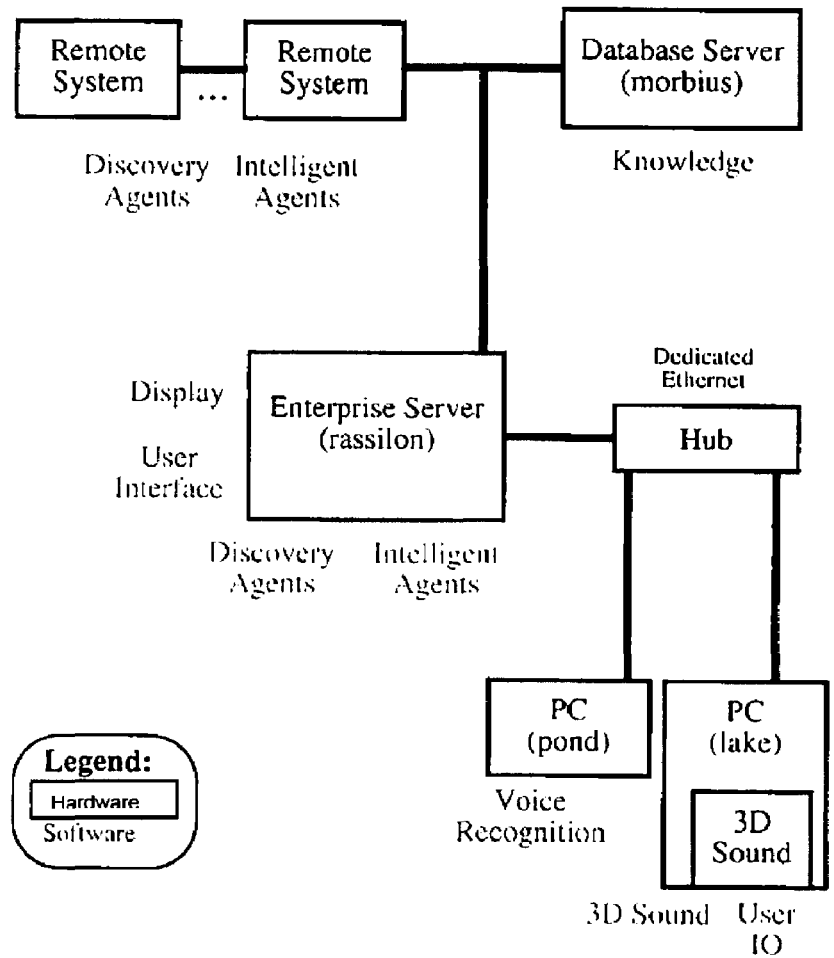
Figure 3 Distribution of Software Modules

Figure 4 Geo Network View

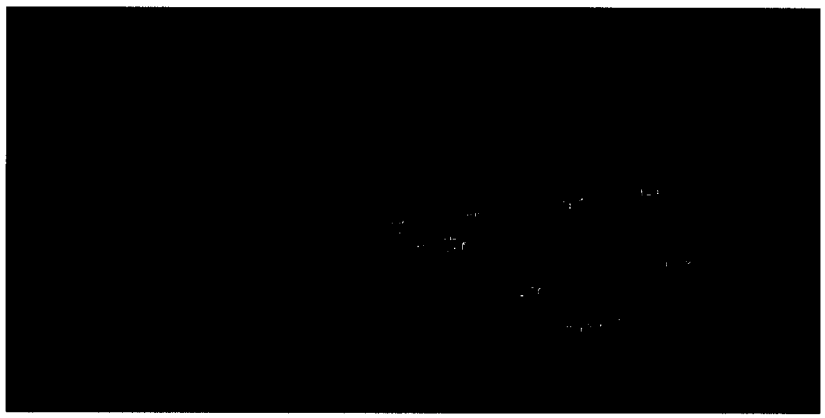
Figure 5 Geo View inside a Machine
Figure 6 Data View

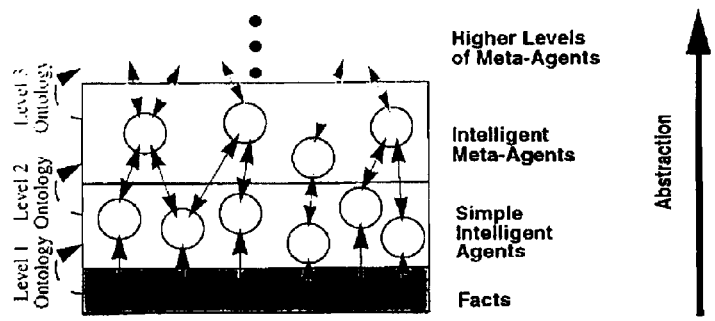
Figure 7 The Shapes Vector Knowledge Architecture (SVKA)
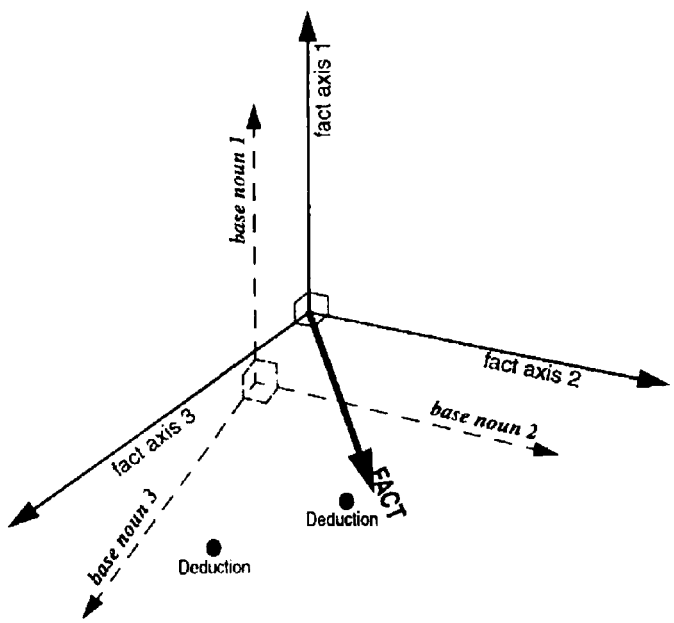
Figure 8 Vector Spaces for Agent Inference

Figure 9 Selective Zoom with staircasing.
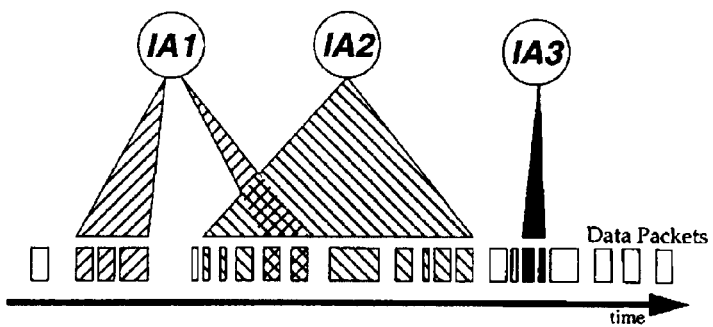
Figure 10 IA Time Apertures along a Data Stream

Figure 11 Shapes Vector Tactical Control
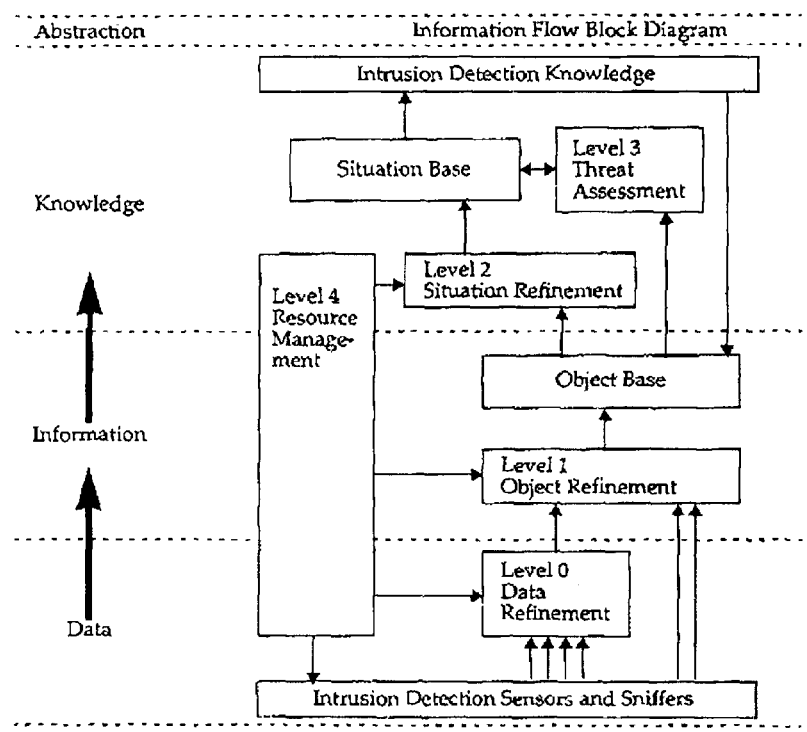
Figure 14 BASS Configuration

| DIRECTION | ORIGIN | Relative Coordinates | | | | | | | | |
|---|---|---|---|---|---|---|---|---|---|---|
| | | -4 | -3 | -2 | -1 | 0 | 1 | 2 | 3 | 4 |
| POSITIVE | FRONT | | | | | ① | ② | ③ | ④ | ⑤ |
| POSITIVE | BACK | ① | ② | ③ | ④ | ⑤ | | | | |
| POSITIVE | CENTER | | | | | ① | ② | ③ | ④ | ⑤ |
| NEGATIVE | FRONT | ⑤ | ④ | ③ | ② | ① | | | | |
| NEGATIVE | BACK | | | | | ⑤ | ④ | ③ | ② | ① |
| NEGATIVE | CENTER | | | ⑤ | ④ | ③ | ② | ① | | |

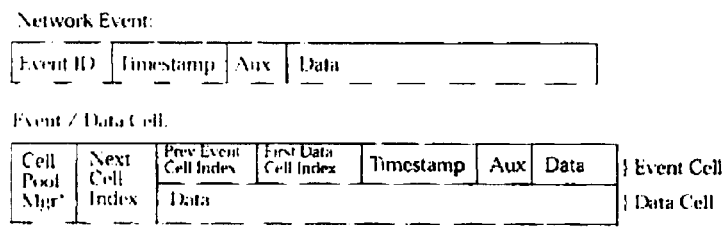
Figure 23 Event Formats
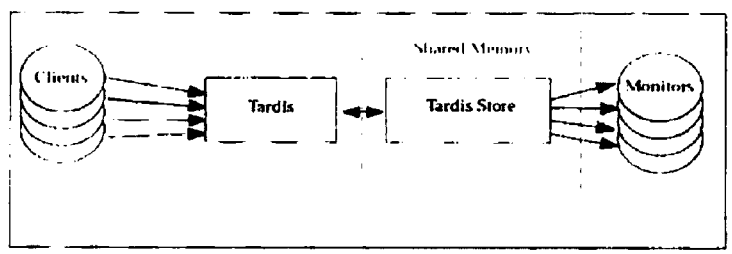
Figure 24 Shared Memory Use
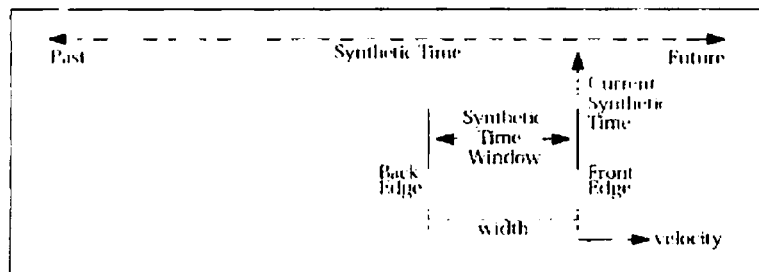
Figure 25 Synthetic Time

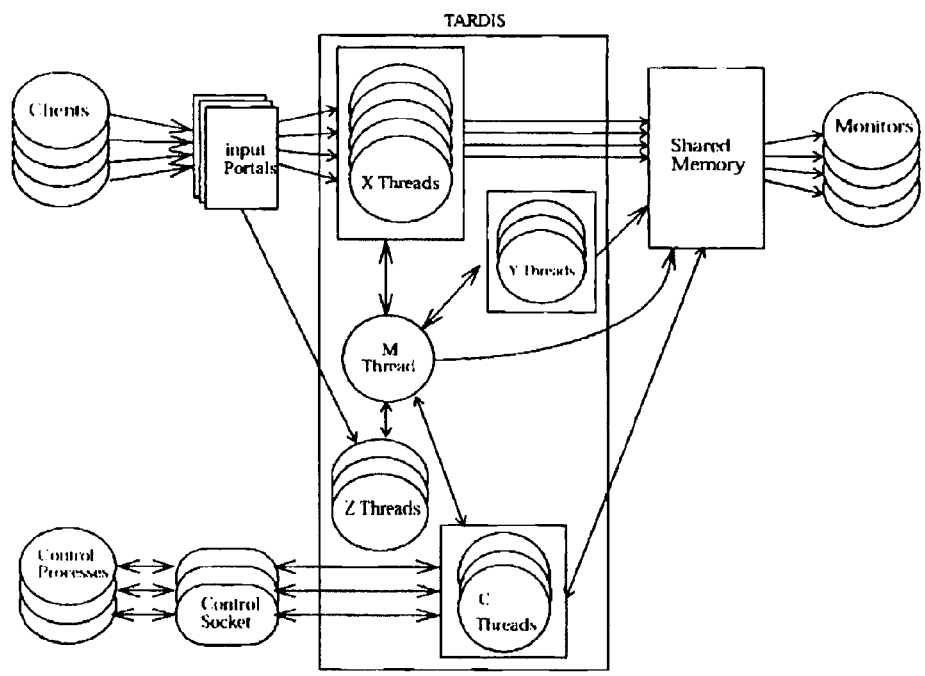
Figure 26 Tardis Components

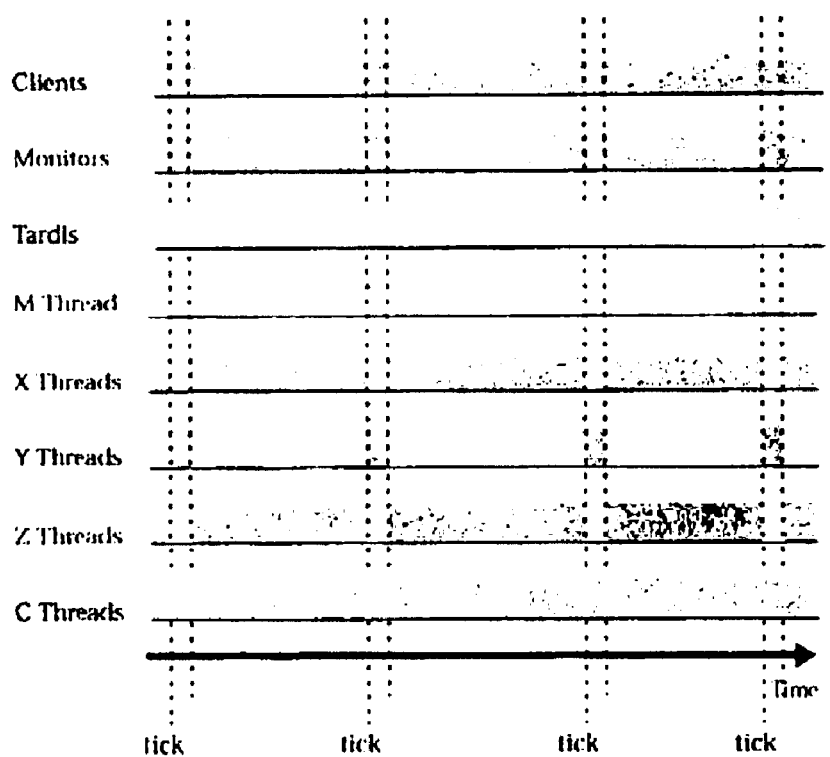
Figure 27 Process and Thread Activity Graph

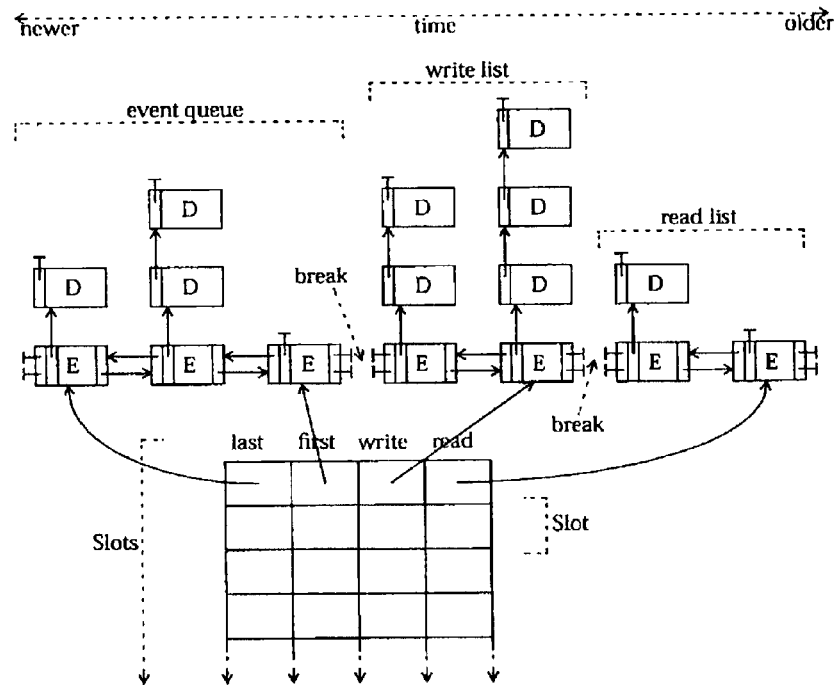
Figure 28 Tardis Store
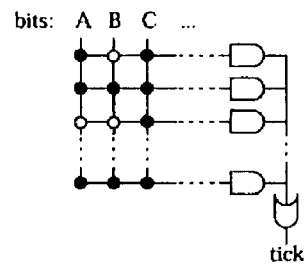
tick = (A & C) or (A & B & C) or (C) or (A & B & C)
Figure 29 Tardis Clock (FPGA and fuse bits)

GEOGRAPHIC VIEW OF A MODELLING SYSTEM

BACKGROUND

Part 1 Shapes Vector
1 Shapes Vector Introduction

Shapes Vector is the name given by the inventors to a particular collection of highly versatile but independent systems that can be used to make real world systems observable by a human operator. By providing an observation system the human may be able to detect using one or more of their senses anomalies and the like in the real world system. More particularly, the invention/s disclosed herein are in the field of information observation and management.

SUMMARY OF DISCLOSURE

To assist the reader, a particular combination of these elements is described in an example. The example is in the field of computer network intrusion detection, network security management and event surveillance in computer networks. It will however be apparent to those skilled in the art that the elements herein described can exist and operate separately and in different fields and combinations to that used in the example.

The different system elements developed by the inventors are the result of the use of several unusual paradigms that while separately make a their contribution also act synergistically to enhance the overall performance and utility of the arrangement they form part of.

An embodiment in the computer network field is used to illustrate an observation paradigm that works with a collection of elements, to provide a near real-time way for observing information infrastructures and data movement. The user (human observer) is provided sophisticated controls and interaction mechanisms that will make it easier for them to detect computer network intrusion and critical security management events in real time as well as allow them to better analyse past events. The user may be computer assisted as will be noted where appropriate.

However, as stated previously each of the elements of the system disclosed herein are also capable of being used independently of the other. It is possible for each of them to be used in different combinations, alone or in conjunction with other elements as well as being the precursor for elements not yet created to suit a particular environment or application.

Whilst the Shapes Vector embodiment provided is primarily meant to aid computer intrusion detection, the system and or components of it, can be arranged to suit a variety of other applications, e.g data and knowledge mining, command and control, and macro logistics.

Shapes Vector is a development in which a number of key technologies have been created that include:

- a high-performance multi-layer observation facility presenting the user with a semantically dense depiction of the network under consideration. To cater to the individual observational capacities and preferences of user analysts, the specifics of the depiction are highly user-customable and allow use of more than just the users visual and mental skill;
- a framework for "intelligent agents"; artificial intelligent software entities which are tasked with co-operatively processing voluminous raw factual observations. The agents can generate a semantically higher-level picture of the network, which incorporates security relevant knowledge explicitly or implicitly contained within the raw input (however, such agents can be used to process other types of knowledge);
- special user interface hardware designed especially to support Defensive Information Operations in which several user analysts operate in real-time collaboration (Team-Based Defensive Information Operations).
- an inferencing strategy which can coexist with traditional deductive mechanisms. This inferencing strategy can introduce certainty measures for related concepts.

The subject matter of this disclosure is complicated and it is both a hindrance and a necessity to present particular elements of the Shapes Vector system in the same document.

However, it will be apparent to those skilled in the art that each element that makes up the Shapes Vector system is capable of independent existence and operation in different environments.

To reflect to some degree the independence of the elements disclosed, this specification is comprised of different parts that each have their own paragraph numbering but page numbering is consistent with their being included in a single document.

Part 1
Shapes Vector Introduction
Part 2
Shapes Vector Master Architecture and Intelligent Agent Architecture
Part 3
Data View Specification
Part 4
Geo View Specification
Part 5
Tardis (Event Handler) Specification A detailed index of the various parts and sections is provided on the last pages of the specification to assist random access to the information provided herein or to make cross-referencing simpler.

Part 1 is an overview of the Shapes Vector embodiment that describes a particular environment and discloses in a general way some of the elements that make up the total system. Parts 2, 3, 4 and 5 disclose fundamental aspects of the Intelligent Agent Architecture, Data View, Geo View and the Tardis (Event Handler) specification respectively, terms that will be more familiar once the specification is read and understood.

This patent specification introduces the Shapes Vector system by firstly describing in Sections 1 and 2 of Part 1, the details of its top-level architecture. Included are details of the hardware and software components present in a system presently under construction. Section 3 of Part 1, gives an overview of the first set of observation (some times referred to as visualisation) paradigms, which have been incorporated into the system. Two different views of computer/telecommunications networks are described in this section, both presenting a three-dimensional "cyberspace" but with vastly different approaches to the types of entities modelled in the space and how they are positioned (and dynamically repositioned). Some preliminary comments are offered as to the effectiveness of one of these views, "Geo View", for network defence. "Geo View" is another of those terms that will be better understood after a reading of the document.

A description of the intelligent agent architecture follows in Section 4 of Part 1, including an overview of the multi-layered Shapes Vector Knowledge Architecture (SVKA) plus details of the inferencing strategies. The knowledge processing approach is very general, and is applicable to a wide variety of problems. Sections 5 and 6 of Part 1 describe special techniques employed within the Tardis (Event Handling) system to assist a user analyst to observe the time-varying behaviour of a network. Two principal mechanisms are detailed, Synthetic Strobes and Selective Zoom, along with some hypotheses as to how such mechanisms might be extended to offer even greater flexibility. Section 7 of Part 1 of the patent specification details a comparative analysis of related research and a set of conclusions summarising the broad thrusts of the Shapes Vector system.

More detailed disclosures of these elements of the invention are provided in Parts 2, 3, 4 and 5.

BRIEF DESCRIPTION OF THE FIGURES

FIG. 2 depicts a schematic of a preferred configuration of the hardware architecture of the Shapes Vector system;

FIG. 3 indicates where the primary software modules will be running in the initial system as well as a schematic of the hardware modules they are associated with;

FIG. 4 is a depiction of a small network where the primary points of interest involve a set of computers and the data that is flowing between them;

FIG. 5 depicts a scene inside a machine object;

FIG. 6 shows how Data View might visualise a collection of data-oriented objects (eg. files and/or servers) which interact with one another to varying degrees;

FIG. 7 shows the basic structure of this knowledge architecture and thus the primary architecture of the set of Intelligent Agent's (AI's);

FIG. 8 demonstrates the concept: a deductive space has been defined in terms of a set of base nouns relevant to the IA;

Segment one of FIG. 9 depicts the same view from above; FIG. 9 (segments two and three) depicts the use of selective zoom where subsets of nodes have been placed above the main view plane;

FIG. 10 depicts a time aperture setting;

FIG. 11 depicts a preferred Shapes Vector Tactical Control Station;

FIG. 14 illustrates a BASS configuration;

FIG. 23 depicts the format of an Event and Date cell;

FIG. 24 depicts the memory segment shared between the Tardis and the number of Monitor processes;

FIG. 25 depicts a synthetic time window maintained by the Tardis;

FIG. 26 depicts various threads that make up an embodiment of the Tardis;

FIG. 27 depicts a process and thread activity graph;

FIG. 28 depicts an embodiment of the array of Slots residing within a Tardis Store in shared memory; and FIG. 29 depicts event lists which have their roles switch between the read and write lists each update.

DETAILED DESCRIPTION

In reading this specification, it should be noted that while some issues are dealt with in detail, the specification is also used to disclose as many of the paradigms and strategies employed as possible, rather than discussing any one paradigm in depth. In an attempt to provide an example of how these paradigms and strategies are used, several new mechanisms for dealing with information in a real-time environment are described in the context of the information security field but in no way are the examples meant to limit the application of the mechanisms revealed.

Observation is a term used in this specification to embody the ability of a human to observe by experience through a variety of their senses. The senses most used by a human user include sight, hearing and touch. In the embodiment and system developed thus far all of those senses have been catered for. However, the term observe is not used in any limiting way. It may become possible for a human's other senses to be used to advantage not only in the scenario of computer system security but others within the realm of the imagination of the designer using the principles and ideas disclosed herein. A human could possibly usefully use their other senses of smell, taste and balance in particular future applications.

In this specification the term clients is used to refer to a source of events based on real and virtual objects operating in the real world and the term monitors is used to refer to one or more recipient systems that make the events observable to a human user.

The following discussion will provide background information relating to the described embodiment of the invention or existing paradigms and strategies and when it does so it is intended purely to facilitate a better understanding of the invention/s disclosed herein. However, it should be appreciated that any discussion of background information is not an acknowledgment or admission that any of that material was published, known or part of the common general knowledge as at the filing date of the application.

2 Architectural Components 2.1 Primary Functional Architecture

Figure 1:
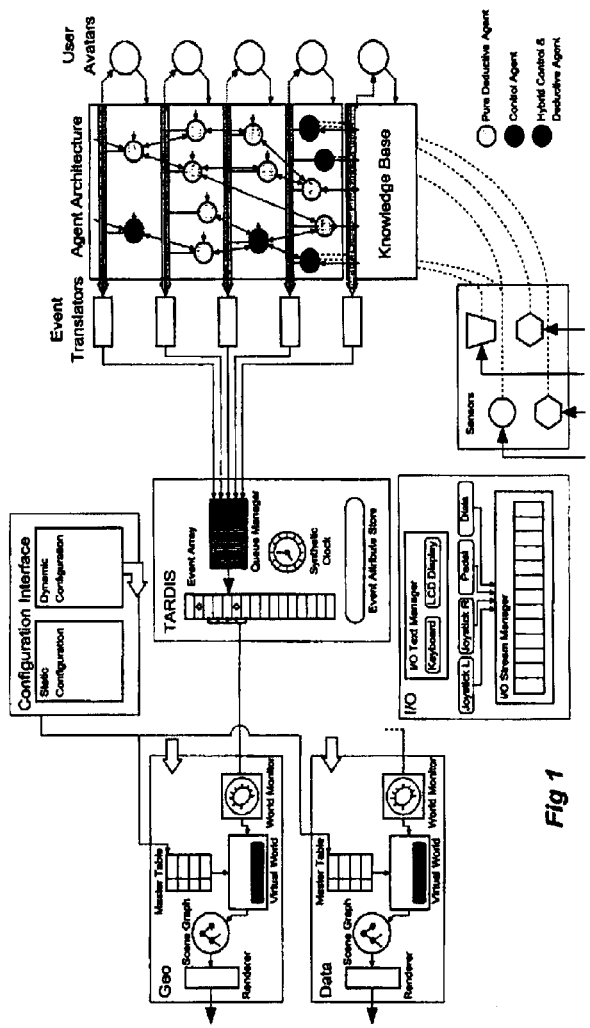
FIG. 1 depicts the shapes vector functional architecture.

At the coarsest level, the Shapes Vector system can be considered to be composed of a series of "macro-objects," shown in FIG. 1. These modules interact with one another in various ways: the lines in the figure indicate which objects interact with others. The functions performed by each of these macro-objects and the purpose and meaning of the various inter-object interactions are described in the parts and sections that follow.

2.1.1 Configuration Interface and I/O Sub-System

The Configuration Interface and I/O macro-objects collectively encapsulate all functionality, involving interaction with the user of the Shapes Vector system. They in turn interact with the Display, Tardis (Event Management) and Intelligent Agent macro-objects to carry out the user's request. In addition to being the point of user interaction with the system, this user-interface macro-object also provides the ability to customise this interaction. Refer to FIG. 1, which displays the Functional Architecture of Shapes Vector. A user can interactively specify key parameters, which govern the visual and other environments generated by Shapes Vector and the modes of interaction with those environments. Such configurations can be stored and retrieved across sessions allowing for personal customisation.

Individual users can set up multiple configurations for different roles for which they might wish to use the system. Extensive undo/redo capabilities are provided in order to assist with the investigation of desired configurations.

The observation of the Shapes Vector world is user-customable by direct interaction with a structure called the "Master Table" (see Section 3). In this table the user can in one example, associate visual attributes, such as shape, colour and texture, with classes of objects and their security-relevant attributes.

A user interacts with the Shapes Vector system via any number of input and output devices, which may be configured according to each individual user's preferences. The input devices may be configured at a device-specific level, for example by setting the acceleration of a trackball, and at a functional level, by way of further example, by assigning a trackball to steer a visual navigation through a 3-dimensional virtual world representative of a computer network. The Appendix to Part 1 describes the typical user interface hardware presented to a Shapes Vector user.

2.1.2 Sensors

Sensors can take many forms. They can be logical or physical. A typical example would be an Ethernet packet sniffer set to tap raw packets on a network. In another example, the sensor can be the output of a PC located at a remote part of a network, which undertakes pre-processing before sending its readings of itself or the network back to the main Shapes Vector system components. Other examples are Software or Hardware to capture packets in a digital communication network, to examine the internal or operating state of a computer or to analyse audit records created by a computer of network device. Sensors transmit their data into the level one portion of the Intelligent Agent Gestalt (this term will also have more meaning after further reading of the specification) for further processing. Some of the processing involved could entail massaging of data for Knowledge Base storage, or perhaps simple logical deductions (first order logic facts).

2.1.3 Intelligent Agent Architecture 2.1.3.1 Knowledge Base

The Knowledge object is essentially a knowledge base containing facts about the overall domain of discourse relevant to Shapes Vector. The knowledge is represented in terms of context-free Entities and Relationships, allowing for its efficient storage in a relational database. Entities constitute not only physical devices such as computers and printers, but also logical objects such as files and directories. Each entity possesses a set of security-relevant attributes, which are stored within the knowledge base. For each stored observation of an entity attribute, there is accompanying meta-data that includes the time of discovery, which agent or sensor discovered it and an expiry time for the data. The current knowledge base models several types of inter-entity relationships, including physical connectivity, physical or logical containment, bindings between processors and processes, roles of processes in client-server communications, origin and destination of packet entities, and so on.

2.1.3.2 Intelligent Agents and Ontologies

The Intelligent Agent macro-object encapsulates the artificial intelligence aspects of the Shapes Vector system. It specifically incorporates a (potentially very large) family of intelligent agent, software entities imbued with expert knowledge in some particular domain of discourse over which they may make deductions. Agents within the Shapes Vector systems are arranged into a series of "abstraction layers" or "logical levels" with each agent existing at only one such layer. Agents operate by accepting knowledge of a particular abstraction, possibly from several sources in lower layers, and generating new knowledge of a higher level of abstraction through a deductive process. An agent that resides at layer n of the Shapes Vector Knowledge Architecture must receive its input knowledge in the form of assertions in a knowledge representation known as the "Level n Shapes Vector ontology". Any deductive product from such an agent is expressed in terms of the (more abstract) "Level n+1 Shapes Vectorontology".

Entities in the Intelligent Agent macro-object can be broken into categories: data-driven entities and goal-driven entities. The former group is characterised by a processing model wherein all possible combinations of input facts are considered with an eye towards generating the maximum set of outputs. A common method employed being forward chaining. Goal-driven entities adhere to a different execution model: given a desirable output, combinations of inputs are considered until that output is indicated, or all combinations are exhausted.

Intelligent Agents and the goals and functionality of the Shapes Vector Knowledge Architecture are covered in more depth in Section 4 of this part of the specification and in Part 2 of the specification.

2.1.4 The Tardis

The Tardis is a real-time event management system. Its task is to schedule and translate the semantic deductions from Intelligent Agents and sensors into events capable of being visualised by the display module or sub-system. The Tardis also encapsulates the Shapes Vector system's notion of time. In fact, the operator can shift the system along the temporal axis (up to the present) in order to replay events, or undertake analyses as a result of speeded-up or slowed-down notions of system time.

2.1.5 Monitor

Monitor preferably renders three-dimensional (3D) views of objects and their interactions in real-time. As can be seen, there are a number of basic views defined all of which can be navigated. Each different view is based on a fundamental visualisation paradigm. For example, Geo View is based on location of virtual objects within a space-time definition, whereas Data View's location of virtual objects within its space is based on the data interaction.

Several reusable modules make up the composition of each view. These include elements such as data structures identifying the shapes, textures, and visual relationships permitted for each class of object, as well as common rendering methods for representing the view's Universe.

The paradigms for some of the views are discussed in more detail in later sections. It will be appreciated that the visualisation paradigms are in fact specific embodiments of the observational requirement of the system, wherein a human user can use one or more of their senses to receive information, that could include aural and haptic interaction.

2.2 The Hardware

In a preferred embodiment of this invention, the hardware architecture of the Shapes Vector system consists of a primary server equipped with a powerful computational engine and high-performance 3D graphics capabilities, a database server, a dedicated 100BaseT Ethernet network, one PC with specialised 3D audio hardware, and one PC with user input devices attached. A preferred configuration is shown schematically in FIG. 2.

The preferred observational environment of the Shapes Vector world can be rendered in 3D stereo to provide aural information and preferably viewed using Crystal Eyes™ shutter glasses synchronised to the display to provide purely visual information. Crystal Eyes™ was chosen for visualisation, as this product allows the user to be immersed in a 3D world on a large screen while still permitting real world interaction with fellow team-members and the undertaking of associated tasks, e.g. writing with a pencil and pad, that are features not available with head-mounted displays.

In addition to 3D graphics capabilities, there is a sound rendering board, which is used to generate multi-channel real-time 3D audio. Both the 3D graphics and sound rendering board make use of head tracking information in producing their output. The graphics renderer makes use of tracking information to alter the perspective of the displayed world so that the user experiences the effect of moving around a fixed virtual world. The sound renderer makes use of head movement tracking information to alter the soundscape so that the user also experiences the effect of moving around in a fixed world with relevant sounds. That is, where a particular sound source will be perceived to be coming from the same fixed place irrespective of the users head movement. The perception of direction in 3D sound is enhanced by the ability to turn one's head and listen. For instance, it is often difficult to determine whether a sound is coming from in front or behind without twisting one's head slightly and listening to determine in which ear a sound is received first or loudest. These perceptive abilities are second nature to humans and utilisation of them is a useful enhancement of the information presentation capabilities of Shapes Vector.

A joystick and rudder pedals preferably provide the primary means of navigation in the 3D world. User input to the system is to be provided primarily through the touch screen and via voice recognition software running on a PC. Haptic actuators are realisable using audio components to provide a feeling of say roughness as the user navigates over a portion of the virtual world. Many other actuators are possible depending on the degree of feedback and altering required by the user.

The initial prototype of Shapes Vector had the user input/output devices connected to a workstation or PC with software connecting the remote peripherals with the User Interface proper. The layout of the Shapes Vector workstation (ie, the physical arrangement of the user interface hardware) will vary depending upon the operational role and the requirements of individual users, as described in the Appendix to Part 1 of the specification.

2.3 System Software

In the embodiment described herein Shapes Vector is implemented as a distributed system with individual software components that communicate between each other via TCP/IP sockets. A simple custom protocol exists for encoding inter-process communication. To limit performance degradation due to complex operating system interaction, the system processes are used only for relatively long-lived elements of control (e.g. the knowledge base server, or an intelligent agent). Shorter-lived control is implemented through threads.

FIG. 3 indicates where the primary software modules will be running in the initial system as well as a schematic of the hardware modules they are associated with. While most of the implementation of the Shapes Vector system has been custom-coded, the system does make use of a number of different software technologies to supply service functionality. Intelligent Agents make extensive use of NASA's CLIPS system as a forward chaining engine, and also use Quintus Prolog™ to implement backward chaining elements. Additionally, the knowledge base and its associated servers are preferably implemented using the Oracle™ relational database management system.

The graphics engine of the Display macro-object is preferably built upon an in-house C++ implementation of the Java 3D API and utilises OpenGL™ for the low-level rendering. The User Interface elements are built using Sun Visual Workshop™ to produce X Windows Motif™ GUI elements.

3 The "Classical" Visualisation Paradigm

The classical visualisation paradigm refers to methods that are derived from mechanisms such as geographic layout, and relatively static rules for objects. While some may not regard what is described here as entirely "classical", it serves to distinguish some of the visualisation methods from the relatively more "bizarre" and therefore potentially more interesting visualisation paradigms described in this specification.

Using by way of example information security as the environment to be modelled and observed the fundamental basis of the classical visualisation paradigm is to associate a security-relevant attribute with a visual entity or a visual property of an entity, eg. shape, colour, or texture.

A Shapes Vector hypothesis is that any visualisation paradigm is not only "sensitive" to its application, ie. some paradigms are better suited to specific classes of application, but that the implementation of the paradigm is sensitive to the specific user. It is thus claimed that not only should a visualisation system be customable to take into account the type of application, but also it must have highly customable features to take into account individual requirements and idiosyncrasies of the observer. That is, the customisability of the system is very fine-grained.

In fine grained customable systems, it is important that journal records and roll-back facilities are available in the certain knowledge that users will make so many changes that they will "lose" their way and not be sure how to return to a visual setting they find more optimal than the one they are currently employing.

In an embodiment, users can associate attributes to shapes, colour, texture, etc. via manipulation of a master table, which describes all visual entities (with security-relevant attributes) the system is able to monitor. This table contains user-customable definitions for shapes, colours, and textures employed in the visualisation of the entity. For example, the security attribute "read enable" can be associated with different colours, transparencies or textures. Part of the essence of Shapes Vector involves utilising the visualisation process as a method for users to divine (via inductive inference) patterns in the "security cyberspace". These patterns have an attached semantic. Typically, we expect users to note anomalies from the myriad system activities that represent authorised use of the system. Given these anomalies, the user will be able to examine them more closely via visualisation, or bring into play a set of Intelligent Agents to aid an in depth analysis by undertaking deductive inference.

Not withstanding the above, there is also a semantic gap between what an Intelligent Agent can deduce and what a user can discern using their senses. The approach in this embodiment is based on the hypothesis that in most cases the observational interface element will be employed for highlighting macro matters, while the agents will focus on micro matters. These micro deductions can be fed to the visualisation engine so that a user can observe potential overall state changes in a system, thereby permitting a user to oversee and correlate events in very large networks.

3.1 Geo View

Geo View is perhaps the most classical of the visualisation paradigms. Its basis is a two dimensional plane located in three-dimensional space. The plane represents the traditional geographic plane: location in the virtual plane represents the physical location of objects. FIG. 4 is a depiction of a small network where the primary points of interest involve a set of computers and the data that is flowing between them. The sizes, shape, and texture of objects all carry an associated semantic. The double pyramid shapes with a third pyramid embedded at the top are representative of computers with network interfaces. Also quite visible is the packet flow between the computers in the star network. Although not explained here, to the trained eye the start of a telnet session, some web traffic, as well as X Windows elements is also represented.

The Shapes Vector system permits a user to select classes of objects and render them above the plane. In fact it is possible to render different classes of objects at different levels above or below the geographic base plane. This rendering tactic allows a user to focus on objects of interest without losing them in the context of the overall system. This "selective zoom" facility is described further in Section 5.2 of this part.

FIG. 5 depicts a scene inside a machine object. In this view, two processors each with several processes are depicted. In an animated view of this scene the amount of processing power each of the processes is consuming is represented by their rate of rotation. Again, the size, texture, and specific aspects of their shape can and are used to depict various semantics.

The transparent cube depicts a readable directory in which is contained a number of files of various types.

In addition to the visualisation of various objects, the human observer can attach sounds and possibly haptic characteristics to objects. In particular, the system is capable of compiling a "sound signature" for an object (e.g. a process) and plays the resulting sound through speakers or headphones. This facility is quite powerful when detecting event changes that may have security significance. Indeed, in a concept demonstrator, a change in the code space of a process causes a distinct change in its sound. This alerts the user when listening to a process (e.g. printer daemon) with a well-known characteristic sound that something is not quite right. By inspecting the process visually, further confirmation can be forthcoming by noting that its characteristic appearance, e.g. colour, has changed. The use of haptic attributes can also be advantageous in certain circumstances.

One of the major issues that arise out of Geo View other than the basic geographic location of nodes, is the structural relationship of objects contained in a node. For example, how does one depict the structural relationship of files? FIG. 5 gives some indication of a preferred view in a directory containing files and possibly further directories is rendered in a particular way. In a system such as UNIX, there is an well-understood tree structure inherent in its file system. In other operating systems, the structure is not so precise. In the description so far, Geo View still lacks a level of structural integrity, but it must be realised that any further structure, which is imposed, may invalidate the use of the view for various applications or specific user requirements.

Shapes Vector avoids some of the problems posed above by providing a further level of customisation by permitting a user to specify the structural relationship between classes of objects from a predetermined list (e.g. tree, ring). A run-time parser has been constructed to ensure that any structural specification must satisfy certain constraints, which guarantee that "nonsensical", or circular relationships, which are impossible to display, are not introduced.

1. Geo View is a three-dimensional virtual universe in which a real-world or virtual object may be represented by one or more virtual objects whose visual attributes are derived from attributes of the real-world object via a flexible user-specifiable mapping (called herein a "Master Table"). The placement of virtual objects typically having a shape within the universe is governed by the absolute or relative geographical location of the real-world object, and also by a flexible set of user-specified layout rules. Layout rules permit the specification of a structured layout for groups of shapes whose real-world objects and virtual objects have some commonality. The list of structures includes, but is not limited to linear, grids, star, ring and graph.

2. Changes to the visual attributes of shapes (e.g., size or height above a plane) may be made dynamically by a user (human observer). Such changes may be applied to all shapes in the universe or to those which match user-specified criteria. This facility is termed herein "Selective Zoom".

3. The user may configure Audio cues (sounds and/or voices) to denote the attributes of represented objects (through a Master-Table configuration), or to denote the occurrence of a real-world event. Such cues may be associated with a point in three-dimensional space (i.e., positional sound), or they may be ambient.

4. The representation of real-world objects with rapidly time-changing attributes may be simplified by the use of Synthetic Strobes, flexible user-specified filters which shift changes in the visual attributes of a shape from one time-domain to another. Synthetic Strobes may be applied across the entire universe or selectively according to a flexible user-specification. Such strobes may also be used to shift slow changes in the attributes of a shape into a faster domain (e.g., so that a human may perceive patterns in very slowly altering real-world objects).

5. A user may select shapes within a Geo View universe (either interactively or by a flexible user-specified condition) and choose to have the corresponding set of shapes in another view (e.g., a Data View or a different Geo View) highlighted in a visual manner. The specification of the condition defining correspondence of shapes between universes may be made in a flexible user-defined fashion.

A user may also specify structural arrangements to be used by Geo View in its layout functions. For example, "located-in", "in-between", and "attached-to" are some of the operators available. These allow a flexible layout of shapes and objects preserving user required properties without requiring specific coordinates being supplied for all objects.

3.2 Data View

A problem with Geo View is that important events can be missed if heavily interacting objects or important events are geographically dispersed and not sufficiently noticeable. In Section 5 of this part, we discuss mechanisms that can be utilised to avoid this problem in some circumstances. However, in this section we describe a preferred view that is also intended to address parts of this problem. Parts 3 and 4 of the specification provides a more detailed account of this approach.

Geo View has its roots in depicting actions and events that have physical devices and their location as an overriding theme. Of course logical entities are shown, but again they have a geographic theme. Data View, as its name suggests, is intended to provide a view where the basic paradigm is simply one of data driven events (eg. byte transfer) rather than geographic location. Heavily interacting objects, eg. producers and consumers of data, can be depicted as being located "close together". Unlike Geo View, where the location of an object tends to be relatively static during its lifetime (copying of files is simply a special case of bringing a new object into existence) interaction and data transfer between objects in Data View may be more dynamic. Thus, the location of objects is expected to be more dynamic. Therefore, rules are preferred so as to define the layout of objects not only from the perspective of whether interaction occurred, but also the amount of interaction, and the rate of interaction.

It is intended in a preferred embodiment to utilise Newtonian celestial mechanics and model interaction as forces on the interaction of objects as fundamental rules for the data view layout.

Each object has a mass that is based on its "size" (size is user defined eg. the size of a file or code in a process). User defined interaction between objects causes the equivalent of an electric charge to build. This charge is attractive, whereas "gravity" resulting from mass is repulsive. The build-up of charge tends to negate the force of gravity thereby causing objects to move closer together until some form of equilibrium is reached. Of course we need to adjust the basic Coulomb and Newton's laws in order for the forces to balance appropriately. To do so, we are lead to set axiomatically several calibration points. That is, we must decide axiomatically some equilibrium points; e.g. two objects of identical mass are in equilibrium X units apart with Y bytes per second flowing between them. Without these calibration points, the distance and motion of the objects may not provide optimal viewing. Further to this requirement, it can be inferred that the force formulae must be open to tinkering on a per user basis in order to permit each user to highlight specific interactions based on higher semantics related to the user's security mission. A further rule, which is preferred in this embodiment, is the rate of "decay" of charge on an object. Otherwise, interacting objects will simply move closer and closer together over time. This may be appropriate for some types of visual depiction for a user, but not for others. For example, retained charge is useful for a user to examine accumulative interaction over a time slice, but charge decay is a useful rule when examining interaction rates over a given time period.

The interaction mechanism described herein serves to indicate the basis for interaction between objects and their location in space to provide visual depiction of objects and their clusters for examination by a user in order to arrive at inductive hypotheses.

FIG. 6 shows how Data View might visualise a collection of data-oriented objects (eg. files and/or servers) which interact with one another to varying degrees. Despite using proximity to show whether an object is interacting with another, further visual mechanisms are needed for the user to be able to analyse the type of data interaction, and the current state of affairs of interaction within a specified time slice. Hence we still need visual markers which directly link one object to another, for example an open socket connection between two processes, which actually has data in transit. These objects could initially be very far apart due to previous low interaction status. However, since they are now interacting a specific connection marker may be needed to highlight this fact. Given the type of interaction, the force formulae may be adjusted so as to provide a stronger effect of interaction. However, this mechanism is restricted to classes of objects and the interaction type, whereas the user may be particularly interested in interaction between two particular object instances. Hence a visual marker link would be more appropriate. Yet, one can imagine the complexity of a view if all markers are shown simultaneously. Hence actual connection lines, their size, shape, colour, motion and location, may be switched on and off via a set of defined criteria.

As for Geo View, Data View in its preferred embodiment, will come with its own Master Table describing shapes and textures for various attributes, as well as an input mechanism to describe relationships between objects based on a series of interaction possibilities. The objects presented in Data View may in some cases be quite different from those found in Geo View, while in other cases they will be similar or identical. Clearly the defining difference lies in the fact that Data View's Master Table will focus less on physical entities and more closely on logical entities and data driven events.

Thus the preferred main features of Data View are as follows:

1. A set of one or more two-dimensional virtual universes in which a real-world object may be represented by one or more shapes whose visual attributes are derived from attributes of the real-world object via a flexible user-specifiable mapping (called a "Master Table"). In one embodiment each universe is represented as a disc in a plane. The placement of a shape within a universe is governed by degree of interaction between the represented object and other objects represented in that universe. As an alternative, the view may be constructed as a set of one or more three-dimensional virtual universes with similar properties.
2. Interaction between a pair of real-world objects causes the pair of shapes that represent them to be mutually attracted. The magnitude of this force is mathematically derived from the level of interaction. Real world Objects which interact are furthermore mutually repelled by a "gravitational force", the magnitude of which is derived from attributes of the real-world objects in a flexible user-specified manner. In one embodiment all forces are computed as vectors in the plane of the universe. The velocity of a shape in the universe is proportional to the vector sum of the forces applied to the shape (i.e., in this embodiment there is no concept of acceleration).
3. Shapes within a universe may be tagged with what is termed herein a "flavor" if their real-world object's attributes match a flexible user-specified condition associated with that flavor. A pair of shapes may only attract or repel one another if they share one or more flavors.
4. Each shape within a universe maintains an explicit list of other shapes it "interacts" with. A pair of shapes may only attract or repel one another if each is in the interaction set of the other.
5. Each shape within a universe may have a "radius of influence" associated with it, a user-specified region of the universe surrounding the shape. A shape may only exert a force onto another shape if the latter is within the radius of influence of the former. The radius of influence of a shape may be displayed visually. The selection of which shapes in the universe have radii of influence, and which of those radii should be displayed, may be either universal or by means of a flexible user-specified condition.
6. Each shape within a universe may optionally be visually linked to one or more shapes in a different universe by a "Marker" which represents a relationship between the real-world objects represented by the shapes. The selec- 7. Changes to the visual attributes of shapes (e.g., size or height above a plane) may be made dynamically by a user. Such changes may be applied to all shapes in the universe or to those which match user-specified criteria. This facility is termed "Selective Zoom".
8. The user may configure Audio cues (sounds and/or voices) to denote the attributes of represented objects, or to denote the occurrence of a real-world event. Such cues may be associated with a point in three-dimensional space, or they may be ambient.
9. The representation of real-world objects with rapidly time-changing attributes may be simplified by the use of Synthetic Strobes, flexible user-specified filters which shift changes in the visual attributes of a shape from one time-domain to another. Synthetic Strobes may be applied across the entire universe or selectively according to a flexible user-specification. Such strobes may also be used to shift slow changes in the attributes of a shape into a faster domain (e.g., so that a human may perceive patterns in very slowly altering real-world objects).
10. A user may select shapes within a Data View universe (either interactively or by a flexible user-specified condition) and choose to have the corresponding set of shapes in another view (e.g., a Geo View or a different Data View) highlighted in a visual manner. The specification of the condition defining correspondence of shapes between universes may be made in a flexible user-defined fashion.

4 Intelligent Agents

Shapes Vector can utilise large numbers of Intelligent Agents (IA's), with different domains of discourse. These agents make inferences and pass knowledge to one another in order to arrive at a set of deductions that permit a user to make higher level hypotheses.

4.1 Agent Architecture

In order to achieve knowledge transfer between agents which is both consistent and sound, ontology becomes imperative. The task of constructing a comprehensive ontology capable of expressing all of the various types of shapes is non-trivial. The principal complication comes from the fact that the structural elements of the ontology must be capable of covering a range of knowledge ranging from the very concrete, through layers of abstraction and ultimately to very high-level meta-knowledge. The design of a suite of ontological structures to cover such a broad semantic range is problematic: it is unlikely to produce a tidy set of universal rules, and far more prone to produce a complex family of inter-related concepts with ad hoc exceptions. More likely, due to the total domain of discourse being so broad, ontology produced in this manner will be extremely context sensitive, leading to many possibilities for introducing ambiguities and contradictions.

To simplify the problem of knowledge representation to a point where it becomes tractable, the Shapes Vector system chooses to define a semantic layering of its knowledge-based elements. FIG. 7 shows the basic structure of this knowledge architecture and thus the primary architecture of the set of Intelligent Agent's (AI's). At the very bottom of the hierarchy are factual elements, relatively concrete observations about the real world (global knowledge base). Factual element can draw upon by the next layer of knowledge elements: the simple intelligent agents. The communication of factual knowledge to these simple knowledge-based entities is by means of a simple ontology of facts (called the Level 1 Shapes Vector ontology). It is worthwhile noting that the knowledge domain defined by this ontology is quite rigidly limited to incorporate only a universe of facts—no higher-level concepts or meta-concepts are expressible in this ontology. This simplified knowledge domain is uniform enough that a reasonably clean set of ontological primitives can provide a concise description. Also, an agent may not communicate with any "peers" in its own layer. It must communicate with a higher agent employing higher abstraction layer ontology. These higher agents may of course then communicate with a "lower agent". This rule further removes the chance of ambiguity and ontology complexities by forcing consistent domain restricted Ontologies.

An immediate and highly desirable consequence of placing these constraints on the knowledge base is that it becomes possible to represent knowledge as context free relations. Hence the use of relational database technology in storage and management of knowledge becomes possible. Thus, for simple selection and filtering procedures on the knowledge base we can utilise well known commercial mechanisms which have been optimised over a number of years rather than having to build a custom knowledge processor inside each intelligent agent. Note that we are not suggesting that knowledge processing and retrieval is not required in an IA, but rather that by specifying certain requirements in a relational calculus (SQL preferably), the database engine assists us by undertaking a filtering process when presenting a view for processing by the IA. Hence the IA can potentially reap considerable benefits by only having to process the (considerably smaller) subset of the knowledge base which is relevant to the IA. This approach becomes even more appealing when we consider that the implementation of choice for Intelligent Agents is typically a logic language such as Prolog. Such environments may incur significant processing delays due to the heavy stack based nature of processing on modern Von Neumann architectures. However, by undertaking early filtering processes using optimised relational engines and a simple knowledge structure, we can minimise the total amount of data that is input into potentially time-consuming tree and stack based computational models.

The placement of intelligent agents within the various layers of the knowledge hierarchy is decided based upon the abstractions embodied within the agent and the knowledge transforms provided by the agent. Two criteria are considered in determining whether a placement at layer n is appropriate:

would the agent be context sensitive in the level n ontology? If so, it should be split into two or more agents.

does the agent perform data fusion from one or more entities at level n? If so, it must be promoted to at least level n+1 (to adhere to the requirement of no "horizontal" interaction)

Further discussion on intelligent agents and ontological issues can be found elsewhere in the specification.

4.2 Inferencing Strategies

The fundamental inferencing strategy underlying Shapes Vector is to leave inductive inferencing as the province of the (human) user and deductive inferencing as typically the province of the IA's. It is expected that a user of the system will examine deductive inferences generated by a set of IA's, coupled with visualisation, in order to arrive at an inductive hypothesis. This separation of duties markedly simplifies the implementation strategies of the agents themselves. Nevertheless, we propose further aspects that may produce a very powerful inferencing system.

4.2.1 Traditional

Rule based agents can employ either forward chaining or backward chaining, depending on the role they are required to fulfil. For example, some agents continuously comb their views of the knowledge base in attempts to form current, up to date, deductions that are as "high level" as possible. These agents employ forward chaining and typically inhabit the lower layers of the agent architecture. Forward chaining agents also may have data stream inputs from low level "sensors". Based on these and other inputs, as well as a set of input priorities, these agents work to generate warnings when certain security-significant deductions become true. Another set of agents within the Shapes Vector system will be backward chaining (goal driven) agents. These typically form part of the "User Avatar Set": a collection of knowledge elements which attempt to either prove or disprove user queries.

4.2.2 Vectors

While the traditional approach to inferencing is sufficient for simple IA's which deal principally in the domain of concrete fact, it is less suitable for agents (typically from higher layers) which must deal with uncertain and/or incomplete information. Typically, such agents operate in a more continuous knowledge domain than that underlying rule-based deductive inferencing, and as such are not easily expressed in either a purely traditional forward or backward chaining paradigm. For these higher level agents, we instead make use in this embodiment of an alternative inferencing strategy based upon notions of vector algebra in a multi-dimensional semantic space. This alternative strategy is employed in conjunction with more conventional backward chaining techniques. The use of each of the paradigms is dependent on the agent, and the domain of discourse.

Our vector-based approach to inferencing revolves around constructing an abstract space in which relevant facts and deductions may be represented by geometrical analogues (such as points and vectors), with the proper algebraic relationships holding true. In general, the construction of such a space for a large knowledge domain is extremely difficult. For Shapes Vector, we adopt a simplifying strategy of constructing several distinct deductive spaces, each limited to the (relatively small) domain of discourse of a single intelligent agent. The approach is empirical and is only feasible if each agent is restricted to a very small domain of knowledge so that construction of its space is not overly complex.

The definition of the deductive space for an IA is a methodical and analytical process undertaken during the design of the agent itself. It involves a consideration of the set of semantic concepts ("nouns") which are relevant to the agent, and across which the agent's deductions operate. Typically this concept set will contain elements of the agent's layer ontology as well as nouns which are meaningful only within the agent itself. Once the agent's concept set has been discovered, we can identify within it a subset of 'base nouns'—concepts which cannot be defined in terms of other members of the set (This identification is undertaken with reference to a semi-formal 'connotation spectrum' (a comparative metric for ontological concepts).

Such nouns have two important properties:
- each is semantically orthogonal to every other base noun, and
- every member of the concept set which is not a base noun can be described as a combination of two or more base nouns.

Collectively, an IA's set of n base nouns defines an n-dimensional semantic space (in which each base noun describes an axis). Deductions relevant to the agent constitute points within this space; the volume bounded by spatial points for the full set of agent deductions represents the sub-space of possible outputs from that agent. A rich set of broad-reaching deductions leads to a large volume of the space being covered by the agent, while a limited deduction set results in a very narrow agent of more limited utility (but easier to construct). Our present approach to populating the deductive space is purely empirical, driven by human expert knowledge. The onus is thus upon the designer of the IA to generate a set of deductions, which (ideally) populate the space in a uniform manner. In reality, the set of deductions which inhabit the space can get become quite non-uniform ("clumpy") given this empirical approach. Hence rigorous constraint on the domain covered by an agent is entirely appropriate. Of course this strategy requires an appropriate mechanism at a higher abstract layer. However, the population of a higher layer agent can utilise the agents below them in a behavioural manner thereby treating them as sub-spaces.

Once an agent's deductive space has been constructed and populated with deductions (points), it may be used to draw inferences from observed facts. This is achieved by representing all available and relevant facts as vectors in the multi-dimensional semantic space and considering how these vectors are located with respect to deduction points or volumes. A set of fact vectors, when added using vector algebra may precisely reach a deduction point in the space. In that situation, a deductive inference is implied. Alternatively, even in the situation where no vectors or combinations of vectors precisely inhabits a deduction point, more uncertain reasoning can be performed using mechanisms such as distance metrics. For example, it may be implied that a vector, which is "close enough" to a deduction point, is a weak indicator of that deduction. Furthermore, in the face of partial data, vector techniques may be used to hone in on inferences by identifying facts (vectors), currently not asserted, which would allow for some significant deduction to be drawn. Such a situation may indicate that the system should perhaps direct extra resources towards discovering the existence (or otherwise) of a key fact.

The actual inferencing mechanism to be used within higher-level Shapes Vector agents is slightly more flexible than the scheme we have described above. Rather than simply tying facts to vectors defined in terms of the IA's base nouns, we instead define an independent but spatially continuous 'fact space'. FIG. 8 demonstrates the concept: a deductive space has been defined in terms of a set of base nouns relevant to the IA. Occupying the same spatial region is a fact space, whose axes are derived from the agent's layer ontology. Facts are defined as vectors in this second space: that is, they are entities fixed with respect to the fact axes. However, since the fact space and deduction space overlap, these fact vectors also occupy a location with respect to the base noun axes. It is this location which we use to make deductive inferences based upon fact vectors. Thus, in the figure, the existence of a fact vector (arrow) close to one of the deductions (dots) may allow for assertion of that deduction with a particular certainty value (a function of exactly how close the vector is to the deduction point). Note that, since the axes of the fact space are independent of the axes of the deductive space, it is possible for the former to vary (shift, rotate and/or translate, perhaps independently) with respect to the latter. If such a variation occurs, fact vectors (fixed with regard to the fact axes) will have different end-points in deduction-space. Therefore, after such a relative change in axes, a different set of deductions may be inferred with different confidence ratings. This mechanism of semantic relativity may potentially be a powerful tool for performing deductive inferencing in a dynamically changing environment.

An interesting aspect of our approach to vector-based deductive inference is that it is based fundamentally upon ontological concepts, which can in turn be expressed as English nouns. This has the effect that the deductions made by an agent will resemble simple sentences in a very small dialect of pseudo-English. This language may be a useful medium for a human to interact with the agent in a relatively natural fashion.

While the inferencing strategy described above has some unorthodox elements in its approach to time-varying probabilistic reasoning for security applications, there are more conventional methods which may be used within Shapes Vector IA's in the instance that the method falls short of its expected deductive potential.

As described above, the vector-based deductive engine is able to make weak assertions of a deduction with an associated certainty value (based on distances in n-Dimensional space). This value can be interpreted in a variety of ways to achieve different flavours of deductive logic. For example, the certainty value could potentially be interpreted as a probability of the assertion holding true, derived from a consideration of the current context and encoded world knowledge. Such an interpretation delivers a true probabilistic reasoning system. Alternatively, we could potentially consider a more rudimentary interpretation wherein we consider assertions with a certainty above a particular threshold (e.g. 0.5) to be "possible" within a given context. Under these circumstances, the system would deliver a possiblistic form of reasoning. Numerous other interpretations are also possible.

Frame based systems offer one well understood (although inherently limited) alternative paradigm. Indeed, it is expected that some IA's will be frame based in any case (obtained off the shelf and equipped with an ontological interface to permit knowledge transfer with the knowledge base).

Other agents based on neural nets, Bayesian, or statistical profiling may also inhabit the Agent macro-object.

4.3 Other Applications

The IA architecture lends itself to other applications. For example, it is not uncommon for Defence organisations and institutions to maintain many databases in just as many formats. It is very difficult for analysts to peruse these databases in order to gain some required insight. There has been much effort aimed at considering how particular databases may be structured in order for analysts to achieve their objectives. The problem has proved to be difficult. One of the major hurdles is that extracting the analysts' needs and codifying them to structure the data leads to different requirements not only between analysts, but also different requirements depending on their current focus. One of the consequences is that in order to structure the data correctly, it must be context sensitive, which a relational database is not equipped to handle.

Shapes Vector can overcome many of the extant difficulties by permitting knowledge and deduction rules to be installed into an IA. This IA, equipped with a flexible user interface and strictly defined query language, can then parse the data in a database in order to arrive at a conclusion. The knowledge rules and analyst-centric processing are encoded in the IA, not in the structure of the database itself, which can remain flat and context free. The Shapes Vector system allows incremental adjustment of the IA without having to re-format and restructure a database either through enhancement of the IA, or through an additional IA with relevant domain knowledge. Either the IA makes the conclusion, or it can provide an analyst with a powerful tool to arrive at low level deductions that can be used to arrive at the desired conclusion.

5 Synthetic Stroboscopes and Selective Zoom

In this section, we discuss two mechanisms for overcoming difficulties in bringing important events to the fore in a highly cluttered visual environment: Synthetic Strobes and Selective Zoom.

5.1 Synthetic Strobes

One of the major difficulties with depicting data visually in a real-time system is determining how to handle broad temporal domains. Since the human is being used to provide inductive inference at the macro level, much data which needs to be represented visually may not be possible to show due to temporal breadth. For example, there may be a pattern in a fast packet stream, yet if we were to be able to see the pattern in the packet stream, other events which may also represent a significant pattern may be happening much more slowly (e.g. slowly revolving sphere). Yet the perception of both patterns simultaneously may be necessary in order to make an inductive hypothesis.

A scientist at MIT during World War Two invented a solution to this type of dilemma. By the use of a device (now well known in discos and dance studios) called a stroboscope, Edgerton was able to visualise patterns taking place in one temporal domain in another. One of the most striking and relatively recent examples was the visualisation of individual water droplets in an apparent stream produced by a rapid impellor pump. The stream looked continuous, but viewed under the strobe, each water droplet became distinctly apparent.

We can use the same concept of strobes, ie. synthetic strobes, to bring out multi temporal periodic behaviour in the Shapes Vector visualisation process. With a synthetic strobe, we can visualise packet flow behaviour more precisely, while still retaining a view of periodic behaviour that may be occurring much more slowly elsewhere.

Since we have potentially many different events and objects within our view, it becomes necessary to extend the original strobe concept so that many different types of strobes can be applied simultaneously. Unlike the employment of photonic based strobes, which can interfere with each other, we are able to implement strobes based on:

Whole field of view
Per object instance
Per object class
Per object attribute

In addition, multiple strobes can be applied where each has complex periodic behaviour or special overrides depending on specific conditions. The latter can also be seen from the oscilloscope perspective where a Cathode Ray Oscilloscope is triggered by an event in order to capture the periodic behaviour. Naturally, with a synthetic strobe, quite complex conditions can be specified as the trigger event.

Just as in the days of oscilloscopes, it is important to be able to have variable control over the triggering rate of a strobe. Accordingly, control of the strobes is implemented via a set of rheostats.

5.2 Selective Zoom

In order to see a pattern, it is sometimes necessary to zoom out from a vista in order to gain a very high level view of activity in a network. While this can be quite useful, it is intuitive that important events for certain classes of object will fail to be noticed due to wide dispersal across the vista.

If a class of objects typically have a large Representation compared to others, then zooming out to see a pattern across a large vista is appropriate. However, if the class of objects in question is small, then zooming out causes them to be less noticeable when compared to much larger objects.

Selective Zoom overcomes this difficulty and others of a similar ilk by providing two mechanisms. The first mechanism allows a user to change quickly the relative sizes of objects in relation to others. This permits a user to zoom out in order to see a large vista while still retaining a discernible view of specific objects. The second mechanism permits movement and projection of objects onto planes "above" or "below" the primary grids used to layout a view.

As can be seen in the following paragraphs, selective zoom provides a generalised translation and rotation mechanism in three-dimensional Cartesian space.

While the above two mechanisms can surely find utility, selective zoom also provides a more sophisticated "winnowing" facility. This facility caters to a typical phenomenon in the way humans "sift" through data sets until they arrive at a suitable subset for analysis. In the case of focusing on a particular set of objects in order to undertake some inductive or deductive analysis, a human may quickly select a broad class of objects for initial analysis from the overall view despite a priori knowing that the selection may not be optimal. The user typically then undertakes either a refinement (selecting a further subset) or putting the data aside as a reference while reforming the selection criteria for selection. After applying the new criteria, the user may then use the reference for refinement, intersection, or union with previous criteria depending on what they see.

Via selective zoom (perhaps raised above the main view plane), a user can perform a selective zoom on a zoomed subset. This procedure can be undertaken re-cursively, all the while making subsets from the previous relative zoom. The effect can be made like a "staircasing" of views. FIG. 9 (segments two and three) depicts the use of selective zoom where subsets of nodes have been placed above the main view plane. Note the set of nodes to the left were produced by a previous use of the zoom. This set need not be a subset of the current staircase.

Indeed the set to the left can be used to form rapidly a new selection criterion. The effects can be described by simple set theory. As implied above a user may also select any of the zoomed sets and translate them to another part of the field of view. These sets can also then be used again to form unions and intersections with other zoomed views or subsets of views that are generated from the main view.

Segment one of FIG. 9 depicts the same view from above. Note the schematic style.

VDI has produced a visualisation toolkit in which a particular application depicts a set of machine nodes. By clicking on a representation of a node, it is "raised" from the map and so are the nodes to which it is connected. This may be interpreted as a simple form of one aspect of selective zoom. However, it is unclear whether this VDI application is capable of the range of features forming a generalised selective zoom. For example, the capability to implement set translation in three dimensional Cartesian space, along with union and intersection for rapid reselection and manipulation of arbitrary view sets, as well as relative size adjustment based on class, instance, or object attribute properties.

6 Temporal Hierarchies

Temporal hierarchies refer to three perceived issues: synthetic strobes along both directions of the temporal axis; user information overload, and dealing with data streams with Intelligent Agents. We discuss each in turn.

6.1 Strobes Revisited

In Section 5 we introduced the notion of a synthetic strobe which can be used to shunt rapid periodic behaviour along a "temporal axis" so that the behaviour becomes discernible to the human eye. This shunting was necessary since many patterns of behaviour occur far too rapidly (e.g. characteristics of packet flow and their contents). However, a limitation of synthetic strobes as described is that they shunt or map patterns in only one direction along the temporal axis. More precisely, rapid behaviour is shunted into a "slower" domain. Yet some behaviour of security significance may require a view which spans a relatively long time. Hence it was hypothesised that strobes must be able to not only show up rapid behaviour, but also show slow behaviour. To do this, Shapes Vector must be able to store events, and then be able to map a strobe over them in order to display the possible pattern. Essentially, it is preferable to be able to map behaviour, which can occur along a broad front of the temporal axis into a much smaller domain, which is perceptible to Humans. As an aside, it is a well known technique to see patterns of motion in the cosmos by strobing and playing at high speed various observations, e.g. star field movement to ascertain the celestial poles. However, what we propose here, apart from the relative novelty of taking this concept into cyberspace, is the additional unusual mechanism of complex trigger events in order to perceive the "small" events, which carry so much import over "long" time periods. We can assign triggers and functions on a scale not really envisaged even in terms of cosmological playback mechanisms.

Elsewhere, we discuss many other issues related to synthetic strobes. For example, the mechanisms for setting complex trigger conditions via "trigger boxes", the need for "synthetic time", its relation to real time, and generated strobe effects.

6.2 User Information Overload

Another reason for using strobes, even if the pattern is already within the temporal perception domain of the user, is that they can highlight potentially important behaviour from all the "clutter". Visualisation itself is a mechanism whereby certain trends and macro events can be perceived from an information rich data set. However, if related or semantically similar events mix together, and a particular small event is to be correlated with another, then some form of highlighting is needed to distinguish it in the visual environment. Without this sort of mechanism, the user may suffer data overload. Synthetic strobes designed to trigger on specific events, and which only affect particular classes of objects, are surmised to provide one mechanism to overcome this expected problem.

6.3 Data Streams and IA's

One of the fundamental problems facing the use of IA's in the Shapes Vector system is the changing status of propositions. More precisely, under temporal shifts, all "facts" are predicates rather than propositions. This issue is further complicated when we consider that typical implementations of IA's do not handle temporal data streams. We address this problem by providing each IA with a "time aperture" over which it is currently processing. A user or a higher level agent can set the value of this aperture.

Any output from an IA is only relevant to its time aperture setting (FIG. 10). The aperture mechanism allows the avoidance of issues such as contradictions in facts over time, as well providing a finite data set in what is really a data stream. In fact, the mechanism being implemented in our system permits multiple, non-intersecting apertures to be defined for data input.

With time apertures, we can "stutter" or "sweep" along the temporal domain in order to analyse long streams of data. Clearly, there are a number of issues, which still must be dealt with. Chief amongst these is the fact that an aperture may be set which does not, or rather partially, covers the data set whereby a critical deduction must be made. Accordingly, strategies such as aperture change and multiple apertures along the temporal domain must be implemented in order to raise confidence that the relevant data is input in order to arrive at the relevant deduction.

While we are aware that we can implement apertures in order to supply us with useful deductions for a number of circumstances, it is still an open question as to how to achieve a set of sweep strategies for a very broad class of deductions where confidence is high that we obtain what we are scanning for. One area, which comes to mind, is the natural "tension" between desired aperture settings. For example, an aperture setting of 180 degrees (ie., the whole fact space) is desirable as this considers all data possible in the stream form the beginning of the epoch of capture to the end of time, or rather the last data captured. However, this setting is impractical from an implementation point of view, as well as introducing contradictions in the deductive process. On the other hand, a very small aperture is desirable in that implementation is easy along with fast processing, but can result in critical packets not being included in the processing scan.

7 Other Visualisation Efforts

Various techniques of visualisation have over the years been applied to the analysis of different domains of abstract data, with varying success. Several such attempts bear similarities to portions of the Shapes Vector system, either in the techniques employed or the broad aims and philosophies guiding those techniques. In this section we briefly describe the most significant of these related visualisation efforts, concentrating on the specific domains of security visualisation, network visualisation and communications-related data mining.

The following discussion providing some background to the invention is intended to facilitate a better understanding of the invention. However, it should be appreciated that the discussion is not an acknowledgment or admission that any of the material referred to was published, known or part of the common general knowledge in any relevant country as at the priority date of the application.

7.1 NetPARS

A proposal from NRaD and the NRL, the Network Propagation Assessment and Recovery System (NetPARS) is an effort to assist decision making in defensive information warfare. It aims to supply such support by means of rigorously tracking data quality within a system and estimating how degradations in quality propagate between data. Such a protocol would, it is claimed, be capable of providing intrusion detection services, assessment of security state and assist in recovery following an attack.

The proposed system architecture incorporates a set of mapping agents (responsible for keeping track of inter-relationships between data), sensor elements (capable of detecting intrusions and other reductions in data quality) and recovery elements. When a sensor detects the compromise of one or more data item, the system computes (via a forward propagating expert system) the extent to which this loss in quality is propagated to other data. This information is presented to the user to assist in the defence and/or containment of the compromise.

Ultimately it is envisaged that NetPARS will also incorporate a second knowledge engine. This takes a reported reduction in data quality and, by backward propagation, determines the tree of data items which could conceivably have been the initial cause of that reduction. This fault tree is a principal input to the process of recovery.

Although only sketchy details of the NetPARS proposal are available at present, the system would appear to have some superficial similarities to Shapes Vector. Both make use of forward and backward propagation of knowledge through a set of rules (although the function of backward propagation is quite different in the two systems). Also, both NetPARS and Shapes Vector incorporate agents, which are tasked with intrusion detection as an aid towards a human response. However, whereas the Shapes Vector architecture incorporates a broad range of such agents, it seems that the intrusion detection functionality of NetPARS is currently limited to a single class of attack (storage spoofing).

Beyond these superficial resemblances the two systems have little in common. NetPARS appears to place less importance upon visualisation technology, while in Shapes Vector this is an easily realisable feature where several novel visualisation techniques have been proposed. The NRaD/NRL proposal appears to focus heavily on a tight domain of data and its inter-relationship, while the Shapes Vector system aims to model a much larger concept space with a comprehensive ontology. Ontology can be made relevant to a great variety of application areas. Computer security as discussed in this specification is but one example. Shapes Vector also includes a potentially very powerful temporal control mechanism as well as intelligent agent architecture with user semantic bindings.

7.2 Security Visualisation

Eagle Netwatch is a commercial software package written by Raptor Systems Inc., which offers system administrators a visual representation of the security of their (firewall protected) network. The network is displayed by the tool as an interconnected set of coloured solids positioned in a three-dimensional virtual world. By replaying audit trails collected on the firewall this display is animated to illustrate particular gateway events which pertain to the system's security. During the playback of this security "movie," the user can rotate the virtual world to more clearly observe the activities of particular network elements. The tool also offers other visualisations of audit logs, most notably two-dimensional plots of gateway statistics against time.

The basic concept underlying Eagle Netwatch—that by observing events in a visual representation of the network a (human user) may notice patterns signifying security events—is similar to the Shapes Vector philosophy as described in Section 3. However, at the time of writing this information the Netwatch tool lacks much of the sophistication of the Shapes Vector environment including the capacity for real-time visualisation, the presence of intelligent deductive agents, the possibility of remote discovery and visual mechanisms for recognising temporal patterns.

7.3 Network Visualisation

AT&T Bell have constructed a set of prototype tools, collectively called SeeNet which provide tools for the visualisations of telecommunications traffic. The system displays the traffic between two locations by drawing a line on a two-dimensional geographical map. Line width and colour convey aspects of that traffic (e.g., volume). In visualising traffic on an international scale, the resulting map is typically wrapped around a sphere to give the impression of the globe. By observing trends in the visualised traffic, key performance bottlenecks in real-world telecommunications services (including the Internet) have been identified. Also by investigating observed "hot spots" in these representations, AT&T have been able to identify fraudulent use of their facilities.

A similar visualisation approach has been adopted by British Telecom in a prototype system for observing the parameters of their communications network. An outline map of Britain is overlaid with a representation of the BT network with a "skyscraper" projecting upwards from each switching node. The height of the skyscraper denotes the value of the metric being visualised (e.g., traffic or number of faults). The user can navigate freely through the resulting 3D environment. A second visualisation attempt undertaken by British Telecom considers a different three-dimensional visualisation of the communication network as an aid for network architects. A similar approach has been adopted by IBM's Zurich Research Laboratories in their construction of a tool for visualising a computer network's backbone within a full three-dimensional virtual (VRML) world. The goal of this latter system is to ease the task of administering such network backbones.

While Shapes Vector can render similar scenes via its Geo View methods, there is little else in common because of the existence of Data View, Selective View and Strobe when used as part of the visual element. The agent architecture and other elements further distinguish the Shapes Vector system.

7.4 Data Mining

The mining and visualisation of large data sets for the purpose of extracting semantic details is a technique that is applied to many application domains. Several recent efforts have considered such approaches for deriving visual metrics for web-server performance and also for conveying the inter-relatedness of a set of HTML documents. Research undertaken by the NCSA considers the first of these types of data mining in an immersive virtual reality environment called Avatar. The basic approach adopted in their performance measurement work is to construct a virtual world of "scattercubes", regions of space in which three of the many measured metrics are plotted against one another. The world contains enough scattercubes that every set of three metrics is compared in at least one. Users can browse this virtual world using either head-mounted displays or a virtual reality theatre, walking within a single cube and flying over the whole aggregation of cubes. More recently this same system has also been used for visualising the performance of massively parallel programs.

Other data-mining work has considered the derivation of semantics related to the interconnections of WWW-based information. The WAVE environment from the University of Arkansas aims to provide a 3D visualisation of a set of documents grouped according to conceptual analysis. Work at AT&T Bell considers plots of web-page access patterns which group pages according to their place in a web site's document hierarchy.

These efforts can be rendered with Shapes Vector's Data View display. The Avtar effort does not, however, share the Shapes Vector system's ability to effectively provide a semantic link between such data-oriented displays and geographic (or more abstract) views of the entities under consideration, nor represent the force paradigm's represented in Data View.

7.5 Parentage and Autograph

Parentage and its successor Autograph are visualisation tools constructed by the NSA for assisting analysts in the task of locating patterns and trends in data relating to operating communications networks. The tools act as post-processors to the collected data, analysing the interactions between senders and receivers of communications events. Based on this analysis the tools produce a representation of the network as a graph, with nodes describing the communications participants and the edges denoting properties of the aggregated communication observed between participants. The user of the system may choose which of a pre-defined palette of graph layouts should be used to render the graph to the screen. The scalability of the provided layouts is limited and, as a means of supporting large data-sets, the tool allows for the grouping of nodes into clusters which are represented as single nodes within the rendered graph. Additionally, facilities exist for the displayed graph to be animated to reflect temporal aspects of the collected data.

While the aims of the Parentage and Autograph systems have some intersection with the visual sub-systems of Shapes Vector, the systems differ in a number of important regards. Firstly, the NSA software is not designed for real-time analysis options. Secondly, the displays generated by Parentage and Autograph are not intended to provide strong user customisation facilities: the user may choose a layout from the provided palette, but beyond this no control of the rendered graph is available. Contrast this with the Shapes Vector approach which stipulates that each of the views of the security domain must be extremely customable to cater to the different abilities of users to locate patterns in the visual field (see Section 3).

It is interesting to note that this last point has been observed in practical use of Parentage and Autograph: while the provided visual palette allows some analysts to easily spot significant features, other users working with the same tools find it more difficult to locate notable items.

Appendix Part 1—Custom Control Environments for Shapes Vector

As described in the body of this section of the specification, the Shapes Vector system is a tool based upon the fundamental assertion that a user can visually absorb a large body of security-relevant data, and react. For such a capability and for a response to be effective, the Shapes Vector user must have access to a broad range of hardware peripherals, each offering a different style of interaction with the system. Section 2.2 of this part, describes the types of peripherals, which are present within the current system.

The exact physical configuration of peripherals presented to a user of the Shapes Vector system will depend upon the needs of the 'role' that user is playing within the (collaborative) information operation. It is considered that there are two types of operational roles: strategic/planning and tactical. Peripheral configurations catering to the specific interactive needs of users operating in each of these modes are outlined below.

A.1 Strategic Environment

Since the principal functions of a strategic Shapes Vector user focus primarily on non-real-time manipulation of data, there is little demand for speedy forms of interaction such as that afforded by joysticks and spaceballs. Instead, the core interactions available within this environment must be extremely precise: we envisage the use of conventional modes such as keyboard entry of requests or commands coupled with the gesture selection of items from menus (e.g. by mouse). Thus we would expect that a strategic Shapes Vector station might consist of a configuration similar to the traditional workstation: e.g., a desk with screen, Keyboard and mouse atop.

A.2 Tactical Environment

In the course of a Shapes Vector information operation, one or more of the operations team will be operating in a tactical mode. In such a mode, real-time data is being continually presented to the user and speedy (real-time) feedback to the system is of critical importance. Such interactions must primarily be made through high-bandwidth stream-based peripherals such as joysticks and dials. The complexity of the virtual environment presented by Shapes Vector suggests that a high number of different real-time interactions may be possible or desirable.

To provide a capacity for quickly switching between these possible functions, we choose to present the user with a large number of peripherals, each of which is responsible for a single assigned interaction. Since some system interactions are more naturally represented by joysticks (e.g. flying through the virtual cyberspace) while others are more intuitively made using a dial (e.g. synthetic strobe frequency) and so on, we must also provide a degree of variety in the peripheral set offered to the user.

The technical issues involved in providing a large heterogeneous peripheral set in a traditional desktop environment are prohibitive. To this end a preferred design for a custom tactical control environment has been developed. The user environment depicted in FIG. 11 achieves the goal of integrating a large number of disparate input peripherals into a dense configuration such that a user may very quickly shift and apply attention from one device to another.

The following input devices are incorporated into a preferred Shapes Vector Tactical Control Station depicted in FIG. 11:

two joysticks
rudder pedals (not visible in the figure)
two dial/switch panels
keyboard (intended for the rare cases where slow but precise interaction is necessary)
trackball The principal display for the tactical user is a large projected screen area located some distance in front of the control station. However, a small LCD screen is also provided for displaying localised output (e.g. the commands typed on the keyboard).

Part 2 Shapes Vector Master Architecture

1. Introduction

The fundamental aspects of the Intelligent Agent Architecture (IAA) for the Shapes Vector system are discussed in this Part of the specification. Several unusual features of this architecture include a hierarchy of context free agents with no peer communication, a specific method for constructing ontologies which permits structured emergent behaviour for agents fusing knowledge, and the ability to undertake a semantic inferencing mechanism which can be related to human interfacing.

1.1 Shapes Vector Master Architecture

The master architecture diagram (FIG. 1) shows six main sub-systems to Shapes Vector:

Sensor system. This sub-system comprises sensors that collect data. A typical example would be an Ethernet packet sniffer. Sensors may be local or remote and the communication path from the sensor and the rest of the system can take many forms ranging from a UNIX socket, through to a wireless network data link.

The Intelligent Agent Architecture (Gestalt). This sub-system, described extensively in this paper, is responsible for processing sensor data and making intelligent deductions based on that input.

The Tardis. This sub-system is a real time manager of events and a global semantic mapper. It also houses the synthetic clock mechanism that is discussed in a later Part of this specification. The Tardis is capable of taking deductions from the Agent Gestalt and mapping them to an event with a specific semantic ready for visualisation.

The Visuals. This sub-system actually comprises a number of "view" modules that can be regarded as sub-systems in their own right. Each view is built from common components, but visualises events input to it from the Tardis according to a fundamental display paradigm. For example, Geoview displays events and objects based on a geographic location paradigm (wherein it is possible to layout objects according to a space coordinate system. Multiple interpretations of the layout are possible. A typical use though is to layout computers and other physical objects according to their physical location.), whereas DataView lays out objects based on the level of interaction (forces) between them.

The I/O system. This sub-system provides extensive faculties for users to navigate through the various views and interact with visualised objects.

The Configuration system. This sub-system offers extensive features for customising the operation of all of the various sub-systems.

Essentially, the system operates by recording data from the sensors, inputting it into the Agent Gestalt, where deductions are made, passing the results into the Tardis, which then schedules them for display by the visualisation sub-system.

1.2 Precis of this Part of the Specification.

Portions of the information contained in the following sections will be a repeat of earlier sections of the specification. This is necessary due to the very large amount of information contained in this document and the need to refresh the readers memory of the information in the more detailed context of this part. Section 2 of this part discusses the fundamentals of the agent architecture, which includes a discourse on the basic inferencing strategies for Shapes Vector agents. These inferencing strategies, described in Section 3 of this part are based on epistemic principles for agents with a "low level of abstraction" to a semantic vector based scheme for reasoning under uncertainty. Of interest is the method utilised to link an agent's semantics with the semantics of interaction with a user. This link is achieved by adjusting and formalising a highly restricted subset of English.

In Section 4 of this part the basic rules of constructing an agent are described and of how they must inhabit the architectural framework. The architectural framework does not preclude the introduction of "foreign" agents as long as an interface wrapper is supplied to permit it to transfer its knowledge and deduction via the relevant ontological interfaces.

Section 5 of this part discusses the temporal aspects of intelligent agents. Section 6 of this part reveals some implications for the development of higher abstraction levels for agents when considering the fusing of data from lower abstraction level agents. The ontological basis for the first of these higher levels—levels 2—are detailed in Section 7 of this part.

Section 8 of this part gives a brief overview of the requirement for intelligent interfaces with which a user may interact with the various elements of an agent Gestalt. Section 9 of this part provides some general comments on the architecture, while Section 10 of this part contrasts the system with the high-level work of Bass.

2. The Agent Architecture

Shapes Vector is intended to house large numbers of Intelligent Agents (IA's), with different domains of discourse. These agents make inferences and pass knowledge to one another in order to arrive at a set of deductions that permit a user to make higher level hypotheses.

2.1 Agent Architecture

The Shapes Vector system makes use of a multi-layer multi-agent knowledge processing architecture. Rather than attempting to bridge the entire semantic gap between base facts and high-level security states with a single software entity, this gap is divided into a number of abstraction layers. That is, we begin by considering the problem of mapping between base facts and a marginally more abstract view of the network. Once this (relatively easy) problem has been addressed, we move on to considering another layer of deductive processing from this marginally more abstract domain, to a yet more abstract domain. Eventually, within the upper strata of this layered architecture, the high-level concepts necessary to the visualisation of the network can be reasoned about in a straightforward and context-free fashion.

The resulting Shapes Vector Knowledge Architecture (SVKA) is depicted in FIG. 7. The layered horizontal boxes within the figure represent the various layers of knowledge elements. At the very bottom of the figure lies the store of all observed base facts (represented as a shaded box). Above this lies a deductive layer (termed "Level 1" of the Knowledge Architecture) which provides the first level of translation from base fact to slightly more abstract concepts.

In order to achieve knowledge transfer between agents which is both consistent and sound, an ontology (ie. a formal knowledge representation) becomes imperative. Due to our approach of constructing our knowledge processing sub-system as a set of abstraction layers, we must consider knowledge exchange at a number of different levels of abstraction. To construct a single ontology capable of expressing all forms of knowledge present within the system is problematic due to the breadth of abstraction. Attempting such ontology it is unlikely to produce a tidy set of universal rules, and far more likely to produce a complex family of inter-related concepts with ad-hoc exceptions. More likely, due to the total domain of discourse being so broad, ontology produced in this manner will be extremely context sensitive, leading to many possibilities for introducing ambiguities and contradictions.

Taking a leaf from our earlier philosophy of simplification through abstraction layering, we instead choose to define a set of ontologies: one per inter-layer boundary. FIG. 7 indicates these ontologies as curved arrows to the left of the agent stack.

The communication of factual knowledge to IAs in the first level of abstraction is represented by means of a simple ontology of facts (called the Level 1 Shapes Vector Ontology). All agents described within this portion of the specification make use of this mechanism to receive their input. It is worthwhile noting that the knowledge domain defined by this ontology is quite rigidly limited to incorporate only a universe of facts—no higher-level concepts or meta-concepts are expressible in this ontology. This simplified knowledge domain is uniform enough that a reasonably clean set of ontological primitives can be concisely described.

Interaction between IA's is strictly limited to avoid the possibility of ambiguity. An agent may freely report outcomes to the Shapes Vector Event Delivery sub-system, but inter-IA communication is only possible between agents at adjacent layers in the architecture. It is specifically prohibited for any agent to exchange knowledge with a "peer" (an agent within the same layer). If communication is to be provided between peers, it must be via an intermediary in an upper layer. The reasons underlying these rules of interaction are principally that they remove chances for ambiguity by forcing consistent domain-restricted universes of discourse (see below). Furthermore, such restrictions allow for optimised implementation of the Knowledge Architecture.

One specific optimisation made possible by these constraints—largely due to their capacity to avoid ambiguity and context—is that basic factual knowledge may be represented in terms of traditional context-free relational calculus. This permits the use of relational database technology in storage and management of knowledge. Thus, for simple selection and filtering procedures on the knowledge base we can utilise well known commercial mechanisms which have been optimised over a number years rather than having to build a custom knowledge processor inside each intelligent agent.

Note that we are not suggesting that knowledge processing and retrieval is not required in an IA. Rather that by specifying certain requirements in a relational calculus (SQL is a preferable language), the database engine assists by undertaking a filtering process when presenting a view for processing by the IA. Hence the IA can potentially reap considerable benefits by only having to process the (considerably smaller) subset of the knowledge base which is relevant to the IA. This approach becomes even more appealing when we consider that the implementation of choice for Intelligent Agents is typically a logic language such as Prolog. Such environments may incur significant processing delays due to the heavy stack based nature of processing on modern Von Neumann architectures. However, by undertaking early filtering processes using optimised relational engines and a simple knowledge structure, we can minimise the total amount of data that is input into potentially time consuming tree and stack-based computational models.

The placement of intelligent agents within the various layers of the knowledge architecture is decided based upon the abstractions embodied within the agent and the knowledge transforms provided by the agent. Two criteria are considered in determining whether a placement at layer n is appropriate:

- would the agent be context sensitive in the level n ontology? If so, it should be split into two or more agents.
- does the agent perform data fusion from one or more entities at level n? If so it must be promoted to at least level n+1 (to adhere to the requirement of no "horizontal" interaction)

2.2 A Note on the Tardis

A more detailed description of the Tardis is provided in part 5 of the specification.

The Tardis connects the IA Gestalt to the real-time visualisation system. It also controls the system's notion of time in order to permit facilities such as replay and visual or other analysis anywhere along the temporal axis from the earliest data still stored to the current real world time.

The Tardis is unusual in its ability to connect an arbitrary semantic or deduction to a visual event. It does this by acting as a very large semantic patch-board. The basic premise is that for every agreed global semantic (e.g. X window packet arrived [attribute list]) there is a specific slot in an infinite sized table of globally agreed semantics. For practical purposes, there are $2^{64}$ slots and therefore the current maximum number of agreed semantics available in our environment. No slot, once assigned a semantic, is ever reused for any other semantic. Agents that arrive at a deduction, which matches the slot semantic, simply queue an event into the slot. The visual system is profiled to match visual events with slot numbers. Hence visual events are matched to semantics.

As for the well-known IP numbers and Ethernet addresses, the Shapes Vector strategy is to have incremental assignment of semantics to slots. Various taxonomies etc. are being considered for slot grouping. As the years go by, it is expected that some slots will fall into disuse as the associated semantic is no longer relevant, while others are added. It is considered highly preferable for obvious reasons, that no slot be reused.

As mentioned, further discussion about the Tardis and its operation can be found in part 5 of the specification.

3. Inferencing Strategies

The fundamental inferencing strategy underlying Shapes Vector is to leave inductive inferencing as the province of the (human) user and deductive inferencing as typically the province of the IA's. It is expected that a user of the system will examine deductive inferences generated by a set of IA's, coupled with visualisation, in order to arrive at an inductive hypothesis. This separation of duties markedly simplifies the implementation strategies of the agents themselves. Nevertheless, we propose further aspects that may produce a very powerful inferencing system.

3.1 Traditional

Agents can employ either forward chaining or backward chaining, depending on the role they are required to fulfil. For example, some agents continuously comb their views of the knowledge base in attempts to form current, up to date, deductions that are as "high level" as possible. These agents employ forward chaining and typically inhabit the lower layers of the agent architecture. Forward chaining agents also may have data stream inputs from low level "sensors". Based on these and other inputs, as well as a set of input priorities, these agents work to generate warnings when certain security-significant deductions become true.

Another set of agents within the Shapes Vector system will be backward chaining (goal driven) agents. These typically form part of the "User Avatar Set": a collection of knowledge elements, which attempt to either prove or disprove user queries (described more fully in Section 8 of this part.).

3.2 Possiblistic

In executing the possiblistic features incorporated into the level 2 ontology (described in Section 7.1 of this part), agents may need to resort to alternative logics. This is implied by the inherent multi-valued nature of the possiblistic universe. Where a universe of basic facts can be described succinctly in terms of a fact existing or not existing, the situation is more complex when symbolic possibility is added. For our formulation we chose a three-valued possiblistic universe, in which a fact may be existent, non-existent, or possibly existent.

To reason in such a universe we adopt two different algebra's. The first a simple extension of the basic principle of unification common to computational logic. Instead of the normal assignation of successful unifaction to existence and unsuccessful unification to non-existence, we adopt the following:

successful unification implies existence,
the discovery of an explicit fact which precludes unification implies non-existence (this is referred to this as a hard fail),
unsuccessful unification without an explicit precluding case implies possible existence (this is referred to as a soft fail)

A second algebra, which may be used to reason in the possiblistic universe, involves a technique known as "predicate grounding" in which a user-directed pruning of a unification search allows for certain specified predicates to be ignored (grounded) when possibilities are being evaluated.

3.3 Vectors

Agents operating at higher levels of the Shapes Vector Knowledge Architecture may require facilities for reasoning about uncertain and/or incomplete information in a more continuous knowledge domain. Purely traditional forward or backward chaining does not easily express such reasoning, and the three-valued possiblistic logic may lack the necessary quantitative features desired. To implement such agents an alternative inferencing strategy is used based upon notions of vector algebra in a multi-dimensional semantic space. This alternative strategy is employed in conjunction with more conventional backward chaining techniques. The use of each of the paradigms is dependent on the agent, and the domain of discourse.

Our vector-based approach to inferencing revolves around constructing an abstract space in which relevant facts and deductions may be represented by geometrical analogues (such as points and vectors), with the proper algebraic relationships holding true. In general, the construction of such a space for a large knowledge domain is extremely difficult. For Shapes Vector, we adopt a simplifying strategy of constructing several distinct deductive spaces, each limited to the (relatively small) domain of discourse of a single intelligent agent. The approach is empirical and is only feasible if each agent is restricted to a very small domain of knowledge so that construction of its space is not overly complex.

The definition of the deductive space for an IA is a methodical and analytical process undertaken during the design of the agent itself. It involves a consideration of the set of semantic concepts ("nouns") which are relevant to the agent, and across which the agent's deductions operate. Typically this concept set will contain elements of the agent's layer ontology as well as nouns which are meaningful only within the agent itself. Once the agent's concept set has been discovered, we can identify within it a subset of 'base nouns'—concepts which cannot be defined in terms of other members of the set. This identification is undertaken with reference to a semi-formal 'connotation spectrum' (a comparative metric for ontological concepts).

Such nouns have two important properties:

each is semantically orthogonal to every other base noun, and every member of the concept set which is not a base noun can be described as a combination of two or more base nouns.

Collectively, an IA's set of n base nouns defines a n-dimensional semantic space (in which each base noun describes an axis). Deductions relevant to the agent constitute points within this space; the volume bounded by spatial points for the full set of agent deductions represents the sub-space of possible outputs from that agent. A rich set of broad-reaching deductions leads to a large volume of the space being covered by the agent, while a limited deduction set results in a very narrow agent of more limited utility (but easier to construct). Our present approach to populating the deductive space is purely empirical, driven by human expert knowledge. The onus is thus upon the designer of the IA to generate a set of deductions, which (ideally) populate the space in a uniform manner.

In reality, the set of deductions that inhabit the space can become quite non-uniform ("clumpy") given this empirical approach. Hence rigorous constraint on the domain covered by an agent is entirely appropriate. Of course this strategy requires an appropriate mechanism at a higher abstract layer. However, the population of a higher layer agent can utilise the agents below them in a behavioural manner thereby treating them as sub-spaces.

Once an agent's deductive space has been constructed and populated with deductions (points), it may be used to draw inferences from observed facts. This is achieved by representing all available and relevant facts as vectors in the multi-dimensional semantic space and considering how these vectors are located with respect to deduction points or volumes. A set of fact vectors, when added using vector algebra may precisely reach a deduction point in the space. In that situation, a deductive inference is implied. Alternatively, even in the situation where no vectors or combinations of vectors precisely inhabits a deduction point, more uncertain reasoning can be performed using mechanisms such as distance metrics. For example, it may be implied that a vector, which is "close enough" to a deduction point, is a weak indicator of that deduction. Furthermore, in the face of partial data, vector techniques may be used to hone in on inferences by identifying Facts (vectors), currently not asserted, which would allow for some significant deduction to be drawn. Such a situation may indicate that the system should perhaps direct extra resources towards discovering the existence (or otherwise) of a key fact.

The actual inferencing mechanism to be used within higher-level Shapes Vector agents is slightly more flexible than the scheme we have described above. Rather than simply tying facts to vectors defined in terms of the IA's base nouns, we can define an independent but spatially continuous 'fact space'. FIG. 8 demonstrates the concept: a deductive space has been defined in terms of a set of base nouns relevant to the IA. Occupying the same spatial region is a fact space, whose axes are derived from the agent's layer ontology. Facts are defined as vectors in this second space: that is, they are entities fixed with respect to the fact axes. However, since the fact space and deduction space overlap, these fact vectors also occupy a location with respect to the base noun axes. It is this location which we use to make deductive inferences based upon fact vectors. Thus, in the Figure, the fact that the observed fact vector (arrow) is close to one of the deductions (dots) may allow for assertion of that deduction with a particular certainty value (a function of exactly how close the vector is to the deduction point). Note that, since the axes of the fact space are independent of the axes of the deductive space, it is possible for the former to vary (shift, rotate and/or translate, perhaps independently) with respect to the latter. If such a variation occurs, fact vectors (fixed with regard to the fact axes) will have different end-points in deduction-space. Therefore, after such a relative change in axes, a different set of deductions may be inferred with different confidence ratings. This mechanism of semantic relativity may potentially be a powerful tool for performing deductive inferencing in a dynamically changing environment.

An interesting aspect of the preferred approach to vector-based deductive inference is that it is based fundamentally upon ontological concepts, which can in turn be expressed as English nouns. This has the effect that the deductions made by an agent will resemble simple sentences in a very small dialect of pseudo-English. This language may be a useful medium for a human to interact with the agent in a relatively natural fashion.

While the inferencing strategy described above has some unorthodox elements in its approach to time-varying probabilistic reasoning for security applications, there are more conventional methods that may be used within Shapes Vector IA's in the instance that the method falls short of its expected deductive potential. Frame based systems offer one well understood (although inherently limited) alternative paradigm. Indeed, it is expected that some IA's will be frame based in any case (obtained off the shelf and equipped with ontology to permit knowledge transfer with the knowledge base).

As described above, the vector-based deductive engine is able to make weak assertions of a deduction with an associated certainty value (based on distances in n-Dimensional space). This value can be interpreted in a variety of ways to achieve different flavours of deductive logic. For example, the certainty value could potentially be interpreted as a probability of the assertion holding true, derived from a consideration of the current context and encoded world knowledge. Such an interpretation delivers a true probabilistic reasoning system. Alternatively, we could potentially consider a more rudimentary interpretation wherein we consider assertions with a certainty above a particular threshold (e.g. 0.5) to be "possible" within a given context. Under these circumstances, our system would deliver a possiblistic form of reasoning. Numerous other interpretations are also possible.

3.4 Inferencing for Computer Security Applications

As presented, our IA architecture is appropriate to knowledge processing in any number of domains. To place the work into the particular context, for which it is primarily intended, we will now consider a simple computer security application of this architecture.

One common, but often difficult, task facing those charged with securing a computer network is detecting access of network assets which appears authorised (e.g., the user has the proper passwords etc) but is actually malicious. Such access incorporates the so-called "insider threat" (i.e., an authorised user misusing their privileges) as well as the situation where confidentiality of the identification system has been compromised (e.g., passwords have been stolen). Typically, Intrusion Detection Systems are not good at detecting such security breaches, as they are purely based on observing signatures relating to improper use or traffic.

Shapes Vector's comprehensive inferencing systems allow it to deduce a detailed semantic model of the network under consideration. This model coupled with a user's inductive reasoning skills, permits detection of such misuse even in the absence of any prior-known "signature".

This application of Shapes Vector involves constructing a Gestalt of Intelligent Agents that are capable of reasoning about relatively low-level facts derived from the network. Typically these facts would be in the form of observations of traffic flow on the network. Working collaboratively, the agents deduce the existence of computers on the network and their intercommunication. Other agents also deduce attributes of the computers and details of their internal physical and logical states. This information serves two purposes: one is to build up a knowledge base concerning the network, and another is to facilitate the visualisation of the network. This latter output from the agents is used to construct a near real-time 3D visualisation showing the computers and network interfaces known to exist and their interconnection. Overlaid onto this "map" is animation denoting the traffic observed by the agents, classified according to service type.

Observing such a Shapes Vector visualisation a user may note some visual aspect that they consider being atypical. For example, the user may note a stream of telnet packets (which itself might be quite normal) traversing the network between the primary network server and node which the visualisation shows as only a network interface. The implications of such an observation are that a node on the network is generating a considerable body of data, but this data is formatted such that none of the Shapes Vector agents can deduce anything meaningful about the computer issuing the traffic (thus no computer shape is visualised, just a bare network interface).

The human user may consider this situation anomalous: given their experience of the network, most high volume traffic emitters are identified quickly by one or more of the various IAs. While the telnet session is legitimate, in as much as the proper passwords have been provided, the situation bears further investigation.

To probe deeper, the User Avatar component of Shapes Vector, described more fully in Section 8 in Part 2 of the specification, can be used to directly query the detailed knowledge base the agents have built up behind to the (less-detailed) visualisation. The interaction in this situation might be as follows:

human> answer what User is-logged-into Computer "MainServer"?

gestalt> Relationship is-logged-into [User Boris, Computer MainServer]

This reveals a user name for the individual currently logged into the server. A further interaction might be:

human> find all User where id="Boris"?

gestalt> Entity User (id=Boris, name="Boris Wolfgang", type="guest user")

An agent has deduced at some stage of knowledge processing that the user called Boris is logged in using a guest user account. The Shapes Vector user would be aware that this is also suspicious, perhaps eliciting a further question:

human> answer what is-owned-by User Boris"?

--- gestalt> Relationship is-owned-by [File passwords, User Boris]
Relationship is-owned-by [Process keylogger, User Boris]
Relationship is-owned-by [Process passwordCracker, User Boris]

---

The facts have, again, been deduced by one or more of the IA's during their processing of the original network facts. The human user, again using their own knowledge and inductive faculties, would become more suspicious. Their level of suspicion might be such that they take action to terminate Boris' connection to the main server.

In addition to this, the user could ask a range of possiblistic and probabilistic questions about the state of the network, invoking faculties in the agent Gestalt for more speculative reasoning.

3.4 Other Applications

The IA architecture disclosed herein lends itself to other applications. For example, it is not uncommon for the Defence community to have many databases in just as many formats. It is very difficult for analysts to peruse these databases in order to gain useful insight. There has been much effort aimed at considering how particular databases may be structured in order for analysts to achieve their objectives. The problem has proved to be difficult. One of the major hurdles is that extracting the analysts' needs and codifying them to structure the data leads to different requirements not only between analysts, but also different requirements depending on their current focus. One of the consequences is that in order to structure the data correctly, it must be context sensitive, which a relational database is not equipped to handle.

Shapes Vector can overcome many of the extant difficulties by permitting knowledge and deduction rules to be installed into an IA. This IA, equipped with a flexible user interface and strictly defined query language, can then parse the data in a database in order to arrive at a conclusion. The knowledge rules and analyst-centric processing are encoded in the IA, not in the structure of the database itself, which can thus remain context free. The Shapes Vector system allows incremental adjustment of the IA without having to re-format and restructure a database through enhancement of the IA, or through an additional IA with relevant domain knowledge. Either the IA makes the conclusion, or it can provide an analyst with a powerful tool to arrive at low level deductions that can be used to arrive at the desired conclusion.

4. Rules for Constructing an Agent

In Section 2 of this part of the specification, several rules governing agents were mentioned, e.g. no intra level communication and each agent must be context free within its domain of discourse. Nevertheless, there are still a number of issues, which need clarification to see how an agent can be constructed, and some of the resultant implications.

In a preferred arrangement the three fundamental rules that govern the construction of an agent are:

1. All agents within themselves must be context free;

2. If a context sensitive rule or deduction becomes apparent, then the agent must be split into two or more agents;

3. No agent can communicate with its peers in the same level. If an agent's deduction requires input from a peer, then the agent must be promoted to a higher level, or a higher level agent constructed which utilises the agent and the necessary peer(s).

In our current implementation of Shapes Vector, agents communicate with other entities via the traditional UNIX sockets mechanism as an instantiation of a component control interface. The agent architecture does not preclude the use of third party agents or systems. The typical approach to dealing with third party systems is to provide a "wrapper" which permits communication between the system and Shapes Vector. This wrapper needs to be placed carefully within the agent hierarchy so that interaction with the third party system is meaningful in terms of the Shapes Vector ontologies, as well as permitting the wrapper to act as a bridge between the third party system and other Shapes Vector agents. The wrapper appears as just another SV agent.

One of the main implications of the wrapper system is that it may not be possible to gain access to all of the features of a third party system. If the knowledge cannot be carried by the ontologies accessible to the wrapper, then the knowledge elements cannot be transported throughout the system. There are several responses to such cases:

1. The wrapper may be placed at the wrong level.

2. The Ontology may be deficient and in need of revision.

3. The feature of the third party system may be irrelevant and therefore no adjustments are required.

5. Agents and Time

In this section we discuss the relationship between the operation of agents and time. The two main areas disclosed are how the logic based implementation of agents can handle data streams without resorting to an embedded, sophisticated temporal logic, and the notion of synthetic time in order to permit simulation, and analysis of data from multiple time periods.

5.1 Data Streams and IA's

One of the fundamental problems facing the use of IA's in the Shapes Vector system is the changing status of propositions. More precisely, under temporal shifts, all "facts" are predicates rather than propositions. This issue is further complicated when we consider that typical implementations of an IA do not handle temporal data streams.

We address this problem by providing each IA with a "time aperture" over which it is currently processing. A user or a higher level agent can set the value of this aperture. Any output from an IA is only relevant to its time aperture setting (FIG. 10). The aperture mechanism allows the avoidance of issues such as contradictions in facts over time, as well providing a finite data set in what is really a data stream. In fact, the mechanism being implemented in our system permits multiple, non-intersecting apertures to be defined for data input.

With time apertures, we can "stutter" or "sweep" along the temporal domain in order to analyse long streams of data. Clearly, there are a number of issues, which still must be addressed. Chief amongst these is the fact that an aperture may be set which does not, or rather partially, covers the data set whereby a critical deduction must be made. Accordingly, strategies such as aperture change and multiple apertures along the temporal domain must be implemented in order to raise confidence that the relevant data is input in order to arrive at the relevant deduction.

While we are aware that we can implement apertures in order to supply us with useful deductions for a number of circumstances, it is still an open question on how to achieve an optimal set of sweep strategies for a very broad class of deductions where confidence is high that we obtain what we are scanning for. One area, which comes to mind, is the natural "tension" between desired aperture settings. For example, an aperture setting of 180 degrees (ie., the whole fact space) is desirable as this considers all data possible in the stream from the beginning of the epoch of capture to the end of time, or rather the last data captured. However, this setting is impractical from an implementation point of view, as well as introducing potential contradictions in the deductive process. On the other hand, a very small aperture is desirable in that implementation is easy along with fast processing, but can result in critical packets not being included in the processing scan.

Initial test of an agent, which understands portions of the HTTP protocol, has yielded anecdotal evidence that there may be optimum aperture settings for specific domains of discourse. HTTP protocol data from a large (5 GB) corpus were analysed for a large network. It was shown that an aperture setting of 64 packets produced the largest set of deductions for the smallest aperture setting while avoiding the introduction of contradictions.

The optimal aperture setting is of course affected by the data input, as well as the domain of discourse. However, if we determine that our corpus is representative of expected traffic, then default optimal aperture setting is possible for an agent. This aperture setting need only then be adjusted as required in the presence of contradicting deductions or for special processing purposes.

5.2 Temporal Event Mapping for Agents

In the previous section, we discussed how an agent could have time apertures in order to process data streams. The issue of time is quite important, especially when considering that it takes a finite amount of time for a set of agents to arrive at a deduction and present a visualisation. Also, a user may wish to replay events at different speeds in order to see security relevant patterns. To provide such facilities in Shapes Vector, we introduce the notion of a synthetic clock. All entities in the system get their current time from the synthetic clock rather than the real system clock. A synthetic clock can be set arbitrarily to any of the current or past time, and its rate of change can also be specified.

A synthetic clock allows a user to run the system at different speeds and set its notion of time for analysing data. The synthetic clock also permits a variety of simulations to be performed under a number of semantic assumptions (see Section 7 of this part of the specification)

The above is all very well, but Shapes Vector may at the same time be utilised for current real-time network monitoring as well as running a simulation. In addition, the user may be interested in correlating past analysis conditions with current events and vice versa. For example, given a hypothesis from an ongoing analysis, the user may wish to specify that if a set of events occur in specific real-time windows based on past event temporal attributes or as part of an ongoing simulation, then an alarm should be given and the results or specific attributes can flow bi-directionally between the past event analysis and the current event condition. Hence Shapes Vector should be able to supply multiple synthetic clocks and the agent instances running according to each clock must be distinguishable from each other. All synthetic clocks are contained in the Tardis that is discussed in detail in Part 5 of this specification.

6. Implications for Higher Level Agents

The criterion that all agents must be context free is in fact, not fully achievable. There are a number of influencing factors, but chief amongst these is time. An agent judged to be context free one year, may not be context free later in its lifecycle, despite no change to its content. For example, consider a simple agent responsible for analysing the headers of web traffic (HTTP) to determine which requests went via a proxy server. At the time such an agent is written it may be context free (or more precisely it's context is the universally accepted rules of HTTP transactions). However, future changes to the HTTP protocol or to the common practices used by web browsers or servers may cause it to become context sensitive despite no changes to the agent itself. That is, all deductions produced by the agent become true, only in the context of "how HTTP worked at the time the agent was written".

The above tends to encourage all agents to hold only one simple or "atom" deduction. This then ensures context freedom over a very long period of time. However, there are at least a couple of practical difficulties to such an approach:

1. A definition of what constitutes an atom deduction that is valid for all of the architecture must be determined;

2. A very sophisticated criterion for placement of agents within the agent hierarchy is needed to the extent that a complete metalogic of semantics right across the agent architecture would be needed (practically impossible).

7. Higher Level Ontologies

Detail of how the ontologies contribute to the functioning of the Agent architecture is disclosed in this section. In particular, there is focus on the ontologies above level 1, and provision of a brief discourse of the two lowest levels.

7.1 Level 2

In developing the level 2 ontology, it became apparent that attempting the same approach as for level 1 would not work. Level 1 focuses very much on "concrete" objects (e.g. modems, computer) and deterministic concrete relationships (e.g. connection) in the form of a traditional first order logic. Adopting a similar approach for level 2 proved difficult in the light of the desirable criteria for higher level ontologies, namely that they should:

- Seek to embody a higher level of abstraction (relative to the previous, lower, level ontologies).
- Seek description in terms of "atomic" relationships for each abstraction level, from which more complex relationships can be built.
- Offer opportunities for fusion activities, which cannot be handled at, lower layers (since they would be context sensitive).

Given the above criteria, the identification of a set of orthogonal, higher-level object types or classes on which to base a context-free level 2 ontology was problematic. A more promising constructive methodology for level 2 was to focus less on objects in and of themselves (as the level 1 ontology had done) and instead to identify a set of fundamental operations and relationships. That is, to move towards a description in terms of higher-level logics.

The chosen approach for constructing the level 2 ontology was to consider the types of knowledge-based relations and operators an agent operating at level 2 would require to support Shapes Vector's security mission. Such agents would necessarily need to conduct semantic manipulations of basic objects and concepts embodied in level 1. Operators that remain generic (like those in level 1) were preferred over security-specific semantics. The key operators and relations present within the ontology are:

7.1.1 Relationships

These relationships may appear in both ontological statements (assertions) and also as clauses in ontological queries.

- Simple Set Theoretic Operators. A suite of common set-based relationships are incorporated, including set membership (Member_of), set disjunction (Intersection_of), set conjunction (Union_of), and Cartesian_product_of. These relationships provide the traditional basis for constructing more complex semantic relationships. Using such relationships we can, for example, express that computer "dialup.foo.net.au" is a member of the set of computers that have sent suspicious mail messages to server "www.bar.com" in the past day.
- Consistency Operators: Consistent_with, Inconsistent_with. The use of these relationships takes the form "X consistent_with Y" or "X inconsistent_with Y". Since we are at a higher level, it is clear that contradictions will become apparent which are either invisible to the lower level agents, or as a result of their aperture settings, caused by a temporal context sensitivity. For example, we can use the operator to express the fact that a conclusion made by an e-mail agent that an e-mail originated at "nospam.com" is inconsistent with another observation made by a different agent that web traffic from the same machine reports its name as "dialup.foo.net.au".

It is important to distinguish between this relationship and the traditional logical implies. We cannot construct a practical implementation of implies in our system. There are several well-known difficulties such as an implementation of a safe form of the "not" operator. Hence we have avoided the issue by providing a more restricted operator with a specific semantic which nevertheless serves our purposes for a class of problems.

- Based_on. The above Consistent_with and Inconsistent_with relationships are not sufficient for expressing practical semantics of consistency in Shapes Vector. Given the broad ranging domains of lower level agents, these relationships beg the question "consistent (or inconsistent) under what basis?". Hence the Based_on clause which is used in the following manner "X Consistent_with Y Based_on Z". The rules of such a logic may be derived from human expert knowledge, or may be automatically generated by a computational technique able to draw consistency relationships from a corpus of data. Here, Z represents consistency logic relevant to the particular context. An implication is that a simple form of type matching is advisable in order to prevent useless consistency logics being applied to elements being matched for consistency. The type matching can be constructed by utilising the set theory operators.
- Predicated Existential Operator: Is_Sufficient_for. This relationship takes the form "X is_sufficient_for Y" and encapsulates the semantics that Y would be true if X could be established. That is, it is used to introduce a conditional assertion of X predicated on Y. This facility could be used, for example, to report that it would be conclusively shown that computer "dialup.foo.net.au" was a web server IF it were observed that "dialup.foo.net.au" had sent HTML traffic on port 80.
- Possiblistic Existential Operator: Possible (X). This relationship serves to denote that the fact contained within its parentheses has been deemed to be a definite possibility.

That is, the generator of the statement has stated that while it may not be able to conclusively deduce the existence of the fact, it has been able to identify it as a possibility. This relationship is necessary in order to be able to handle negation and the various forms of possibility. Further discussion appears below. Any fact expressible in the level 1 or level 2 ontology may be placed within a Possible statement. The most typical use of this operator would be in a response to a possiblistic query (see below). Note that the possibility relation does not appear as an operator in a query.

7.1.2 Interrogative Operators

The above relationships (except for Possible) also appear as operators in queries made to the Agent Gestalt at level two. However, there are a number of operators, which do not have a corresponding relation in the ontology. These are now discussed:

- the usual boolean operators which can also be expressed in terms of set theory are supplied.
- asserting (Y). This unary operator allows us to ask whether the proposition X is true if we assume Y is a given (ie. whether X can be established through the temporary injection of fact Y into the universe). Y may or may not be relevant in deciding the truth of X hence the operator is in stark contrast to the Is_Sufficient_For relation where the truth of Y directly implies the truth of X. There are some interesting complexities to implementing the asserting operator in a Prolog environment. The assertion must take place in a manner such that it can override a contrary fact. For most implementations, this means ensuring that it is at the head of any identical clauses. One of the implementation methods is to first work out whether Y is true in the first place and if not, place in a term with a different arity and direct the query to the new term in order to bypass the other search paths.

Is_it_possible. This operator allows for possiblistic queries. It takes the form "Is_it_possible X" where X may be any level 1 or level 2 ontological construct. Specifically, ontological relationships may be used, e.g., "Is_it_possible X [relationship (e.g. Member_of)] Y". Is_it_possible can be used in conjunction with the asserting operator (e.g. Is_it$_{13}$ possible X [operator] Y asserting Z) to perform a possiblistic query where one or more facts are temporarily injected into the universe. Using this operator we can, for example, issue a query asking whether it is possible that computer "dialup.foobar.net.au" is a web server. Furthermore we could ask whether based on an assumption that computer "dialup.foo.net.au" is connected via a modem, the computer makes use of a web proxy. Is_it_possible provides a means for returning results from predicates as ground facts rather than insisting that all queries resolve to an evaluated proposition (see Section 3.2 of this part). The evaluation result of a query of this nature will return either no, or maybe. The maybe result occurs if it is possible or there is no condition found which bars the condition, or no if a condition can be found in the universe preventing its possibility.

Is_it_definitely_possible. This operator is not orthogonal to the previous one. The evaluation result is either yes, or no. The difference between this operator and the previous one is that for it to return true, there must be a set of conditions in the universe which permit the result to be true, and the relation possibility exists.

Under_what_circumstances. This operator provides for a reverse style of possiblistic querying in which a target fact is given and the queried entity is called upon to provide the list of all conditions that would need to hold true for that fact to be established. For example we can ask under what conditions would it be conclusively true that a guest user had remotely logged into the computer "dialup.foobar.net.au".

Not is one of the more interesting operators. There has been much discussion over the years on how to implement the equivalent of logical negation. The problems in doing so are classic and no general solution is disclosed. Rather, three strategies are generated that provide an implementation approach, which satisfies our requirement for a logical negation operator. For the Shapes Vector system, any Not operator is transferred into a possiblistic query utilising negation as failure. Not (x) is transformed to the negation of Is_it_possible (X). This is where negation operation maps 'no' to 'yes', and maps 'maybe' to 'maybe'. Doing so requires us to have the user make an interpretation of the result based on fixed criteria. However, it is claimed that such an interpretation is simple. For example: a user may inquire as to whether it is "not true that X is connected to Y". This would be transformed into a query as to whether it was possible that X is connected to Y and the result of that second query negated. If the system determined that it might be possible that X is connected to Y, the final response would be that it might be possible that it is "not true that X is connected to Y." Alternatively, if it could be established that the connection was not possible, the final response would be yes it is "not true that X is connected to Y."

The above possibility operators cause some interesting implementation issues. It needs to be possible to detect the reason why a query fails, ie. did it fail due to a condition contradicting success (hard fail), or that simply all goals are exhausted in trying to find a match (soft fail). As a partial solution to this issue, we must add to the criteria for constructing an agent. A further criterion is that an agent's clauses are constructed in two sets: case for the positive, and case for the negative. We attempt to state explicitly the negative aspects. These negative clauses, if unified, cause a hard fail to be registered. It is fairly simple to deduce here that we cannot guarantee completeness of an agent across its domain of discourse. However, a soft fail interpretation due to incompleteness of the part of the agent remains semantically consistent with the logic and the response to the user.

7.2 Level 3 and Above

As can be seen, the main characteristics of level 2 when compared to level 1 are the inclusion of possibilistic reasoning and the introduction of the ability to define semantics for consistency. If we carry this abstraction path (ie. first order logic to possibilistic logic) one step further we can surmise that the next fundamental step should be an ontology which deals with probabilistic logic. For example, semantics to support operators such as "likely".

Initial operators designated for level three include "is it likely" which has a set of qualifiers in order to define what "likely" means. Interpretation based on specific user profiles will be needed hence user Avatars (see next section in this portion of the specification) are present in order to help interpret abstract user queries into precise, complex ontology. It is suggested that any levels beyond this become much more mission specific and will begin to include security specific relationships.

In actual fact, the labelled levels "2" and "3" may not be actually be located consecutively at the second and third layers of the agent hierarchy. Due to the need for avoiding context sensitivity within a level when introducing new agents, there will always be a need to introduce intermediate levels in order to cater for fusers in a way that does not necessitate the expansion of the adjacent levels' ontologies. Hence we refer here to the labels "level 2" and "level 3" as ontological delineators. Indeed, current expectations are that the possibilistic reasoning parts of an ontology will be introduced around level six due to fusing agents which are to be introduced for Shapes Vector's security mission.

7.3 An Example of Possiblistic Querying

Consider a simple IA/fuser designed to accept input from two knowledge sources—one describing network hosts and the ports they listen on, and another describing local file system accesses on a network host. By fusing such inputs, the agent deduces situations where security has been compromised.

Such an agent may contain the following rules (specified here in pseudo-English): In reality, the deductive rules within such an agent would be considerably more complex and would involve many additional factors. The rules are simplified here for illustrative purposes.

1. If a process Y listens on port P AND P is NOT a recognised port<1024 THEN Y is a "non-system daemon".

2. If a process Y is a non-system daemon AND Y wrote to system file F THEN Y "corrupted" F.

Consider the situation where, in analysing the data for a time window, the agent receives the following input:

Process 1234 listens on port 21
Process 3257 has written to !etc/passwd
Process 1234 has written to /etc!passwd
Process 3257 listens on port 31337

Process 987 listens on port 1022
Port 21 is a recognised port
The following possiblistic queries may be issued to the agent:

Is it Possible Process 1234 corrupted /etc/passwd?

In this case, the agent would generate a Hard Fail (i.e. a "definite no") since a contradiction is encountered. The relationship "corrupted" can only be true if Rule 1 has classified Process 1234 as a "non-system daemon", but that can only happen if Port 21 is not "recognised". This last fact is explicitly contradicted by the available facts.

Is_it_possible Process 987 corrupted /etc/passwd?

In this case, the agent would generate a Soft Fail (i.e., a "maybe") since, while no contradiction is present, neither is there sufficient evidence to conclusively show Process 987 has corrupted /etc/passwd. Rule 1 can classify Process 987 as a non-system daemon, but there are no observations showing that Process 987 wrote to /etc/passwd (which does not, in itself mean that it did not, given the agent's inherently incomplete view of the world).

Under_what_circumstances could Process 987 have corrupted /etc/passwd?

In this case the agent would respond with the fact "Process 987 has written to /etc/passwd", which is the missing fact required to show that the process corrupted /etc/passwd.

Is it Possible Process 3257 corrupted /etc/passwd?

Not only is it possible that Process 3257 could have corrupted the file, there is sufficient evidence to show that it definitely occurred. That is, under normal predicate logic the rules would deduce the "corrupted" relationship. However, since the Is_It_Possible operator replies either "no or "maybe", the agent in this case replies "maybe".

Can you Show that Process 3257 corrupted /etc/passwd?

This is a straight predicate (i.e., non-possiblistic) query. Since the facts support a successful resolution under the Rules 1 and 2, the agent replies "yes".

7.4 An Example of the Use of Consistency

In this section, we describe a simple example showing the utility of the consistency logic for a security application.

Consider the case of a simple consistency agent, which understands the basics of the TCP protocol, and in particular is aware of the traditional "three-way handshake" involved in the establishment of a TCP connection. This agent would be able to recognise valid handshakes and report the consistency of the packet sequences they comprise. Consider the following input to such an agent:

Packet L1 (type="TCP SYN")
Packet L2 (type="TCP SYN ACK")
L2 directly-follows L1
Packet L3 (Type="TCP ACK")
L3 directly-follows L2

For this input, the agent will recognise the validity of this handshake and be able to report consistency of the packet sequences by stating:

(L2 directly-follows L1) Consistent$_{13}$ with (L3 directly-follows L2) Based_on "TCP Handshake (Packet L1 (type=\"TCP SYN\"), Packet L2 (type=\"TCP SYN ACK\"), Packet L3 (Type=\"TCP ACK\"))"

Alternatively, the same agent could be presented with an invalid handshake as input, for example:

Packet X1 (type="TCP SYN")
Packet X2 (type="TCP SYN ACK")
X2 directly-follows X1
Packet X3 (Type="TCP RST")
X3 directly-follows X2

In this case the agent would recognise that it is invalid for a TCP implementation to complete two parts of the handshake and then spontaneously issue a Reset packet'0. It would represent this inconsistency by reporting:

(X2 directly-follows X1) Inconsistent_with (X3 directly-follows X2)
Based_on "TCP Handshake (Packet X1 (type=\"TCP SYN\"),
    Packet X2 (type=\"TCP SYN ACK\"),
    Packet X3 (Type=\"TCP RST\"))"

Such a statement of inconsistency may be directly interrogated by a user interested in anomalous traffic, or alternatively passed as input to a set of security-specific agents, which would correlate the observation with other input.

An interesting implementation issue arises when we consider the construction of consistency assertions. The number of assertions to describe consistency, e.g. for TCP/IP traffic, may be very large, or dependent on specified environments and it could be data driven. There is a surprisingly simple possibility for the automatic generation of consistency assertion sets. Very preliminary investigation has indicated that data mining methods on designated standard data corpus are very suited for generating assertion sets, which may then be used as the consistency logic. Data mining is extensively used in detecting variances in traffic, but has been less successful in detecting intrusions. However, data mining has shown to be very successful in characterising data, and thus is proving an exciting possibility for use in the Shapes Vector system for describing bases of consistency.

8. User Avatars

It is necessary to have an intelligent interface so that the user may interact with the agents as a Gestalt. Accordingly, a set of user avatars is constructed. These avatars preferably contain a level of intelligent processing as well as the usual query parsing as a result of in one example, commercial voice recognition packages. In order to maintain consistency, user avatars are apparent at all levels in the ontologies. This permits each avatar to be able to converse with the agents at its level, while still permitting control and communication methods with avatars above and below. Put simply, the same reasons for developing the agent hierarchy are applied to the avatar set. Given the nature of an avatar, it may be argued by some that there is little difference between an agent in Gestalt, and the avatar itself. Avatars and Gestalt agents are distinguished by the following characteristics:

Agents deal with other agents and Avatars.

Avatars deal with agents and users.

Avatars can translate user queries into precise ontology based on specific user driven adaptive processes to resolve context.

Further to the above, Avatars store user profiles in a manner so as to interpret different connotations based on specific user idiosyncrasies. For example, the use of the probabilistic logic based queries where the term likely can be weighted differently according to each user.

One of the activities expected of Avatars in the Shapes Vector system is to modify queries so that they may be made more precise before presentation to the Gestalt. For example, at a high layer of abstraction, a user may initiate the query "I have observed X and Y, am I being attacked?". An Avatar, given a user profile, may modify this query to "Given observations X, Y, based on Z, is it likely that a known attack path exists within this statistical profile".

9. Further Comments on the Architecture

The hierarchical layering of the architecture with interleaved ontologies provides a strong advantage to Shapes Vector. Each ontology provides a filtering process for the deductions and knowledge transfer between levels. This helps "stabilise" and reduce context sensitivity. It also permits a strong method for checking the validity of component construction. However, a price is paid: the filtering between layers implies that the potential of each agent to contribute to the Gestalt is constrained. A particular agent may be able to undertake a variety of relevant deductions but these may be "strained" or "filtered" as the agent passes its knowledge through an ontology layer. Hence the theoretical full potential of the Gestalt is never actually realisable.

In order to overcome the above constraint in a sensible, practical and useful manner, it is necessary to review continuously the ontology layers in the search for bringing new relationships and objects into "first class" status so that it may become part of the ontology itself. That is, lessen the filtering process in a controlled manner. To do so however, requires much thought since an incorrect change in an ontology level can wreak havoc with the Gestalt operation. Of course it is possible to pass richer knowledge statements by using attributes through the ontology layers. However, it becomes the user's responsibility to ensure that the receiving agents can make sense of the additional attributes.

10.1 AAFID

Researchers at Purdue University have designed and implemented an agent-based architecture for Intrusion Detection, called AAFID (Autonomous Agents for Intrusion Detection) [Spafford, E and Zanboni, D., "*Intrusion detection using Autonomous Agents*", Journal of computer Networks, v34, pages 547-570, 2000]. This architecture is based around a fundamental paradigm of distributed computation. One or more software agents run on each protected host of a network, communicating any events of interest to a single "Transceiver" running on the host. This component can perform some host-level fusion of alerts, but principally exists to forward significant observations to a "Monitor" process, which has an even broader purview.

This architecture at first appears to have similarities to the approach described herein, in that it supports multiple autonomous entities (each with a particular field of expertise) arranged in a distributed structure with hierarchy-based filtering. The AAFID system, however, does not appear to have a concept of multiple abstraction layers—all agents, transceivers and monitors all reason within a single universe of discourse which, apparently, contains both low-level and fairly high-level concepts.

Furthermore, the operation of these various entities seems to focus purely on a data driven model; there is no obvious scope for users to set goals for components, nor to directly query the internal knowledge state of the system. AAFID's hierarchical structuring of agents seems limited to a single rooted tree, as opposed to our system's support for generalised directed acyclic graph structures. There is also no obvious scope for possiblistic or probabilistic reasoning within the AAFID architecture coupled with orthogonal semantic ontology layers.

10.2 Comparison with the Bass' Comments

The following discussion providing some background to the invention is intended to facilitate a better understanding of the invention. However, it should be appreciated that the discussion is not an acknowledgment or admission that any of the material referred to was published, known or part of the common general knowledge as at the priority date of the application.

In an edition of the Communications of the ACM "Intrusion Detection Systems & Multisensor Fusion: Creating Cyberspace Situational Awareness", in Communications of the ACM 43(4), April 2000 Bass speculates on the future architecture requirements for Intrusion Detection Systems. In particular, he discusses the need for data abduction and points to the requirement for three main levels of semantic ascension.

Figure 13:
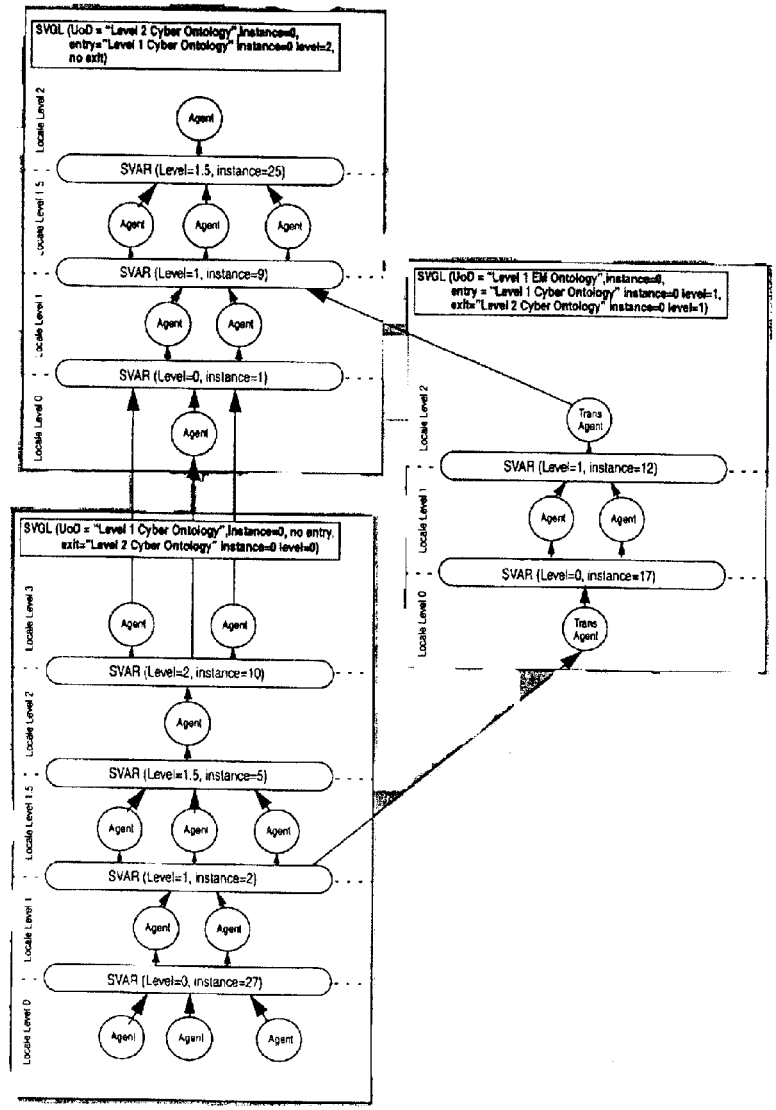
FIG. 13 shows a more comprehensive example of the FIG. 12 illustration.

The Shapes Vector architecture shows some necessary implementation strategies and architectural modifications in order to achieve that goal state. In particular Shapes Vector views the concept ascension requirement as a continuum where at any point in the AI agent Gestalt one "sees" knowledge production on looking "up", and data supply looking "down". The three main levels in the Shapes Vector Gestalt are delineated by the methods and logics used (ie. first order predicate, possiblistic and probabilistic), rather than some delineation as to whether there is information, data, or knowledge as depicted in FIG. 13. Bass requirements for a "discovery module etc" become less important in the Shapes Vector architecture as any such function is a pervasive part of the system and is distributed amongst more primitive functions. The Agent Gestalt feeds the visualisation engines rather than some specific event though earlier papers do tend to indicate a separate module and as such those papers are a little misleading.

11. A Multi-Abstractional Framework for Shapes Vector Agents

The Shapes Vector Knowledge Architecture (SVKA) is intended to provide a framework, in which large numbers of Intelligent Agents may work collaboratively, populating layers of a highly ordered "Gestalt". Previous definitions of the SVKA have focussed primarily on macro-aspects of the architecture, describing a system in which each layer of the Gestalt represents a distinct universe of discourse as described by the ontology associated with it.

Experience with building collaborative Intelligent Agent systems for Shapes Vector has highlighted the desirability of a more flexible model, one that allows for the subdivision of these "ontology layers" into a number of sub-layers. Each sub-layer in such a divided model shares a common universe of discourse (i.e., all reference a common ontology). Intelligent Agents can populate any of these various sub-layers, allowing for the construction of systems capable of very general forms of data fusion and co-ordination.

Furthermore, it is envisaged that future requirements on the SVKA will involve the necessity of maintaining several "parallel universes of discourse" (e.g., running a sub-Gestalt in the domain of Security in parallel with another sub-Gestalt in the domain of EM Security). Such parallel universes may have entry and exit points into one another (at which appropriate translations take place). They may furthermore share similar abstractional levels, or may even overlap the abstractional levels of multiple other universes.

In order to satisfy these two demands, the SVKA definition requires elaboration. In this paper we undertake a redefinition of the architecture which expands it in a number of ways to meet these requirements. Key features are:

- The SVKA Gestalt is divided into an arbitrary number of Locales,
- A Universe of Discourse and an Instance Number identify each Locale,
- Each Locale contains a number of levels at which Intelligent Agents may reside.
- A Locale may optionally nominate a single entry point: a remote locale and a level within that locale, from which input data is received into the locale, A Locale may optionally nominate a single exit point: a remote locale and a level within that locale, to which output data is sent from the locale, 11.1 Concepts The Shapes Vector Knowledge Architecture (SVKA) contains exactly one Shapes Vector Gestalt Framework (SVGF) or "Gestalt". The Gestalt is an abstract entity in which groups of collaborating software agents may be placed.

The Shapes Vector Gestalt Framework contains an arbitrary number of Shapes Vector Gestalt Locales (SVGLs) or "Locales". A Locale is an abstract entity in which hierarchies of collaborating software agents may be placed. The defining characteristic of a Locale is that it is intimately tied to exactly one Universe of Discourse (UoD). For each UoD there may be multiple Locales simultaneously active, thus to distinguish these we also tag each Locale with an instance ID. This is unique only within the context of all Locales tied to the same UoD. For example there can exist a Locale with UoD "Level 1 Cyber Ontology", instance 0 simultaneous with a Locale with UoD "Level 2 Cyber Ontology", instance 0. However two Locales with UoD "Level 1 Cyber Ontology" and instance 0 cannot co-exist.

Each Shapes Vector Gestalt Locale is divided into an arbitrary number of Shapes Vector Gestalt Locale Levels (SVGLLs) or "Levels". A Level is an abstract entity in which a non-cooperating set of agents may be placed. Each Level has a unique Level Number within the Locale (a zero or positive real number); Levels are notionally ordered into a sequence by their Level Numbers.

In addition to a UoD and instance ID, each Locale also optionally possesses two additional attributes: an entry point and an exit point. Each refers to a Level of a remote Locale, that is each reference contains the UoD and instance number of a Locale not equal to this Locale, and also nominates a particular (existent) Layer within that Locale. The entry point of a Locale defines a source of data, which may be consumed by the agents at the lowest Level of this Locale. The exit point of a Locale defines a destination to which data generated by agents in the highest Level of this Locale may be sent.

It is specifically forbidden for Locales within the Gestalt to be at any time directly or indirectly arranged in a cycle via their entry and/or exit points. That is, it must be impossible to draw a path from any point in any Locale back to that same point utilising entries and exits between Locales.

A Shapes Vector Gestalt Locale, which is divided into n Levels, contains n−1 Shapes Vector Assertion Routers (SVARs) or "Assertion Routers". An Assertion Router is a concrete software entity which receives input from one set of agents, performs some semantic-based filtering, then forwards the relevant sub-sections on to each of a set of agents in a second (disjoint) set. Each Assertion Router has an associated Level Number unique within the Locale (a zero or positive real number); Assertion outers are notionally ordered into a sequence by their Level Numbers. Furthermore, each Assertion Router has an Instance ID (a zero or positive integer) Furthermore, which is globally unique.

There is a one-to-one mapping between Locale Level Numbers and Assertion Router Level Numbers, defined by the following relationship. The Assertion Router with Level Number n receives input from agents positioned in Locale Level Number n and provides output to agents which are resident at the next Locale Level Number after n.

A Shapes Vector Intelligent Agent (SVIA) or "agent" is a concrete software entity which resides in exactly one Level of exactly one Locale within the Gestalt. Agents that reside above the lowest Level of the Locale may (optionally) receive input either from a direct source, or from the Assertion Router within the Locale which has the next lowest Level Number (or both). An agent that resides at the lowest Level of Locale may (optionally) receive input either from a direct source, or from the Assertion Router present in the entry point remote Locale (if one was specified) which has a Level Number equal to the Level defined in the entry point specification (or both).

Agents which reside below the highest Level of the Locale may (optionally) provide output to either a direct sink, or to the Assertion Router with Level may (optionally) provide output to either a direct sink, or to the Assertion equal to its own (or both). An Agent that resides at the highest Level of Router present in the exit point remote Locale (if one was specified) which has a Level Number equal to the Level defined in the exit point specification (or both).

An agent may never receive input from the same Assertion Router to which it provides output.

Figure 12:
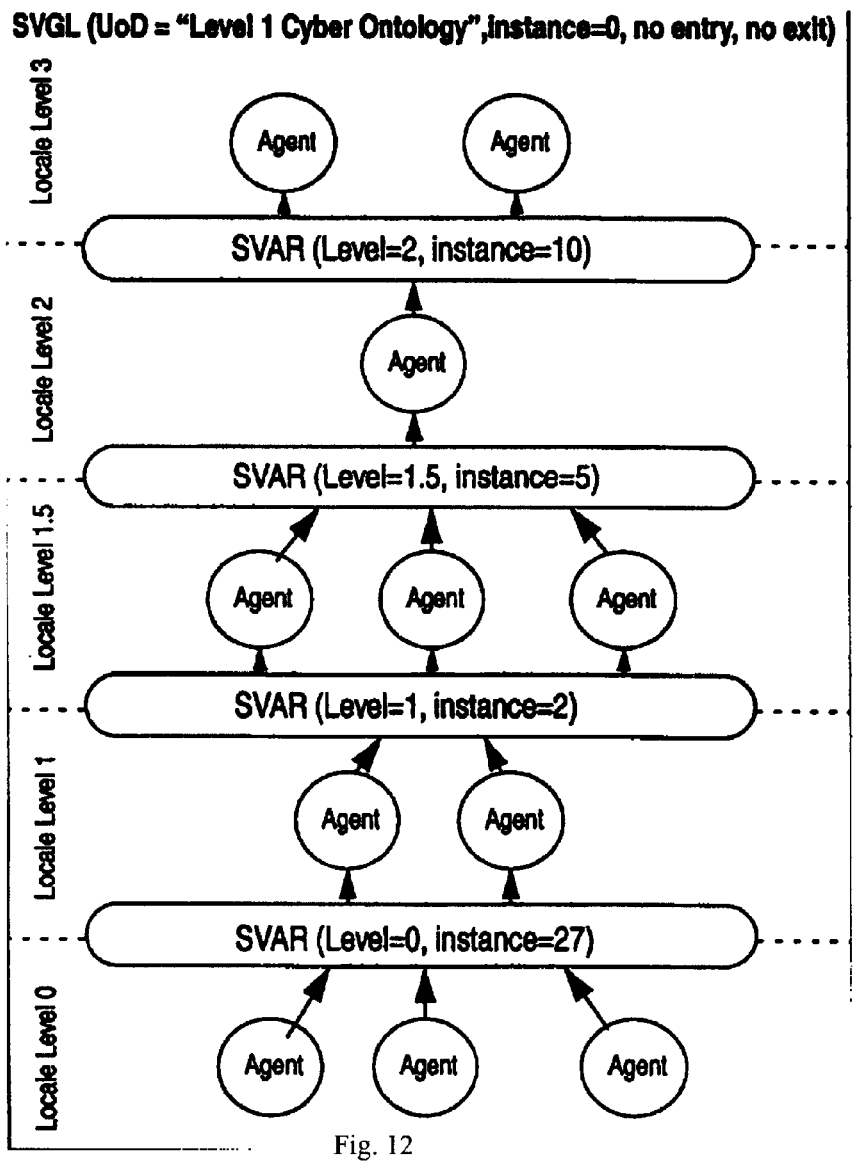
FIG. 12 illustrates concepts for a single Locale Gestalt of 4 Levels.

FIG. 12 illustrates these concepts for a single Locale Gestalt of 4 Levels, while FIG. 13 shows a more comprehensive example.

12. Summary

The knowledge-processing elements of the Shapes Vector system incorporate a broad variety of tools and techniques, some novel and some traditional, which combine to enact a flexible and powerful paradigm for multi-abstractional reasoning. The central feature of the approach disclosed herein is the methodology of bridging broad semantic gaps (in the embodiment described that is illustrated, from very simple observations about a computer network to high-level statements about the state of that network) by decomposition into a series of abstraction layers. This specification describes this layered architecture and also provides details about the forms of abstraction provided at the first three layers. These include epistemic logics for possiblistic reasoning (at level 2) and probabilistic reasoning (at level 3).

The key feature of the disclosed knowledge architecture that avoids difficulties of context sensitivity and ambiguity is its simple set of structuring rules. These provide strict guidelines for placement of agents within abstractional layers and limit the patterns of communication between agents (preferably prohibiting intra-level communication as well as insisting on passing through an ontology between layers).

Experience with building and using the Intelligent Agent Architecture it has shown it to be highly flexible, with the incorporation of "foreign" knowledge processing tools into the Shapes Vector Gestalt proving a "simple" exercise. The architecture has also shown itself to provide great potential for approaching knowledge-based deductive solutions to complex problems not only in the domain of computer security but also in many other domains, both related and unrelated.

The Intelligent Agent Architecture features specifically include:

1. An abstraction hierarchy with multiple layers separated by formal ontologies.
2. Three particular abstraction layers of interest are those concerned with first-order logic, possiblistic logic and probabilistic logic.
3. Agents located within a layer of the architecture are prohibited from interacting with agents within the same layer (ie. No peer-to-peer communication).
4. Agents located within a layer of the architecture may communicate with agents located in the layer immediately below that layer (if such exists) and/or agents located in the layer immediately above the layer (if such exists).
5. The architecture may incorporate a Knowledge Base in which persistent information resides.
6. Communication between agents must always be represented in terms of the ontology sandwiched between the sender and receiver's layer. Communications must be context-free with respect to that ontology.
7. Agents within the architecture may operate across a time-window, ie, a temporal region of current consideration. A user may dynamically alter parameters of an agent's time-window.
8. Third party knowledge processing tools (agents) may be easily wrapped and inserted into the architecture. The ontologies present within the framework ensure that only relevant knowledge transfer takes place between such elements and other agents.

Part 3 Data View Specification

1. Data View Specification

Data View is briefly discussed in Part 1 Section 3.3 of the Shapes Vector Overview, in this specification. The following is a preferred specification of its characteristics.

1.1 Universe a universe has a variable maximum radius and contains any number of virtual objects.

there may be multiple universes.

the number of universes can be dynamically adjusted using append, insert, and delete operations specified via the user (human or appropriately programmed computer).

universes are identified by unique names, which can be either auto generated—a simple alphabetic sequence of single characters, or can be specified by the user when appending or inserting universes dynamically.

to assist in simplifying the display, nominated universes can be temporarily hidden.

However all force calculations and position updates continue to occur. Hidden universes are simply temporarily ignored by the rendering phase of the application. A universe is then not human observable.

a universe can be represented as a two-dimensional plane (in the embodiment a circle), but it is subject to selective zoom and synthetic strobes in a similar fashion to Geo View which may provide a third dimension elevation.

there are at least two possible starting states for a universe:

the big bang state in which all objects are created in the centre of the universe;

the maximum entropy state in which all objects are evenly distributed around the maximum radius of the universe.

a universe maybe rendered with a circular grid, with identifying labels placed around the perimeter. The number of labels displayed equidistantly around the perimeter can be specified statically or dynamically meaning those labels can be fixed or move in concert with other changes.

multiple universes are rendered vertically displaced from each other. Inter-grid separation can be dynamically changeable via a control mechanism, such as a socket to be discussed later.

separation between grids can be specified either globally using inter-grid size or for specific grids as a distance from adjacent grids.

different universes can have different radii, and their grids can be drawn with different grid sizes and colours.

all initial settings for grid rendering are to be specified through the MasterTable.

These include grid size, inter-grid separation, grid colour, and grid (and hence universe) radius for each universe.

grid settings (radius, number of radii, number of rings, intergrid spacing) can be altered dynamically via the user.

object positions are clamped to constrain them within the universe radius.

As a result of this:

When an object located at the edge of the universe experiences a repulsive force that would place it outside the universe (forces between virtual objects will be discussed later in the specification), the object is constrained to stay within the universe so that the object slides along the rim of the universe away from the source of the repulsive force. Forces that tend to draw objects away from the rim towards the interior of the universe result in typically straight-line motion towards the source of attraction.

the user may specify which virtual objects or sets of virtual objects are in a particular universe using an object selector, and this may dynamically change using append or replace operations on existing specifications.

if a user replaces the specification of the destination universe for objects matching a particular object selector, then the objects will move from the universe they were originally placed in as a result of this specification to the new universe. Likewise if a user appends a new destination universe specification, then all objects in existence that match the associated object selector will appear in the new universe in addition to wherever they currently appear.

in all cases where objects are moved between or duplicated to universes, all force interactions, phantoms, interaction markers and radius of influence displays will be updated to reflect this fact.

Force interactions are updated so they only occur between objects in the same universe.

Phantoms are moved/duplicated along with the parent primary object.

Interaction markers are moved/duplicated to remain connected to the object.

Radius of influence displays are duplicated if necessary.

1.2 Objects an object has a set of attributes (consisting of name, value pairs) associated with it.

an object has a two sets of references to other objects with which it interacts, named its mass interaction set and charge interaction set. Events or other external mechanisms modify these two sets.

an object can have further sets of references to other objects. These sets have names specified at run-time by events and can be used to visualise further interactions with other objects using markers (see section 1.7 in this part of the specification).

an object can have further sets of references to other objects that are used in building aggregate objects—see section 1.3 of this part of the specification for details.

an object stores values for mass and charge for each flavour (a term explained later in the specification) it possesses.

an object may inhabit one or more universes, and this relationship can be displayed using markers.

1.3 Aggregate Objects objects can be aggregated to form a composite.

each aggregate object has one primary (the parent or container) object, and zero or more secondary objects (the children or containees).

aggregate objects cannot aggregate hierarchically.

determination of container—containee relationships occurs on the basis of "contains" and "contained-in" network object attributes. These relationships are stored in a database and are always kept up to date and consistent with the latest known information. This means any new information overrides pre-existing information. For example:

If an attribute indicates A contains B, then it must be ensured that all relationships where B is a container are removed from the database as they are no longer valid since B is now a containee. The same attribute A contains B also indicates that A can no longer be a child of another object, since it is now a container, and so all those relationships are removed from the database. Finally the relationships "A contains B" and "B is containee of A" are added to the database.

to avoid processing overheads, the actual relationships of objects in the display are not updated to reflect the state of the relationship database until an object is re-instantiated—usually by being moved/duplicated to another universe.

the aggregate object is treated as a single object for the purposes of force and velocity determination, interaction marker, radius of influence, and phantom displays (subject to the considerations set out below).

when a new object comes into existence in a universe (either as result of an event being received, or as result of dynamic adjusting of destination universe specifications), it can either become a primary in a new aggregate group, or enter the universe as a secondary in a pre-existing group depending on the containment/containee relationships in force at the time.

if a new object enters a universe as a primary in a newly created aggregate, it will attempt to determine which other objects in the universe should be adopted to become secondaries. The adoption occurs when another object (potential adoptee) is located that is a containee of the new object (according to the relationship database).

When the potential adoptee is a primary in an aggregate with secondaries, the secondaries are evicted before adopting the primary. The evicted secondaries are now inserted into the universe using the insertion policy in force, and they in turn determine potential adoptees and adopt where possible as described.

the summed masses and charges (section 1.5 in this part of the specification) of all objects within an aggregate are used for force/mass calculations.

each individual element in an aggregate maintains it's own mass, and masses of like flavour are summed when determining the mass of an aggregate.

an aggregate object maintains and decays a single total charge for each flavour.

When an object joins an aggregate its charges are added to the summed charges of like flavour for the aggregate. When an object leaves an aggregate no change is made to the summed charge as it cannot be known (because of charge decay) what proportion of the total charge is due to the object in question.

when an object receives additional charge as result of an event, the new charge is added to the total for the aggregate containing it.

if any object within an aggregate object displays a mass or charge radius of influence (see section 1.9 in this part of the specification), the mass/charge radius is displayed for the entire group, provided the group as an entity has a non-zero mass or charge of the flavour as specified by the radius of influence definition.

display of phantoms (section 1.7 in this part of the specification) of aggregate objects is driven only by the primary object. The phantoms appear as duplicates of the primary object and trail the primary object's position. If an object matches a phantoming specification, but it happens to be a secondary within an aggregate object then no action is taken.

if an object (A) within an aggregate is required to display interaction markers (see section 1.8 in this part of the specification), the interaction markers are drawn from the primary of the aggregate object containing A to the primary of the aggregate(s) containing the destination object(s).

In addition, when interaction markers are drawn in response to picking of an object, they are drawn from the primary of the aggregate containing the picked object to all duplicates in other universes of all destination objects that are in the relationship to the source object that is being visualised by the markers.

when interaction markers are drawn in response to the matching of an ObjectSelector, markers are drawn from all duplicates of the source aggregate object to all duplicates of the destination aggregate object(s).

when interaction markers are used to highlight duplicates of the same object in multiple universes, a single multi-vertex marker is displayed which starts at the duplicate appearing lowest in the stack of universes and connecting all duplicates in order going up the stack and ending at the highest appearing duplicate in the stack.

1.4 Object Selector

An object selector specifies a set of objects using set expressions involving set union (+), set difference (−), and set intersection (^) operators. The intersection operator has the highest precedence, difference and union have equal lower precedence. Parentheses can be used to change operator precedence. The set operations have the following operands:

all—set of all objects;

class(classname)—set of objects in a given class;

objects(predicate)—set of objects satisfying a predicate expressed in terms of boolean tests (using and, or, not) on attribute values (e.g. objects(ram >= 128000000 && type = sun)) and existence of attributes (e.g. objects (attributes(attributename, attributename, . . . )));. The "and" &&) and "or" (||) operators have equal high precedence. The "not" operator (!) has lower precedence. Parentheses can be used to change operator precedence Flavor(flavorname)—set of objects having all attributes in the given flavour's definition.

instance(objectid)—set containing object with given object id.

Object selectors are named when defined. This name is used as a shorthand means of referring to the object selector without having to repeat its definition, for example when defining an action on the basis of an object selector.

Object Selectors can be defined via a control port, or via a start-up setting, currently stored in the ApplicationSettings part of the MasterTable file.

1.5 Mass, Charge and Flavours

There exist different flavours of mass and charge.

A favour is defined by the user as a collection of five-tuples, each defining the flavour with respect to a particular class of objects. The tuple consists of flavour name, object class (or all), attributes expression-listing attributes which must exist, formula for mass and formula for charge. There may be multiple such tuples with the same flavour name, which together define a flavour for multiple classes of objects. The formulae are used to calculate the amount of mass or charge of the flavour, which the object possesses, and they are arithmetic expressions involving object attribute value terms. Note that it is a semantic error for the attributes expression not to include attributes which feature in the mass or charge formulae. For example:

```
Flavour {
    Strawberry,
    Computer,
    Attributes [runs ram data_rate_in data_rate_out],
    ram/1024,
    data_rate_in + data_rate_out;
}
```

If the result of evaluating a mass formula is less than a small positive number ($\epsilon$) then the value used for the mass in calculations should be $\epsilon$.

An object may have an amount of flavoured mass or charge if there is a corresponding definition of the flavour for the class of object and the object satisfies the attributes expression for that flavour.

Charge may be set to decay (at a particular rate) or accumulate (ie. a rate of zero) on a per flavour basis. The decay function can be set to one of a fixed set (exponential, linear and cosine) on a per flavour basis.

Mass and charge may each have a radius of influence specified on a per flavour basis. Objects that fall within the respective radii of an object may generate a force on the object as a result of their mass or charge respectively, and objects that lie outside this region have no influence on the object.

The radii of influence for objects may be graphically depicted at the user's discretion. Note that multiple radii may apply due to different radii for mass and charge and for different flavours of the same.

When an event arrives that affects one of the attributes listed in a flavour definition, then the object's mass and charge are to be recalculated using the arithmetic expressions specified in said flavour definition. The newly calculated mass will replace the existing mass, and the newly calculated charge will be added to the existing charge.

In addition there are special considerations relating to mass/charge/flavour and aggregate objects. See section 1.3 in this part of the specification regarding those.

1.6 Forces

There are two types of forces acting on objects in the universe, gravitational (as a result of the mass of an object) and electrostatic (as a result of the charge on an object).

The gravitational force is repulsive and the electrostatic force is attractive.

Forces are two-dimensional vectors and are additive.

The velocity of an object is proportional to the force acting on it divided by its mass (ie. acceleration is disregarded). Note that flavours need to be taken into account in this calculation.

There is a variable maximum velocity which applies to all objects in a universe.

Only masses and charges of the same flavour may produce a resultant force.

The velocity due to gravitational forces of an object is contributed by the gravitational forces which result from each of the objects in its mass interaction set (using the mass value for each relevant flavour) which are also within the radius of influence for mass. These forces are divided by the correspondingly flavoured mass of the object to arrive at velocities.

The velocity due to electrostatic forces of an object is contributed by the electrostatic forces which result from each of the objects in its charge interaction set (using the charge value for each relevant flavour) which are also within the radius of influence for charge. These forces are divided by the correspondingly flavoured mass of the object to arrive at velocities.

The net velocity of an object is the sum of the gravitational and electrostatic velocities for that object.

1.7 Phantoming

When selected, objects will be able to display a history of previous positions by displaying a 'phantom' at a number of previous locations.

Objects for which phantoms are drawn are selected using named Object Selectors.

Display Parameters for phantoming can be set in the ApplicationSettings part of the MasterTable or via a control socket, and are associated with a previously defined Object Selector.

Display parameters include the time spacing between phantoms, the display style (eg transparent or wire frame), and the number of phantoms to show.

Multiple Object Selectors and associated display parameters can be used to display any desired combination of phantoms.

In addition there are special considerations relating to phantoming and aggregate objects—see section 1.3 in this part of the specification for those.

1.8 Markers

Interaction markers may be used to highlight interaction between weakly interacting objects.

Interaction markers make use of named Object Selectors to determine which objects have interaction markers displayed.

Interaction markers may span multiple universes.

Display parameters for markers can be set in the ApplicationSettings part of the MasterTable or via the control socket, and are associated with an interaction type.

Display parameters for markers include line style, width and colour. Each interaction type is drawn with its own independently specified line style width, and colour.

Marker—the user intellectively picking an object on the display can optionally toggle the display.

Multiple Object Selectors and associated display parameters can be used to display any desired combination of markers.

In addition there are special considerations relating to interaction markers and aggregate objects—see section 1.3 in this part of the specification for those.

1.9 Radius of Influence Display

Radius of influence can be visualised for selected objects as transparent disks.

Objects for which radius of influence are displayed are selected using the Object Selector mechanism.

Display parameters include which flavour to display the radius for, whether the charge or mass radius is to be displayed, the colour of the displayed disk, and the transparency level of the displayed disk.

Display parameters can be set in the ApplicationSettings part of the MasterTable or via the control socket, and are associated with a previously defined Object Selector.

Multiple Object Selectors and associated radius of influence display parameters can be in use simultaneously to display any desired combination of radii.

In addition there are special considerations relating to radius of influence displays and aggregate objects—see section 1.3 in this part of the specification for those.

1.10 Pulses

A flavoured pulse of charge or mass may be applied at any location within a universe, and has influence over the entire universe. That is, a flavoured pulse is applied without regard to the mass and charge radii associated with its flavour.

1.11 Irregular Functions

A user may "shake" a universe at any particular moment, by either:

perturbing each object by a random amount (under a variable maximum)

;- randomly placing each object within the universe.

A user may reproduce the start state of a universe at any particular moment, as at least either the big bang or maximum entropy state.

Part 4 Geo View Specification

1. Introduction 1.1 Identification

This document relates to the GeoView Module for the Visuals Sub-system of Shapes Vector.

1.2 System Overview 1.2.1 General

Shapes Vector is a system, which in the embodiment used to illustrate its principles and features provides an analyst or system administrator with a dynamic real-time visualisation of a computer or telecommunications network. Shapes Vector is an advanced 3-D graphical modelling tool developed to present information about extended computer systems. Shapes Vector places users within a virtual world, enabling them to see, hear and feel the network objects within their part of this world. The objects may be computers, files, data movements or any other physical or conceptual object such as groups, connected to the system being navigated. Seeing an object with a particular representation denotes a class of object and its state of operation within its network.

Just as familiar objects make up our natural view of the physical world, so too a computer network is made up of physical objects, such as computers, printers and routers, and logical objects, such as files, directories and processes.

Shapes Vector models network objects as 3D shapes located within an infinite 3D universe. An object's visual attributes, such as colour, texture and shading, as well as its placement and interaction with other objects, provide the user with significant information about the way the real network is functioning.

1.2.2 Geo View Module Scope

GeoView, along with DataView, is one of the ways in which the user can view, and interact with, the data produced by the Agents Sub-system. Each of these views is defined by certain characteristics that allow it to provide a unique representation of the data. GeoView has an emphasis on the physical objects with a geographic perspective. This means it places a heavy importance on objects related to the physical rather than the logical world, and that these objects tend to be laid out in a traditional geographic manner.

While objects such as computers, printers and data links are of prime importance to GeoView, logical objects such as network traffic, computer processors, and user activity are also displayed because of the relationships between the physical and logical objects.

FIG. 1 shows the library dependency relationship between the GeoView module and other modules. The full relationship between the Sub-systems and between this module and other modules of this sub-system, is shown in the System/Sub-system Design Description.

1.3 Overview

This part of the specification provides a Detailed Design for the GeoView Module of the Visuals Sub-system (CSCI) of the Shapes Vector Project.

This module encompasses the following sub-components:

Layout Hierarchy

Layout Structure Template Library (LSTL)

The content of this part is based on the Data Item Description (DID) DI-IPSC81435, Software Design Description (SDD), from the US Military Standard MIL-STD-498 [1] using MIL-STD-498 Tailoring Guidebook [2] for the development project.

Detailed design information in this document is based on the technical content of other parts of this specification.

2. Referenced Documents 2.1 Standard

[1] MIL-STD-498, Military Standard—Software Development and Documentation, US Department of Defence, 5 Dec. 1994.

[2] MIL-STD-498 Overview and Tailoring Guidebook, 31 Jan. 1996.

3. Module-Wide Design Decisions

This section presents module-wide design decisions regarding how the module will behave from a user's perspective in meeting its requirements, and other decisions affecting the selection and design of the software components that make up the module.

3.1 Design Decisions and Goals of Geo View

GeoView is designed with only one executable.

GeoView has logically divided sub-components: Layout Hierarchy and Layout Structure Template Library (LSTL).

Unless otherwise specified, the programming language used in GeoView is C++. The following list identifies the design concepts that characterise GeoView:

1. Physical: Due to the focus on the physical world, more importance is placed on physical objects and less importance on logical objects.

2. Geographic: The default mechanism for placing objects in the world is to map them according to a physical location. If this is not possible then other methods must be used.

3. Shape: Shape is used to identify unique objects. Different object types will have different shapes while similar object types will have similar shapes.

4. Motion: Movement of objects (translation, rotation) typically represents activity in the world. A moving packet represents traffic flow while a spinning process shows that it is active.
5. Sound: Sound is linked to movement of objects or a change in visual appearance or a change in state.
6. Feel: Feel or touch senses can be used to provide additional emphasis to events linked to movement of objects where for example object come into close proximity suddenly.

4. Module Architectural Design

At the architectural level, the sub-systems (CSCJs) are decomposed into modules. At the detailed design level, the modules are decomposed (if applicable) into executables or libraries. This section describes the module architectural design.

The major architectural decomposition of GeoView comprises the following component:

GeoView General (Section 4.1.1 of Part 4)—contains all the classes for the support of the View, including interfaces with WorldMonitor for handling incoming events from Tardis, MasterTable for input and output of master tables, and LayoutHierarchy for handling the layout of network objects within the world.

and sub-components:

LayoutHierarchy (Section 4.1.2 of Part 4)—responsible for the node store and data structure of GeoView. It places graphical (renderable) objects into the scene graph based on layout rules specified in the MasterTable. It uses the LSTL to manage structure nodes; and LSTL (Section 4.1.3 of Part 4)—responsible for placing network objects (nodes) into layout structures such as rings, stars, and lines. The LSTL is a generic library with its components being templates. The layout structures covered include:

Tree, Graph, Line, Star, Matrix, Rectangle and Ring.

Figure 15:
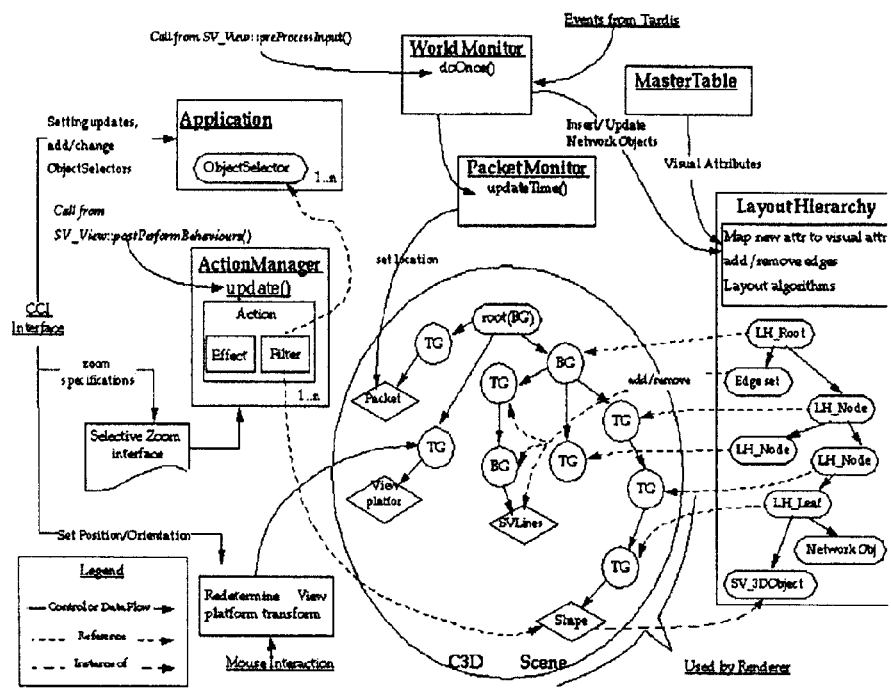
FIG. 15 depicts an overview for geo view.

FIG. 15 shows an overview diagram for GeoView. The component/sub-components are described at an architectural level in the sections below. Detailed design of the sub-components LayoutHierarchy and LSTL is included in Section 5. GeoView uses the Layout Structure Template Library (LSTL) framework by instantiating it with the LayoutHierarchy node type.

4.1 Geo View Functional Design 4.1.1 Geo View General

This section is divided into the following architectural design sub-sections:

Event Handling
MasterTable Functionality
CCI Interface
GeoView Processing and Caching 4.1.1.1 Event Handling The World Monitor receives events describing NetworkObjects from the Tardis process, via shared memory as shown in FIG. 15. Each recognised network object has its own event type, with event types coming in the six variants shown in Table 1.

TABLE 1

Network Object Event Handlers

| Event Type Variant | Event Handler Functionality |
| --- | --- |
| AddObject | Create a new NetworkObject |
| AddObjectAttributes | Add new attributes to an existing NetworkObject |

TABLE 1-continued

Network Object Event Handlers

| Event Type Variant | Event Handler Functionality |
| --- | --- |
| ReplaceObject | Replace a NetworkObject completely |
| ReplaceObjectAttributes | Replace a NetworkObject's attributes |
| RemoveObject | Temporarily removes a NetworkObject (tagged for deletion which cannot be undone) |
| Purge zombies | Permanently removes a NetworkObject |

Currently the handlers for AddObject and AddObjectAttributes are identical, both adding an object if none exists, and merging in the associated attributes as well.

4.1.1.2 MasterTable Functionality

The MasterTable is a hierarchical repository used for mapping network object attributes to visual attributes. In operation, when a visual attribute is required, an address is constructed using the application name, the object type, and the network object. The MasterTable is queried using this address and a list of matching attributes is returned. These could include direct attribute settings, or attribute tests, where for example an object might become a particular colour if the value of a specified network attribute of the NetworkObject in question is greater than a given constant. The MasterTable also contains the Layout Rules determining what layout-structure objects are placed in.

4.1.1.3 CCI Interface

The Component Control Interface (CCI) consists of textual commands sent via a socket that can be used to drive various portions of the application. Each Shapes Vector process usually has one or more CCIs, with each CCI being attached to a logically distinct portion of the application. For example, GeoView has a CCI for controlling the renderer, one for the SVWorld (shown as Virtual World on FIG. 1), which currently deals mainly with selective zoom and object selectors, and one for the World Monitor that gives access to commands relating to processing of incoming events.

When a command arrives on the CCI socket, the CCI thread notifies the main thread that it wants access to the mutex. The next time the main thread checks (in SV_View::postTraverseAndRender) it will yield to the CCI thread. It then performs all necessary processing before relinquishing the lock.

The notification mechanism is embodied in a class called ControlMutex that resides in the svaux library. It allows a higher priority thread to simply check the value of a flag to see if anyone is waiting on a mutex before relinquishing it, rather than performing a costly check on the mutex itself. Currently the ControlMutex is not used in processing, rather the CCI is checked once per renderer cycle in SV_View (the base view).

Figure 16:
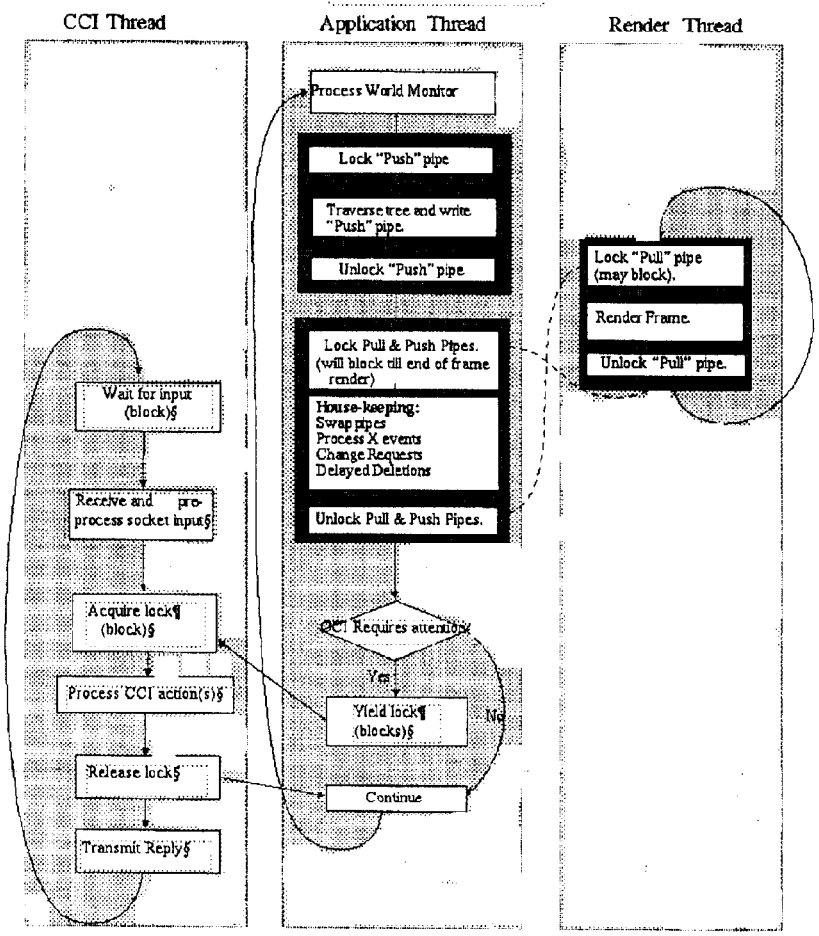
FIG. 16 shows the processing within the CCI thread as part of the GeoView thread diagram.

FIG. 16 shows the processing within the CCI thread as part of the GeoView thread diagram.

4.1.1.4 GeoView Processing and Caching

The basic structure of processing in GeoView is for external events to arrive detailing the existence of world objects, facts known about them and their relationships to other world objects in the form of attributes. The virtual depiction of these real world objects occurs graphically via leaf nodes in the GeoView universe where visual attributes for each type of possible world object is specified via the Master Table. Such visual attributes may be specified on the basis of attributes of the world objects.

In order to determine where to place these leaf nodes, the layout rules from the MasterTable are used. These layout rules specify attachment, containment and logical groupings of leaf nodes on the basis of their attributes.

To enable this, the building of the GeoView world is broken into the following five phases, with phases 2-5 referred to as the Layout' process:

1. Event Insertion and Removal

Add or remove attributes arrive encapsulated within network objects via events.

New leaf nodes in the layout hierarchy are created where necessary attributes and inversed attributes are added to, or removed from, leaf nodes.

Caching for the next four processing steps (i.e. Layout) occurs.

2. Leaf Building

Graphical objects are built according to their visual mapping's in the MasterTable.

3. Layout Rule Application

Layout-structure, attached-to and located-in rules from the MasterTable are applied to the objects. Any necessary grouping layout structures are created and parent-child relationships are formed that will dictate positioning, attachment, and containment.

4. Leaf Edge Creation

New edges between leaf nodes are created.

5. Object Relative Placement

Both leaf nodes and structure nodes are placed on the basis of their hierarchical relationships (attachment and containment) in the layout hierarchy as well as their parent structure nodes.

For efficiency, each phase of processing is associated with caching certain operations such that repeat operations do not occur. The GV_WorldMonitor turns off the layout flag before the insertion of a batch of events into the root of the GeoView layout hierarchy After a batch of events has been inserted, the layout flag is turned back on, and the entire batch is processed fully This procedure represents the start point for caching optimisation in layout hierarchy If such a caching strategy were not employed, processing time may be greatly affected. This is due to relative placement using bounds information. For example, consider Computer A with 20 child modems, each of them attached-to it. As the sub-structure for attached-to objects (for example ring) is called for EACH of the child modems, a bounds radius change will occur Since this may affect the overall composite structure's bounds radius (i.e. the parent Computer A's bounds) then the relative placement algorithm must be called for the Computer A's parent structure. This occurs in a recursive manner to the root layout structure. Without caching, the relative placement of Computer A would need to occur a minimum of 20 times. By caching the fact that Computer A requires placement (on level base-2 of the layout hierarchy tree) it can be guaranteed that Computer A's relative placement is called a maximum of once only processing this occurs.

TABLE 2 provides an overview of which operations are cached and at what stage of

| Level | Processing | Caching |
|---|---|---|
| 1 | Object insertion and removal | Each leaf node created or altered |
| 2 | Object building and layout | Each structure node requiring placement |

TABLE 2-continued provides an overview of which operations are cached and at what stage of

| Level | Processing | Caching |
|---|---|---|
| 3 | Edge creation | Leaf nodes requiring edge updates |
| 4 | Base level structure placement | Base Level-I structure placement, leaf nodes requiring edge updates |
| 5 | Base Level-I structure placement | Base Level -2 structure placement, leaf nodes requiring edge updates |
| ... | ... | ... |
| N | Top Level Structure Placement | Leaf nodes requiring edge updates |
| N + 1 | Leaf nodes requiring edge updates | ... |

4.1.2 LayoutHierarchy

The LayoutHierarchy is the view specific node store and system of data structures that implement GeoView. It consists of a hierarchy of classes that combine to form a logical object hierarchy of graphical and grouping objects that parallel the structure of the Scene Graph.

4.1.2.1 Class Hierarchy

Figure 17:
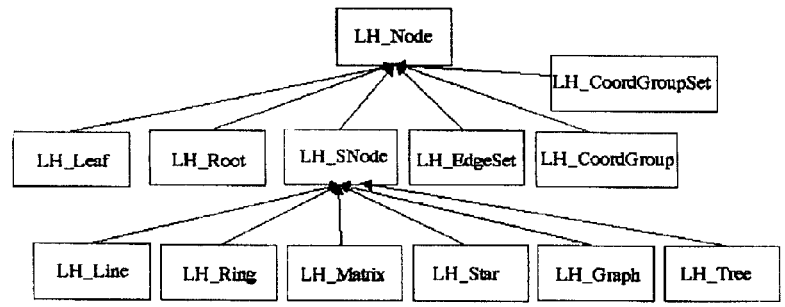
FIG. 17 depicts a class relationship diagram for a Layout Class Hierarchy.

The class relationship diagram for Layout Class Hierarchy is shown in FIG. 17

The Layout Hierarchy data structure is a hierarchical, arbitrarily Nodes represent either logical grouping constructs (i.e. depthed tree. LH_SNodes, LH_CoordGroupSet or LH_CoordGroups) or graphical objects in the GeoView universe (i.e. LHLeaf).

All classes inherit from the abstract base class LU_Node. The LU_Root, LH..EdgeSet and LWCoordGroupSet classes each represent singleton instances.

LH_Node inherits from CfItem and contains the base interface for all classes in GeoView. This interface includes the ability to set and check placement flags that indicate the type of an object add and remove objects from the scene-graph, look up operations in the MasterTable and placement specific functions.

LH_Root provides the instance for the root of the Geo View universe and is the core interface to the Layout Hierarchy data structure. It allows the insertion of events into the World, the look up of all nodes, the application of layout rules, object composition and placement caching for speed up.

LH_Leaf represents the actual visual objects in GeoView. It provides an interface for altering any visual aspects of objects, as well as an interface for maintaining any attachment or containment relationships an object may have.

LHEdgeSet maintains the set of connection lines in the World. It also has provision for temporarily turning lines on and off.

LH_CoordGroupSet is a singleton container class for LH_CoordGroup(s) that is itself a container for layout structures and/or leaf objects. It groups those objects together for which specific location data is known, and maintains them positioned as close as possible to that location.

LH_SNode is the abstract parent class for the layout structure classes. It provides the interface to the layout structures allowing insertion and deletion of objects, calling on the relative placement of objects and the maintenance of graph edges and location data for layout structures.

The layout structure classes themselves are grouping constructs for leaf objects and provide the interface to the LSTL generic layout structures. These can be instantiated with generic objects specific to views and the objects are placed on the basis of the traits particular to the layout structure (e.g. Star or Graph). Grouping rules are specified in the MasterTable.

4.1.2.2 Logical Object Hierarchy

Figure 18:
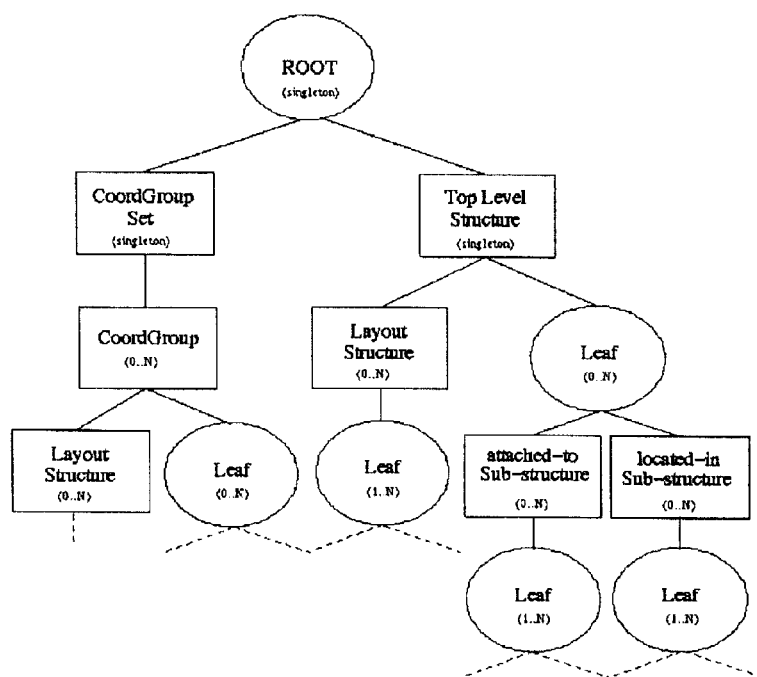
FIG. 18 depicts a Logical Object View in a data structure and how they interrelate to form the logical object view of the Geo View visual system.

FIG. 18 shows Logical Object View of the types of parent-child relationships allowable in the data structure and how these classes work together to form the logical object view of the GeoView visual system, which is also hierarchical. The three singletons of Root, CoordGroupSet and Top Level Structure form level 0 and level 1 of the layout hierarchy tree.

A Root instance forms the parent of the tree that represents the logical structure and interconnections between objects (LWLeaf) and grouping constructs (children of LU_CoordGroupSet or LH_SNode in FIG. 17). The interconnections of these objects and groups are mirrored in the Scene Graph, which is the interface to the renderer visual system.

At the second level of the hierarchy there are two singleton instances, viz, the Top Level Structure and the CoordGroupSet. All objects with location data or layout structures that have inherited location data are placed into a CoordGroup within the CoordGroupSet representing the geographic region given by the location. Visual objects when they first enter the world are placed into the Top Level Structure, which is the base layout structure of the world. CoordOroups contain nodes with specific location data, whilst all nodes beneath the Top Level Structure undergo relative placement based on the layout structure of which they are a child.

The Top Level Structure works as a default layout structure for leaf nodes that have no relevant layout rules specified in the MasterTable. The Top Level Structure is special in that it is the only structure that may itself directly contain a child layout structure.

Structures are layout structures that are children of the Top Level Structure, whereas sub-structures are Layout Structures that are used to group leaf nodes that are located-in or attached-to other leaf nodes. Note that the concept of attachment and containment are the cause of the arbitrary depth of the layout hierarchy tree. Intuitively arbitrary objects may be attached to one another and similarly objects may be placed inside of other objects to, effectively, arbitrary depth.

The grouping objects are akin to the C3DGroup objects and the leaf nodes are akin to the C3DLeaf objects of the Scene Graph. The parent-child relationships (edges of the layout hierarchy) are mirrored in structure in the Scene Graph, thus the locations of children may be specified relative to the parent object. For more detailed design of C3D.

4.1.2.3 Processing

This section provides a detailed description of the processing that occurs in the phases of building the Geo View universe outlined in Section 4.1.1.4 of this part. Description of the individual class methods is included in Section 5 of this part.

1. Root Initialisation

The singleton instances of LltEdgeSet and LH_CoordGroupSet are created during the initialisation of the Root (LitRoot) of the layout hierarchy The Top Level Structure of the hierarchy is also created, which acts as the default structure node for leaf nodes without parent structures. The root is itself created during the GeoView initialisation. Each of the singletons are children of Root, and the Root itself is inserted into the Scene Graph, effectively becoming the Scene Graph parent of the layout hierarchy 2. Event Insertion and Removal In this phase, entire objects or attributes of objects are added or removed from the layout hierarchy data structure. The four operations are ADELOBJECT, ADD_ATTRIBUTES, REPLACE OBJECT and REPLACE_ATTRIBUTES. This is the initial phase and is instigated by the insertion of events by World Monitor.

Object attributes may be inversable. This means that the attribute relates to two objects, and can be read in a left to right or right to left manner. For example, for Object A and Object B, if we have A is_contained_within B, then the inverse of this is B contains A. When such attributes are added to an object the inverse of the relationship is added to the secondary object. If attributes are removed, then such inversed attributes must also be removed from the secondary objects.

Attributes are added to, or removed from, objects that correspond to leaves in the layout hierarchy class structure and which correspond to graphical objects in the GeoView universe. These leaf nodes are then cached for further processing at the end of the insertion of a batch of objects and attributes.

Section 5 of this part contains method descriptions for the following cases:
Insertion;
Adding Inverse Attributes;
NetworkObject Insertion and Removal; and
Attribute Insertion 3. Leaf Building In this phase, graphical objects (leaves) are built according to their visual mappings in the MasterTable.

The LH_Leaf class has an aggregation relationship ('contains') to the CV_3DObject class, which in turn is derived from the Generic3DObject class. The 3D object class is a descendant of the C3D object classes (see reference [6]) that implement rendering. When visual information about a Layout Hierarchy object (leaf node) arrives via events it is passed on to the respective CVjDObject instance.

4. Layout Rule Application

In this phase, the parent-child relationships of leaf nodes to structure nodes and each other are made on the basis of rules in the MasterTable. The structure nodes that are required to perform placement of leaf nodes is cached, i.e. data structures detailing the hierarchical relationship of objects is built, but not physically yet layed out.

Section 5 of this part contains method descriptions for the following cases:
Apply Layout Structure Rules to Objects;
Handle Generic Layout Structures;
Handle Instance Matches;
Apply Attached-to Rules to Objects;
Apply Located-in Rules to Objects;
Find Satisfied Rules; and
Compose Objects.

5. Leaf Edge Creation

In this phase, all edges in the GeoView Universe are placed in the LH_EdgeSet singleton when they are created. The location of their endpoint's are not maintained in the traditional hierarchical relative fashion via transform groups in the Scene Graph since they do not conceptually have a single location, but span two. As a result of this, each time a node or subtree in the layout hierarchy tree changes, each edge must have its position updated.

Section 5 of this part contains method descriptions for the following cases:
Create Edges;
Create Edge;
Update Edges;
Add Edge; and
Add Graph Edge.

6. Object Relative Placement

In this phase, each level of the layout hierarchy tree undergoes placement by caching objects requiring placement into the level above, until the root of the layout hierarchy tree is reached. In this way, we can ensure that relative placement is called a maximum of once only on each structure in the entire layout hierarchy.

The parent layout structure of an object places it according to the placement algorithm of that structure. For example, a ring layout structure places its child objects spaced evenly around the circumference of a circle. Each layout structure has settings particular to its layout shape.

4.1.3 Layout Structure Template Library (LSTL)

This section describes the Layout Structure Template Library (LSTL), which consists of a set of C++ formatting classes. A formatting class is one which contains pointers to other objects (T) and performs some kind of formatting on those objects. The LSTL classes are responsible for placing the objects they are given into layout structures such as rings, stars, lines etc. The LSTL is a generic library and all components of the LSTL are templates.

The LSTL contains the following template classes:
GenericGraph<T>
GenericLine<T>
GenericMatrix<T>
GenericRing<T>
GenericStar.cT>
GenericRectangle<T>
CenericTree'<T>

Each of these classes is a template, and can be instantiated to contain any type of object. The only restriction on the object is that it must supply the required interface functions as described in Section 5. Each of the classes in the LSTL described in the sub-sections below defines an interface as described in Section 5 of this part.

4.1.3.1 GenericGraph

This layout structure places the objects in a graph, based on edge connections between those objects. The graph algorithm attempts to situate objects by spatially representing their interconnections whilst minimising edge crossovers. The user can specify the following settings:

NODE SEPARATION FACTOR: This value indicates the amount of separation between nodes in the graph (horizontal spacing) relative to a unit value of 1.0.

RANK SEPARATION FACTOR: As similar to node separation factor this value represents the separation between ranks (vertical spacing).

ORIENTATION: This value determines whether the graph is orientated top-to-bottom or left-to-right.

Figures 19, 20:
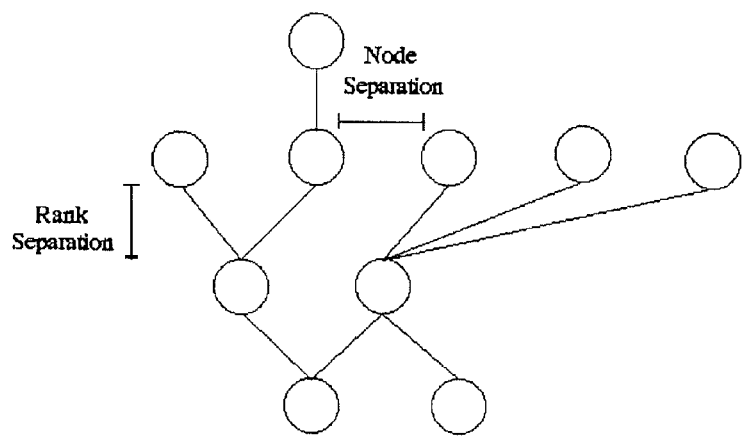
FIG. 19 shows the Object Layout Structure.
FIG. 20 depicts what the DIRECTION and ORIGIN line would look like with various Generic Line combinations.

The default node separation factor to rank separation factor is a ratio of 1:3. FIG. 19 shows the Object Layout Structure of how the above settings relate to the graphs produced.

4.1.3.2 GenericLine

This layout structure places the objects in a line. The user can specify the following arguments:

AXIS: This determines to which axis (x, y or z) the line will be parallel.

LINEAR DIRECTION: This determines whether the line extends along the axis in a positive or negative direction.

ORIGIN: This determines whether the origin is located at the front back or centre of the line.

SEPARATION: This is the amount of spacing the algorithm leaves between each object in the line.

FIG. 20 shows what the DIRECTION and ORIGIN line will look like with various GenericLine combinations.

4.1.3.3 GenericMatrix

This layout structure places objects in a matrix. By default objects are added into the matrix in a clockwise spiral as shown below:

| 24 | 9  | 10 | 11 | 12 |
|----|----|----|----|----|
| 23 | 8  | 1  | 2  | 13 |
| 21 | 6  | 5  | 4  | 15 |
| 20 | 19 | 18 | 17 | 16 |
| 22 | 7  | 0  | 3  | 14 |

The user can specify the following arguments:

WIDTH_SEPARATION: This is the amount of space in the X axis that is left between objects in the matrix.

DEPTH_SEPARATION: This is the amount of space in the Z axis that is left between objects in the matrix.

DELETE_POLICY: This determines what the algorithm will do when an object is removed from the matrix. It can either leave a gap, fill in the gap with the last object or shuffle back all of the objects after the gap.

ORIGIN_POLICY: Determines where the true centre of the matrix is located, either where the first object in the matrix is placed or at the true centre.

4.1.3.4 GenericRing

This layout structure places objects in a ring. The user can specify the following arguments:

ANGULAR DIRECTION: This determines the direction in which objects are placed on the ring. It can be either clockwise or anti-clockwise.

RADIUS: This is a minimum radius for the ring. The algorithm will determine a dynamic radius based on object size and separation and if it is less than the user specified radius it will not be used. If it is greater it is used rather than the user specified one.

SEPARATION: The amount of separation to leave between objects. The greater the separation the greater the dynamic radius of the resulting ring.

Figure 21:
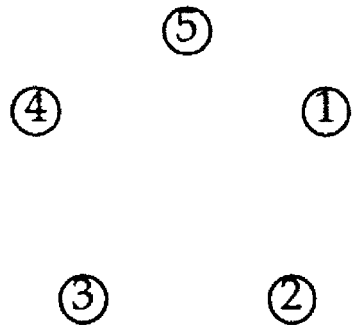
FIG. 21 depicts a five object ring with CLOCKWISE direction.

FIG. 21 shows a five-object ring with CLOCKWISE direction. The origin will always be at the centre of the ring. If a ring contains only one object then it will be placed at the origin.

4.1.3.5 GenericStar

This layout structure places objects in a star One object will be assigned by the user as the root of the star and placed at the origin. The rest of the objects will be the leaves of the star and will be placed using a GenericRing. As well as the GenericRing arguments the user can also specify:

ROOT_HEIGHT: This is the amount that the root of the star is raised above the plane.

4.1.3.6 GenericRectangle

This layout structure places objects in a rectangle. The user can specify the following arguments:

ANGULAR DIRECTION: The direction (clockwise or anti-clockwise) in which objects are placed around the rectangle.

START_SIDE: The side on which to start layout. The sides are numbered 0-3 with 0 being the top (far) side and subsequent sides extending clockwise.

WIDTH_SEPARATION: The separation between objects in the width axis.

DEPTH_SEPARATION: The separation between objects in the depth axis

WIDTH: Specifies the width dimension of the resulting rectangle.

DEPTH: This specifies the actual dimensions of the resulting rectangle.

If width or depth values are provided, then the radius of the objects, WIDTH_SEPARATION and DEPTH_SEPARATION will not be used in the layout.

4.1.3.7 GenericTree

This layout structure, like GenericGraph, also places the objects in a Graph, based on edge connections between those objects. GenericTree uses the same graph algorithm to determine the layout, but with different parameters. The 'Tree graph is a directed edge graph, where edge direction is determined by the MasterTable's layout rules. For example, if the MasterTable specifies a Shared_Data_Link's layout rule as:

"layout-structure Tree is_connected_to==type_of(Computer)", any Shared Data Link network object connected to a Computer, will be laid out as a Tree, with the direction of the edge from the Shared Data Link to the Computer. In this way, rather than the layout of a Tree being non-deterministic given the same set of events, the Tree will be laid out in the same way each time. However, there are a few exceptions to this rule. If two objects of the same type are connected, or if at least one of the nodes is a structure node, then the direction becomes non-deterministic, like GenericGraph.

4.2 Concept of Execution

The execution concept for the GeoView module, including the flow of control, is described in Section 4.1 and Section 4.3 of this part.

4.3 Interface Design

Like DataView, GeoView interfaces with the Registry module and Tardis, which allow events and commands to be sent to it. The events arrive from the Intelligent Agents, and the commands arrive from the use; via different user tools, such as the Navigation System (nay) and the Configuration Editor (ConfigEd).

The Tardis handles incoming events from the agents, and commands are sent to GeoView via the Command Control Interface (CCI).

Figure 22:
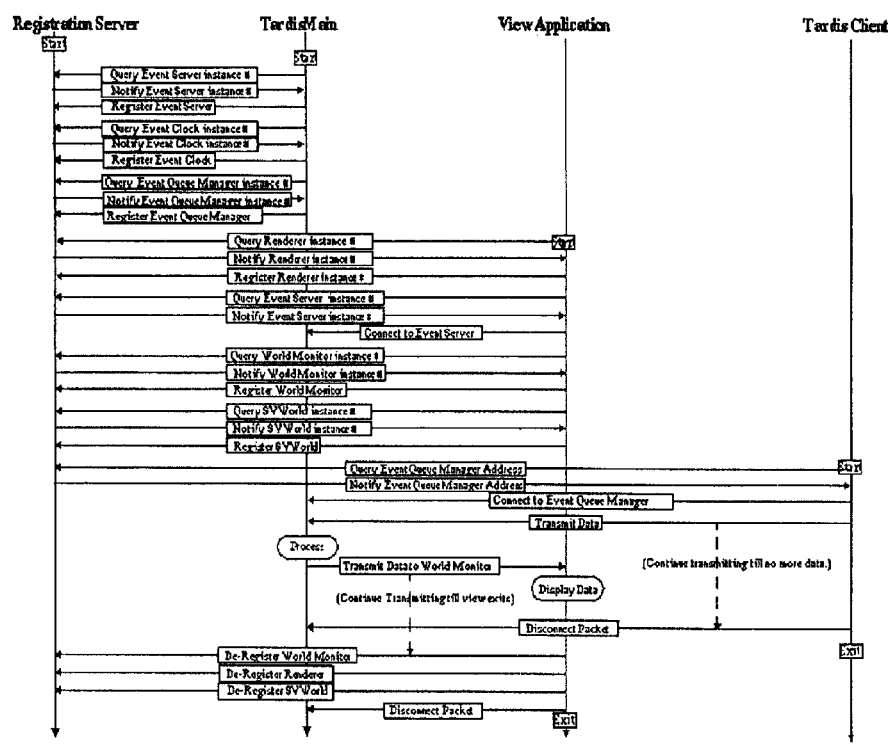
FIG. 22 depicts process interactions between the View Applications, the Registry and the Tardis.

FIG. 22 shows the process interactions between the View Applications (GeoView/DataView), the Registry, and the Tardis.

5. Module Detailed Design

This section contains, for the GeoView module, the detailed design descriptions for the GeoView, LayoutHierarchy and LayoutStructureTemplateLibrary classes.

5.1 Geo View Classes 5.1.1 Geo View Class Summary

Table 3 identifies a full list and description of the GeoView classes.

TABLE 3

GeoView Classes

| Class NameDescription | Description |
| --- | --- |
| GV Action | The Geo View specific action class. |
| GV ActionMan | The GeoView specific action manager class. Knows how to iterate over LayoutHierarchy to refuter all nodes. |
| GV 3Object | The GeoView 3DObject. |
| GVPacketMotionEffect | Class that allows simple motion effect. |
| GV_EventFileReader | The GeoView specific event file reader. |
| GV WorldMonitor | The GeoView specific class for World Monitor. |
| GeoView | The main (singleton) class for GeoView application |
| ControlGeoViewWorldService | Class for adding GeoView specific services to the CVSVWorld CCI interface. |
| GeoViewCanvas | Display/interface handling for GeoView. |
| GeoViewSettings | Subclass of ApplicationSettings to hold the application specific settings for GeoView. |

5.2 LayoutHierarchy Classes 5.2.1 LayoutHierarchy Class Summary

Table 4 identifies a full list and description of the LayoutHierarchy classes.

TABLE 4

Layout Hierarch Classes

| Class Name | Description |
| --- | --- |
| LH_CoordGroup | This class contains a group of nodes whose (x, z) coordinates all fall within a specific range. |
| LH_CoordOroupSet | This class contains a set of related LH CoordCroup nodes. |
| LHEdge | This class stores information about one edge in the LayoutHierarchy |
| LWEdgeSet | This class is a container for all edges in the LayoutHierarchy |
| LH_Graph | This class is a container for a group of nodes that are arranged as an adirected graph. |
| LH_Leaf | The lowest node in the LayoutHierarchy. An LU_Leaf node contains a NetworkObject and a corresponding SV9DObject which contains the 3D data that represents the NetworkObject according to the mles in the MasterTable |
| LU_Line | This class is a container for a group of nodes that are arranged in a line. |
| LH_Matrix | This class represents a Matrix layout structure. Nodes are added to the Matrix in a clockwise spiral. |

TABLE 4-continued

Layout Hierarch Classes

| Class Name | Description |
| --- | --- |
| LH_Node | This is the base class for all nodes in a LayoutHierarchy. This class maintains the following variables LH_Root* mRootOfLfl a pointer to the root of the LayoutHierarchy. LH_Node* mParent a pointer to the parent of this node C3DBranchflroup* mBranchGroup a pointer to the branch group that contains the geometry of this node. This branch-group is attached to the branchgroup of this nodes parent. This means that mRootOfLH mBranchOroup contains the geometry for the entire LayoutHierarchy (via a bit pattern). mt mPlaced this variable contains information about what layout rules have been used to place this node |
| LH_Ring | This class represents a ring shaped layout structure. A ring has a LU_Leaf as its root and a list of LU_Nodes as its children. The branchgroup of the root in placed under this nodes' branchgroup and the branchgroup of the children are placed under the roots' branchgroup |
| LU_Root | This class is the top level node in the LayoutHierarchy. It is responsible for maintaining a list of other LH_Node objects and performing layout operations on them. It contains pointer to the MasterTable that is used for layout |
| LU_SNode | This class is the base class for all structure nodes in the LayoutHierarchy. All structure classes (LU_Star LU_Matrix LU_Line etc) inherit from this base class and it provides an extra interface on top of the standard LI-I_Node interface |
| LU_Star | This class represents a star shaped layout structure. A star has a LU_Leaf as its root and a list of LH Nodes as its children The branchgroup of the root in placed under this nodes' branchgroup and the branchgroup of the children are placed under the roots branchgroup |
| LU_Tree | This class is a container for a group of nodes that are arranged as a directed graph, where edge direction is determined by layout relationships between different objects |
| NetworkObject | Contains information about a NetworkObject |

5.2.2 Event Insertion and Removal Methods

5.2.2.1 cfInsert

This is the insertion method called directly by the World Monitor A command, a network object and an address are specified. Dependant on the command objects being added or removed, attributes are added or removed from the GeoView world.

```
LH_Root::cfInsert( COMMAND, NetworkObject)
On the basis of the COMMAND:-
(where COMMAND = ADD OBJECT or ADD_AflRIBUTES)
    addInverseAttributes( networkobject ) [Section 5.2.2.2]
    cfInsertNetworkObjectAdd( networkobject ) [Section 5.2.2.3]
(where COMMAND = REPLACE_OBJECT)
    removeInverseAttributes ( networkObject
    cfInsertNetworkObjectReplace( networkobject ); [Section 5.2.2.3]
    addInverseAttributes ( networkObject ); [Section 5.2.2.2]
(where COMMAND = REPLACE_ATITRI13UTES)
    removeInverseAttributes (networkObect)
    cfInsertNetworkObjectAttributesReplace (
    networkObject) [Section 5.2.2.3]
    addInverseAttributes( networkObject ) [Section 5.2.2.2]
```

5.2.2.2 Adding Inverse Attributes

Each attribute is checked to see if it has a corresponding inverse attribute. If so a lookup of the secondary object is made. If it does not exist it is created and the inverse attribute is added to it, otherwise the inverse attribute is added to the existing secondary object.

LH_Root::addInverseAttributes(networkObject)

```
FOR each attribute in the networkobject
    IF there exists an inverse relationship
        Find the objectname from the value of the attribute IF
        the leaf named objectname does NOT exist
            Create a leaf named objectname
        ENDIF
        Add the inverse relationship to the leaf using the
        name of the object
    ENDIF
END FOR
```

5.2.2.3 NetworkObject Insertion

Each of the attributes from the passed in network object are added to the network object of the leaf node. The leaf node is then cached for further processing after the entire current batch of events has arrived.

LH_Root::cfInsertNetworkObjectAdd(networkObject, address)

```
FOR each attribute in the networkobject
    Call cfInsertAttrib( attribute, address ) [Section 5.2.2.4]
END FOR
Call layout(leaf)
```

5.2.2.4 Attribute Insertion

If the leaf object specified by address does not yet exist then a new leaf is created and added to the lookup hash map. Otherwise the attribute is added to the existing leaf.

LH_Root::cfInsertAttrib(attribute, address)

---

```
Do a lookup of leaf using address
IF the leaf does not exist yet
    Create the leaf
    Add attribute to leaf
    Add leaf to leaf hash map
OTHERWISE
    Add attribute to leaf
    IF attribute added successfully
        IFattribute added was LOCATED_AT
            Do any necessary location processing
        ENDIF
    ENDIF
ENDIF
```

---

5.2.3 Layout Rule Application Methods

5.2.3.1 applyLayoutstructureRulesToObject

Structure Rules specify the logical groupings of world objects (represented as leaf nodes in the virtual world) by mapping them to layout structures on the basis of attribute tests. If a relevant layout structure is found via the structure rules then it is placed into this structure (which is created if necessary).

---

```
LH_Root::applybayoutStructureRulesToObject( leaf)
    call findSatisfiedRules( "layout-structure", rules,
satisfiers ) on the leaf [Section 5.2.3.4]
    IF a satisfying layout structure was found
        Process depending on the type of the layout structure
        LAYOUT_STRUCTURE_LINE
            IF the leaf is not already in a line layout
structure
                Call handleGenericLayoutStructure ( rule,
satisfiers, leaf, LINE)
            END IF
        LAYOUT_STRUCTURE_RING
            IF the leaf is not already in a ring layout structure
                Call handleGenericLayoutStructure (rule,
satisfiers, leaf, RING)
            ENDIF
        LAYOUT_STRUCTURE_MATRIX
            IF the leaf is not already in a matrix layout
structure
                Call handleGenericLayoutStructure C rule,
satisfiers, leaf, MATRIX
            ENDIF
        LAYOUT_STRUCTURE_STAR
            The star layout structure is specially handled.
            handleStarLayoutStructure ( )
        LAYOUT_STRUCTURE_GRAPH
            Note that since graph is designed to merge with other
structure types, no check of being in an existing
graph is made here.
            Call handleGenericLayoutStructure( rule, satisfiers,
leaf, GRAPH)
        ENDIF
```

---

1. handleGenericLayoutStructure

Assign the primary leaf node (the 'this' object) and the secondary leaf (parameter 'leaf') to an appropriate structure (which will possibly need to be created) on the basis of each satisfying attribute.

LH_Root::handleGenericLayoutstructure(rule, satisfiers, leaf, structure)

---

```
ITERATE over each of the satisfier attributes
    IF there exists a secondary leaf (ie. This is a two-way
relationship match)
        test if any primary leaf ancestor is in type of
structure
        test if any secondary leaf ancestor is in type of
structure
            IF neither are in a structure already
                Create a structure of type structure and add them
both to it
                OTHERWISE IF both in different structures
                    merge those two structures into one of type
structure
                OTHERWISE one is not in a structure
                    add it to the one that IS
            ENDIF
    OTHERWISE
        handle an Instance Match
    ENDIF (there exists a secondary leaf node)
END ITERATION (over each attribute)
```

---

2. handleinstanceMatch

Each instance structure is stored using a unique objectTypeName: mappingLayoutRule key. For each instance it is checked to see if a structure for this particular layout rule and type already exists; if so it is added to it, otherwise an entirely new structure with this object's type and rule signature is created.

---

```
LH_Root::handleInstanceMatch( Structur , node, rule, rootOfStar)
    Create a unique object key using CfItem: :makeAddress
with
    the object type and the rule name
    IF a structure currently has this signature add this leaf
        node to that structure
    OTHERWISE
        create the new structure
        add the structure with unique key to a lookup hash map
        add this leaf node to the structure
    ENDIF
```

---

5.2.3.2 applyAttachedToRulesToObject

Placement Rules specify the attachment and containment relationships of world objects on the basis of attribute tests. If a relevant attachment relationship is found via the layout rules then the primary object is either placed into an attachment relationship as the parent (i.e. things are attached to it) or as the child (i.e. attached to something). During this process any relevant layout rule arguments (LRAs) are read.

---

```
LH_Root::applyAttachedToRulesToObject( leaf)
    Call findSatisfiedRules( "attached-to", rules, satisfiers
) on the leaf[Section 5.2.3.4]
    IF any satisfying rules were found
        ITERATE through each satisfying rule found
            read any layout rule arguments for this layout rule
            IF this is NOT an inverse rule
                (The primary object is attached to a single other
parent)
                find secondary leaf node using the attribute value
and the leaf hash map
                set sub-structure scaling on the basis of any
layout rule arguments
```

-continued
```
                Call composeObjects( primary leaf, secondary leaf,
        "attached-to", LRA's)
                OTHERWISE
                    (The primary object is the parent of the attached-to
        relationship)
                    ITERATE through each satisfying attribute found
                        find the secondary leaf node via the attribute
        value and lookup
                            set sub-structure scaling on the basis of any
        layout rule arguments
                            Call composeObjects( second leaf, prime leaf,
        "attached-to", LRA's)
                    END ITERATION (each attribute)
                END IF (rule is inverse)
            END ITERATION (each rule)
        END IF (any satisfying rules found)
```

5.2.3.3 applyLocatedinRulesTo Object

Placement Rules specify the attachment and containment relationships of world objects on the basis of attribute tests. If a relevant containment relationship is found via the layout rules then the primary object is either placed into a containment relationship as the parent (i.e. things are contained within it) or as the child (i.e. inside of something). During this process any relevant LRAs are read.

```
LH_Root::applyLocatedInRulesToObject( leaf)
    Call    findSatisfiedRules(    "located-in",    rules,
    satisfiers
    on the leaf)[Section 5.2.3.4]
    IF any satisfying rules were found
        ITERATE through each satisfying rule
        Read any layout rule arguments associated with the
rule
            IF the rule is NOT inversed
                (Primary leaf node will be located in another leaf
node)
                find the secondary leaf node via lookup using the
first satisfier attribute value
                call composeObjects( primary leaf, secondary leaf,
"located-in", LRAs)
            OTHERWISE
                (Secondary leaf node will have other leaf nodes located within it)
                ITERATE through each of the satisfying attributes
                    find the current secondary leaf node via lookup
                    with attribute's value
                    call composeObjects(secondary leaf, primary leaf,
"located-in", LRA)
                END ITERATION (each satisfying attribute)
            END IF (rule is inverse?)
        END ITERATION (each satisfying rule)
    END IF (any satisfying rules were found)
```

5.2.3.4 findSatisfiedRules

Find any matching structure rules from the MasterTable for the leaf node. For any found, record the rule matched, and an array of the satisfying attributes. Wildcards may be matched if they are present in the MasterTable. Processing of the unique LRA is done in this function also, matching instances as necessary.

```
LH_Node::findSatisfiedRules(ruleType, returned list of matching
rules, returned array indexed by matched rules of a list of attributes that
match the rule)
        get the networkObject for this leaf node build the list of
        layout mappings associated with objects of this type via
        cfGetChildren in mTable. (eg.
            "MasterTable:GeoView:Computer:layout-structure") append
        to this list any WILDCARD matches
        ITERATE through each mapping layout
            get the ObjectAttributeTest for the napping layout
            IF the layout rule from the mapping layout is of the
        required rule type
                IF the secondary object is a WILDCARD
                    (Secondary object wildcard processing)
                    create any rules and satisfying attributes for this
        wildcard
                OTHERWISE (secondary object is not a WILDCARD)
        (Secondary object normal processing)
                IF the right hand side of the layout rule represents
        an object type
                    (Relationship processing)
                    call getAttributesThatSatisfy to build satisfying
        attributes on OAT
                OTHERWISE
                    (Do instance processing)
                    IF there is a unique flag in the Layout Rule
        Arguments
                        call doUniqueLRAProcessing( TODO )
                    OTHERWISE (no unique flag)
                    find first attribute
                    END IF (unique flag exists?)
```

5.2.3.5 composeObjects

The passed in parent and child objects are composed or aggregated into an object composition via attachment or containment, i.e. with containment the child is contained within the parent and with attachment the child is attached to the parent. A child cannot be a descendant of parent is asserted.

Special processing is done in the case where the child is in a layout structure already and the parent is not. In this case the child is removed from the layout structure, composed with the parent, and then the entire object composition is re-inserted back into the original child layout structure.

Consider the case where both the parent and child are already in layout structures. In this instance the parent takes precedence and as such the child is removed from its layout structure and composed with the parent (implicitly placing it into the parent's layout structure.)

```
LH_Root::composeObjects( parent, child, composition type)
    IF the child is already attached-to or located-in
        EXIT function
    END IF (child already attached-to or located-in)
    IF the child is an ancestor of the parent
        REPORT error
    END IF (check not ancestor)
    SET child structure to the layout structure (if any) that
    the child is in
    IF composition type is attachment
        Call attach( child ) on parent
    OTHERWISE (composition type not attachment)
        Call contain( child ) on parent
    END IF (composition type)
    IF the child WAS in a layout structure AND the parent is
not
        INSERT the new composite object into the child
    structure
    END IF (child was in layout structure and parent isn't)
```

5.2.4 Leaf Edge Creation Methods

5.2.4.1 createEdges

Create any new edges that are to be associated with this leaf. During this processing, non visible edges are updated for LSTL components (for example Graph and Tree structures.)

```
LH_Leaf::createEdges( )
    ITERATE through attributes associated with this leaf IF
        the attribute's name is "IS_CONNECTED_TO"
            Call createEdge( attribute ) [Section 5.2.4.2]
        END IF (name is connected to)
    END ITERATION
```

5.2.4.2 createEdge

Using the attribute, find the connected-to node. Ensuring there is no current visible edge, create a new one to it.

```
LH_Leaf::createEdge( matching attribute)
    SET connectedToNode by using the string value of the
        passed in attribute
    Call cfGetReference( connectedToNode ) to find the node's
        leaf instance (if any)
    IF the node is found AND there is no current connection
        to it
        SET absloc to the absolute location of the current node
        SET conabsloc to the absolute location of the
        connectedTo node
            Call addEdge( this node, bc, conn. node, conloc) on
                edgeSet singleton [Section 5.2.4.4]
            Call addEdge( edge ) to add any non visible graph edges
                to this node[Section 5.2.4.5]
    END IF (node found and no current connection)
```

5.2.4.3 updateEdges

Update edge locations on the basis of this Leaf's location.

```
LU_Leaf::updateEdges( )
    IF the delay processing flag is set
        cache the current leaf for edge processing later
    END IF (delay processing flag)
    ITERATE through each of mEdges
        Call setLocation( ) on the edge and make it the absolute
            location of this leaf
    END ITERATION
    IF there is an attached-to structure node
        Call updateEdges( ) on the structure node
    END IF (attached-to structure node)
    IF there is a located-in structure node
        Call updateEdges( ) on the structure node
    END IF (located-in structure node)
```

5.2.4.4 addEdge

An edge is added to the EdgeSet singleton.

```
LRYdgeSet::addEdge( node1, location1, node2, location2)
    IF currentline modulus 100 yields no remainder
        ALLOCATE space for another 100 lines and set them
    END IF (modulus 100)
    Create a new edge
    Add it to mEdges
    Check for edge visibility and add it to the appropriate
        list
```

5.2.4.5 addGEdge

A non-visible edge interconnection is added on the basis of whether there is a common Graph (or graph sub-typed) parent. This keeps edge information for Graph and its descendents in the LSTL up to date.

```
LH_Leaf::addGEdge(Edge)
    SET childNode1 via calling getNode1 ( ) on edge
    SET childNode2 via calling getNode2 ( ) on edge
```

Look for a common graph/tree via calling findCommonSNode ( ) on LH_SNode
Add structure edge to the leaf

5.3 LayoutStructureTemplateLibrary (LSTL) Classes

5.3.1 LSTL Template Class Summary

Table 5 identifies a full list and description of the LSTL classes.

TABLE 5

LSTL Classes

| Class name | Description |
|---|---|
| GenericGraph | This template class places the objects in a graph. |
| GenericLine | This template class places the objects in a line. |
| GenericMatrix | This template class places objects in a matrix. |
| GenericRing | This template class places objects in a ring. |
| GenericStar | This template class places objects in a star. |
| GenericRectangle | This template class places objects in a rectangle. |
| GenericTree | This tem late class laces oWeds in a tree. |

5.3.2 GenericGraph Methods

5.3.2.1 Node Separation Factor

This value indicates the amount of separation between nodes in the graph (horizontal spacing) relative to a unit value of 1.0.

| | |
|---|---|
| Values: | Positive floating point |
| Interface: | float getNodeSeparationFactor() const<br>void setNodeSeparationFactor( const float val) |

5.32.2 Rank Separation Factor

As similar to node separation factor this value represents the separation between ranks (vertical spacing).

| | |
|---|---|
| Values: | Positive floating point |
| Interface: | float getNodeSeparationFactor() const<br>void setNodeSeparationFactor( const float val) |

5.3.2.3 Orientation

This value determines whether the graph is orientated top-to-bottom or left-to-right.

| | |
|---|---|
| Values: | TOP_TO_BOTTOM, LEFT_TO_RIGHT |
| Interface: | Graph Orientation Policy getOrientation() const<br>void setOrientation( const Graph_Orientation_Policy orient) |

5.3.3 GenericLine Methods

5.3.3.1 Axis

This determines which axis (x, y or z) the line will be parallel to.

| | |
|---|---|
| Values: | X_AXIS, Y_AXIS, Z_AXIS |
| Interface | LSTL_LineAxis getAxi() const<br>void setAxis( const LSTL_LineAxis axis) |

5.3.3.2 Linear Direction

This determines whether the line extends along the axis in a positive or negative direction.

| | |
|---|---|
| Values: | POSITIVE, NEGATIVE |
| Interface: | LSTL_LinearDirection_getDirection( ) const |
| | void setDirection( const LSTL_LinearDirection dir) |

5.3.3.3 Origin

This determines whether the origin is located at the front back or centre of the line.

| | |
|---|---|
| Values: | FIRST. LAST, CENTER |
| Interface: | LSTL_LineOrigin getOrigi( ) const |
| | void setOrigin( const LSTL_LineOrigin origin) |

5.32.4 Separation

This is the amount of spacing the algorithm leaves between each object in the line.

| | |
|---|---|
| Values: | Positive floating point |
| Interface: | float getSeparatio( ) const |
| | void setSeparation( const float sep) |

5.3.4 GenericMatrix Methods

5.3.4.1 Width Separation

This is the amount of space in the X axis that is left between objects in the matrix.

| | |
|---|---|
| Values: | Positive floating point |
| Interface: | float WidthSeparation( ) const |
| | void WidthSeparation( const float sep) |

5.3.4.2 Depth Separation

This is the amount of space in the Z axis that is left between objects in the matrix.

| | |
|---|---|
| Values: | Positive floating point |
| Interface: | float DepthSeparation( ) const |
| | void DepthSeparation( const float sep) |

5.3.4.3 Delete Policy

This determines what the algorithm will do when an object is removed from the matrix. It can either leave a gap, fill in the gap with the last object or shuffle back all of the objects after the gap.

| | |
|---|---|
| Values: | LEAVE GAP FILL_GAP_FROM_END, SHUFFLE |
| Interface: | LSTL_deletePolicy_getDeletePolic( )_const |
| | void setDeletePolicy( const LSTL_deletePolicy policy) |

5.3.4.4 Origin Policy

Determines where the true centre of the matrix is located, either where the first object in the matrix is placed or the true centre.

| | |
|---|---|
| Values: | FIRST, CENTER |
| Interface: | LSTL OriginPolicy getOriginPolicy( ) const |
| | void setOriginPolicy( const LSTL_OriginPolicy policy) |

5.3.5 GenericRing Methods

5.35.1 Angular Direction

This determines the direction in which objects are placed on the ring. It can be either clockwise or anti-clockwise

| | |
|---|---|
| Values: | CLOCKWISE, ANTI-CLOCKWISE |
| Interface: | LSTL AngularDirection getDirection( ) coust |
| | void setDirection( const LSTVAngularDirection dir) |

5.3.5.2 Radius

This is a minimum radius for the ring. The algorithm will determine a dynamic radius based on object size and separation and if it is less than the user specified radius it will not be used. If it is greater it is used rather than the user specified one.

| | |
|---|---|
| Values: | Positive floating point |
| Interface: | float getRadius( ) coost |
| | void setRadius( const float radius) |

5.3.5.3 Separation

The amount of separation to leave between objects. The greater the separation the greater the dynamic radius of the resulting ring.

| | |
|---|---|
| Values: | Positive floating point |
| Interface: | float getNodeSeparation( ) const |
| | void setNodeSeparation( const float nodeSeparation) |

5.3.6 GenericStar Methods

52.6.1 Root Height

This is the amount that the root of the star is raised above the plane.

| | |
|---|---|
| Values: | Positive floating point |
| Interface: | float getRootHeightO const |
| | void setRootHeight( float rootHeight) |

5.3.7 GenericRectangle Methods

5.3.7.1 Angular Direction

The direction (clockwise or anti-clockwise) in which objects are placed around the rectangle.

| | |
|---|---|
| Values: | CLOCKWISE, ANTI-CLOCKWISE |
| Interface: | LSTL AngularDirection getDirection~const |
| | void setDirection( const LSTLAngularDirection ang) |

5.3.7.2 Start Side

The side on which to start layout. The sides are numbered 0-3 with 0 being the top (far) side and subsequent sides extending clockwise.

| | |
|---|---|
| Values: | Integral range [0..3] |
| Interface: | int getStartSide( ) const<br>void setStartSide( int startSide) |

5.3.7.3 Width Separation

The separation between objects in the width axis.

| | |
|---|---|
| Values: | Positive floating point |
| Interface: | float getWidthSeparatin( ) const<br>void setWidthSeparation( const float widthSeparation) |

5.3.7.4 Depth Separation

The separation between objects in the depth axis.

| | |
|---|---|
| Values: | Positive floating point |
| Interface: | float getDepthSeparation( ) const<br>void setDepthSeparation( const float depthseparation) |

5.3.7.5 Width

Specifies the width dimension of the resulting rectangle.

| | |
|---|---|
| Values: | Positive floating point |
| Interface: | float getWidth( ) const<br>void setWidth( const float width) |

5.3.7.6 Depth

This specifies the actual dimensions of the resulting rectangle.

| | |
|---|---|
| Values: | Positive floating point |
| Interface: | float getDepth( ) const<br>void setDepth( const float depth) |

5.3.8 LSTL Class Interface

Each of the classes in the LSTL defines a common interface as shown in Table 6.

TABLE 6

| LSTL Class Interface | |
|---|---|
| Method | Desciption |
| iterator getFirst ( ) const<br>Get an iterator to the first object in the structure. | Get art iterator to the first object in the structure.<br>NOTE: The type of iterator is defined in the class itself Currently it is vector <T*>. Use GenericStructure<Foo>::iterator as the type may change. |
| iterator getLast( ) const | Get an iterator to the last object in the structure |
| const_iterator getFirstConst( ) const | Return constant iterator to beginning of children. |
| const_iterator getLastconst( ) const | Return constant iterator to end of children. |
| int getNumChildren( ) const | Get the number of objects in the structure. |
| void insert( T*, element) | Insert the given object into the structure. Layout will be called if doLayout is true (This is the default). |
| void relativePlac ment( )<br>Perform layout on the objects in the structure. | Perform layout on the objects in the structure. |
| void remove( T*, element)<br>Remove an object from the structure. Layout will be called if doLayout is true. (This is the default) | Remove an object from the structure. Layout will be called if doLayout is true. (This is the default) |
| void set<ATTRIBUTE>(arg)<br>Get<ATTRIBUTE> ( ) | Set the appropriate attribute.<br>Get the appropriate attribute. |

Each structure may have additional methods that only apply to it. More details can be found by looking at the interface of a particular class in automatically generated documentation or the header files.

5.3.8.1 Memory Allocation

The template classes are not responsible for memory allocation/de-allocation for the T* objects. In the users application the T objects should be maintained and pointers passed to the structure templates. The application will be responsible for complete control of the T objects.

5.3.8.2 Relative Placement

It is up to the user of the template object instance to call relativePlacement( ) when they want the layout algorithm to run for a particular layout structure. The layout algorithms will use the templated objects' getBoundsRadius( )call to ensure no overlap of the objects that are being placed.

5.3.9 T Interface

The object for instantiating a LSTL class must provide the interface as shown in Table 7.

TABLE 7

| T Interface | |
|---|---|
| Method | Description |
| void setLocaeion( float x, float y. float z) | Each layout algorithm will call this method in order to set the location for each object |
| void getLocation ( float& x, float& y. float& z) | The current location of the object. |
| char* getId ( ) | A unique identifier for the object. |
| float getBoundsRadius( ) | Each algorithm will take into account the size of each object in the structure when laying them out. This call should return the radius of a sphere which completely encompasses the object. |

6. Appendix for GeoView

This section contains a glossary to the SDD for the GeoView module. It contains abbreviations and definitions of terms used in the SDD.

7.1 Abbreviations

The following are abbreviations used in this document.

| Term/Acronym | Meaning |
| --- | --- |
| CCI | Component Control Interface |
| CSCI | Computer Software Configuration Item |
| DID | Data Item Description |
| LRA | Layout Rule Argument |
| LSTL | Layout Structure Template Library |
| SDD | Software Design Description |
| SSDD | System/Subsystem Design Description |
| SSS | System/Subsystem Specification |

7.2 Definition of Terms

The following are terms used in this document.

| Term | Description |
| --- | --- |
| Address | A character string uniquely identifying the event and operation. |
| Attachment | A child object in an attached-to relationship with a parent object. |
| Attributes | String representations of the facets of a world object or relationships to other world objects. |
| Batching | Grouping of two or more events. |
| Bounds Radius | The radius of influence about an object in GeoView. |
| Building | The act of giving information to the renderer to render a leaf node. |
| Composition | Two or more objects in an attached-to or located-in relationship. |
| Configuration Item | The base level abstract class that holds the name of an object and methods for insertion, deletion and lookup of other objects. |
| Containment | A child object in a located-in relationship with a parent object. |
| Edge | A physical line interconnecting two leaf nodes. |
| Events | External information arriving in the form of network objects. |
| Layout | The act of combining the processes of leaf building, layout rule application, edge creation and object placement. |
| Layout Rules | Rules specifying the attachment, containment or layout structure grouping of a leaf node (representing a world object) based on its attributes. |
| Layout Structure | A logical grouping construct that does placement on child leaves based on the shape of the structure. |
| Leaf Node | GeoView's graphical building blocks representing objects in the world. |
| MasterTable | A hierarchical set of mappings from world objects to leaf nodes specifying visual attributes and layout rules. |
| Network Object | An container of one or more attributes. |
| Node | The abstract base parent of layout hierarchy classes. |
| Object | Represents either a leaf or layout structure in GeoView. |
| Parent | The node directly above the current one in the layout hierarchy. |
| Placement | The act of placing an object in the GeoView Universe either absolutely or relatively. |
| Relationship | A string describing the logical connection between two leaf nodes. |
| Root | The singleton instance at the top of the layout hierarchy. |
| Scene Graph | The Java 3D API data structure for rendering in 3D worlds Singleton Recognised design pattern that is used to create a class that is guaranteed to have only one object instance in the application. |
| Structure | A Layout Structure that is a direct child of the top-level structure |
| Sub-structure | A Layout Structure that is a direct child of a parent leaf node. Used for grouping leaf nodes that are in a composite with the parent node. |
| Top Level | The top most structure level of the layout hierarchy where the parent structure is the top level structure. |
| World Objects | Physical or logical objects that exist or are defined in the real world e.g. Computer, Shared Data Link |

Part 5 Tardis Specification

1. Tardis Specification

Tardis is briefly discussed in Section 2.1.4 of the Shapes Vector Overview, Part 1 of this specification.

The following is a preferred specification of its characteristics in the embodiment described. However, it is also possible for the Tardis to operate independently and/or in conjunction with other elements not related to elements of the preferred embodiment.

It is possible for Tardis to operate with just the Gestalt or just one observation sub-system such as Geo View or Data View. It is also possible to construct configurations of the Shapes Vector system in which the event outputs from agents is fed via the Tardis to a third-party visualisation or analysis system, or to a text-based event display. In cases where time-based queuing and semantic filtering of events is not required, the system could alternatively be configured in such a way as the event outputs from agents are delivered directly to one or more of the view components in a real time visualisation system.

1.1 Introduction

The Tardis is the event handling sub-system of Shapes Vector. It manages incoming events from a system Client, in a typical arrangement the Gestalt, and makes them available for Monitors (a recipient observation sub-system) to read. There can be many Clients and Monitors connected to the Tardis at the same time.

The Tardis receives events from Clients via connections through Tardis Input Portals, and uses Shared Memory as its form of inter-process communication with Monitors. Tardis Input Portals support different types of connections, such as socket transaction.

The flow of data through the Tardis is in one direction only, the Tardis reads from the connections with the Clients, and writes to Shared Memory.

1.2 Assumptions

For the purpose of this disclosure of a preferred embodiment, it is assumed that the reader is familiar with the products, environments and concepts that are used with the Shapes Vector infrastructure disclosed earlier in this specification.

2. Overview of the Tardis

The Tardis receives events from one or more Clients/Sources that can be located physically close or remote from the Tardis and supplies them to Recipient Systems that also can be remotely located. A Recipient system may also be a Client/Source. Each Client/Source associates with each event an ordered data value that is, in an embodiment, one of an incrementing series of data values. Typically the ordered data value is representative of real or synthetic time as gauged from an agreed epoch. Since the data value can be compared with other data values they are useful for ordering events within a common queue (the term slot is also used in this specification to describe the function of a queue). Since different events in different queues can have the same data value they can be identified or grouped to provide a temporal view of the events that does not have to be a real time view. For example, by creating one or more spans or changing the magnitude of the span of the data values output by the Tardis it is possible to provide control over time and then present events to the Recipient systems relating to those times. The timed event output to a Recipient system could be in synchronisation with real time, if desired by the user observing the system Recipient system output. It is also possible to change the rate of flow of the data values selected for output from the Tardis thus controlling the time span over which those events are presented for observation. There may be triggers available to initiate one or more time related outputs that can be set by the observing user to assist their detection of predetermined events. Further the triggers and their effect may be determined by way of calculations on data values set by the user of the system. Not all events are of the highest importance hence there is a means by which different priority can be allocated for each event and handled by Tardis. So that an event's priority will determine its order of output from Tardis and/or whether the event can be discarded under certain circumstances such as when the system is under extreme load. The unify bit described in this specification is an embodiment of the event prioritization system.

There is an agreed semantic associated with each event and there will exist in Tardis a slot for each semantic.

2.1 Components

The Tardis uses several different threads during execution, each fulfilling different roles within the Tardis. There is the Tardis Master Thread (M Thread), a set of Event Processing Threads (X Threads), a set of Update Threads (Y Threads), a set of New Connection Threads (Z Threads) and a set of Control Socket Threads (C Threads).

The Tardis is comprised of various data structures, such as the Tardis Store, Slots, Cells, Cell Pools and their Managers.

2.2 Overview of Operation

As the M Thread starts, it creates a set of Input Portals, which represent the conduits through which Clients send events to the Tardis. Each Input Portal creates a Z Thread to manage new connections for the Input Portal. The M Thread then creates a set of X Threads (as many as specified by the user) and a set of Y Threads (as many as specified by the user). It also creates some C Threads for communication with external processes via CCI (Component Control Interface), and creates the Tardis Store. Note that the Tardis is a process, which contains many threads, including the original thread created by the process, the M Thread.

The X Threads grab events coming in from the Input Portal Connections and place them in their corresponding queues in the Tardis Store. The Tardis Store resides in shared memory. When a clock tick occurs, an update begins, which requires the Y Threads to update the preferred double buffered event lists (there are write lists and read lists, which switch every update, giving double buffered behaviour). When a switch occurs, a new set of event lists is presented to the Monitors.

The Tardis is able to accept a specified set of instructions/requests from external entities through any one of its CCIs. This functionality is provided via the C Threads, providing external control and instrumentation for the Tardis.

3. Tardis Concepts 3.1 Events

An event is used to represent the fact that some occurrence of significance has taken place within the system, and may have some data associated with it. There is a global allocation of event identifiers to events with associated semantics in the system.

Conceptually, all events in the Tardis are the same, but in implementation, there are two event formats. The first is an incoming (or network) event, as received by the Tardis via an Input Portal Connection from Clients. This event consists of an identifier, a timestamp, an auxiliary field and a variable length data field. The auxiliary field contains the event's unify flag, type, the length of the event's data (in bytes) and some unused space.

The second event format is an Event Cell, as used within the Tardis and read by Monitors. Event Cells share some of the fields of an incoming event. They have a Cell Pool Manager pointer (which points to the Cell Pool Manager who manages the cell), a next cell and previous cell index (to link with other Event Cells), a first Data Cell index (to link with a Data Cell), a timestamp, an auxiliary field (same content as for an incoming event) and a fixed size data field.

The Cell Pool Manager pointer is used when placing a cell back into a free cell list (within the relevant Cell Pool Manager). The next cell index is used when the cell is in a free cell list, a data Cell list or an Event Cell queue or list. The previous Event Cell index is used when the Event Cell is in an Event Cell queue. The only other difference between a network event and an Event Cell is that an Event Cell has a fixed size data field and a first Data Cell index instead of a variable length data field. For reasons of efficient storage, the first part of the variable length data field is placed in the fixed size data field of the Event Cell. The rest is placed in a sequence of Data Cells which each point (via an index, not an address) to the next Data Cell, with the last possibly being partially filled. The first of the sequence of Data Cells is pointed to by the first Data Cell index.

The identifier, auxiliary field and timestamp are 64 bits each, with the timestamp being conceptually divided into two 32 bit quantities. Within the auxiliary field, the unify flag is 1 bit, the type is 4 bits and the data length is 16 bits (the data length is expressed in bytes, allowing up to 64 Kb of data to accompany each event). This leaves 43 bits of unused space in the auxiliary field.

The cell indices are all 32 bit (allowing a Cell Pool with more than four billion cells). The size of the fixed size data field is to be specified at compile time, but should be a multiple of 64 bits.

For strong reasons of efficiency and performance, Event Cells and Data Cells are stored together in common pools and are the same size. The format of a cell (Event and Data Cell) is shown in FIG. 23.

The following are examples of some events:

1. object information (one event id for each type of object)
   signal that a new object has been discovered or that an update of the attributes of the object is available.

2. object attribute information (again one event id for each type of object)
   signal that there is new or updated information for an object attribute.

3.2 TimeStamp

The timestamp indicates the time at which the event was generated at the source. It consists of two 32-bit quantities indicating with second and nanosecond components the elapsed time since 00:00 Universal Time (UT) 1 Jan. 1970. Note that specifying this in terms of Universal Time allays any potential problems with events from different time zones. The timestamp is read but not modified by the Tardis. It is stored as a single 64-bit quantity, and should be stored so that the Tardis using a single 64-bit instruction can compare timestamps. The Clients are responsible for ensuring the timestamp is in an appropriate format.

3.3 Shared Memory

The Tardis creates a shared memory segment during start-up. This is so that the Tardis and a number of Monitor processes have fast access to the Tardis Store, which contains all the structures relevant to the Monitors as depicted in FIG. 24.

3.4 Time

Dealing with time within Shapes Vector is complex and raises many issues. The issues range from the relatively simply issue of having to deal with different time zones (from sensors distributed about the place), to synthetic time and its relationship with events in the Tardis.

3.4.1 Universal Time

In order for events to be collated and assessed there needs to be a global clock or frame of reference for time with which events can be time encoded. The standard Universal Time (UT) is an obvious candidate for such a frame of reference.

3.4.2 Synthetic Time

Synthetic time is closely associated with the read lists. The actual synthetic time indicates the time associated with the read lists as read by the Monitors.

The Tardis maintains a Synthetic Time Window, which has a width (the amount of synthetic time between the beginning and end of the window) and a velocity (the amount of synthetic time the window moves by after each clock tick). The front edge (towards the future) of the window represents the Current Synthetic Time. Synthetic Time and the Synthetic Time Window are shown in FIG. 25.

Updates occur at every clock tick. During the update process, the Y Threads use the Synthetic Time Window to process events. Note that the Synthetic Time Window has no relation with real time, and has no bearing on the amount of real time between updates, since the timing of an update is controlled by an external clock mechanism.

The Synthetic Time Window is used to guide the processing of events.

3.5 Process and Thread Activity

The Monitors and Clients operate independently of the Tardis in different processes. The Tardis process consists of several different types of Threads, whose behaviour needs to be controlled to protect shared data.

In order to control the threads, the MThread needs to be able to signal some threads to engage and to disengage. In order to ensure a thread has disengaged, the MThread needs to signal the thread to disengage, and then confirm a response from the thread indicating it has indeed disengaged. This introduces a problem, in that the MThread may signal a thread to disengage, but the thread in question may be busy, and will not check to see if it should disengage in a timely fashion. In this event, the M Thread will be wasting time waiting for the response. In some cases, this is unavoidable, however, the thread may be engaged in an activity which is thread safe. If this is the case, the MThread should not wait for a response from the thread, and can continue safely, so long as the busy thread checks to see if it should disengage before engaging in thread unsafe activity.

Hence each thread should have a flag it maintains indicating whether it is engaged or not. It should also have a flag it maintains indicating whether it is safely engaged or not. Finally, the M Thread should maintain a flag per type of thread it controls (ie. one for X Threads, one for Y Threads and one for Z Threads).

4. Functional Overview of the Tardis

4.1 Tardis Threads

The Tardis is made up of several different types of threads which work together to make the Tardis function. The M Thread is the master thread, and controls the other threads and the update process. X Threads have the job of reading events from the Input Portals, obtaining and populating Event and Data Cells and placing the Event Cells in the appropriate Slot's queue. Y Threads are called on during every update to take certain Event Cells from a Slot's queue, and to place them in the Slot's event list. Z Threads are responsible for creating new connections with Clients through the Input Portals. C Threads are responsible for handling CCI commands and requests.

This is shown in FIG. 26.

Note that the M Thread is the only thread that directly interacts with another thread.

The scheduling of these threads is important, and revolves around an update, which occurs when a clock tick occurs. When the Tardis is not doing an update, the X Threads are handling incoming events and the Z Threads are handling new connections. When an update occurs, the X and Z Threads are disengaged and the Y Threads engaged to update the event lists. At the end of an update, the Y threads are disengaged and the X and Z Threads engaged again.

The M Thread and the C Threads are never disengaged.

FIG. 27 shows when each thread and process is waiting (to be engaged or for the M Thread, for a clock tick). The shaded areas show where the thread or process is not waiting.

The shaded areas represent time periods where:

Client processes are possibly sending events throughout the time they are connected to the Tardis. The Tardis does not have an effect on the process activity of Clients or Monitors. Note that a Client may produce a burst of events and then shutdown, or it may run for an extended period of time, possibly sending events continually or sporadically.

Monitors are able to read the current read lists. They are able to detect any event list switching during reading. Note that if the Monitors finish their processing of the read lists and cells, they wait until the next update to go into action again.

The Tardis is receiving events from Clients and making events available to Monitors.

The M Thread is controlling an update.

The X Threads are engaged and busy storing incoming events. They are also detecting Input Portal Connections that have timed out and adding them to their own "to-remove" lists of Input Portal Connections.

Y Threads are updating the next read lists (the current write lists) and discarding old non-unified events.

Z Threads are accepting Client requests for new Input Portal Connections. They are also creating new Input Portal Connections and placing them in their own "to-add" lists of Input Portal Connections.

C Threads are servicing requests and commands received via CCI.

The X Threads loop through Input Portal Connections, and collect ones which timeout, but do not modify the list of Input Portal Connections. The Z Threads create new Input Portal Connections, but also do not modify the list. This is to avoid X and Z Threads blocking each other over access to the shared list. However, whilst both are disengaged, the to-add and to-remove lists each maintained are used to modify the shared list.

4.2 Tardis Operation

Upon start-up, the MThread creates the shared memory segment, creates a set of Input Portals (and a Z Thread per Input Portal), creates a number of X Threads and Y Threads and then sits in a loop. When a new Client requests an input connection on an Input Portal, the Z Thread for that Input Portal creates an Input Portal Connection object which is later added to the M Thread's Input Portal Connection list.

The Tardis has a number of X Threads responsible for the management of incoming events. X Threads grab events from Input Portal Connections, so each Input Portal Connection needs to be protected by a lock. These events are stored directly into the event queue of the appropriate Slot by the X Threads, so each Slot needs to be protected by a lock. Hence an X Thread can be blocked attempting to get the lock on an Input Portal Connection, and then on the resulting Slot. This should be expected, and by having many X Threads, such blocking need not significantly affect performance (the more X Threads there are, the more blocking will occur, but it will be less significant because other X Threads will use the time constructively).

When a clock tick occurs, the M Thread begins an update. First it flags the X Threads and Z Threads to disengage and ensures they are disengaged or safely executing. Then it signals the Y Threads to engage. When the Y Threads have finished the update, they are disengaged and the X and Z Threads are engaged.

The MThread then updates the current synthetic time, switches the event lists, increments the update counter and prepares the write lists for writing (discarding events in the write lists, which have been read by Monitors). The order of the last operations is critical as the current synthetic time must be updated before the event lists are switched which must be done before incrementing the update counter. The order is used by the Monitors to detect a switch and preserve data integrity.

The Tardis uses multiple Z Threads (one per Input Portal) to accept new Client requests for an Input Portal Connection. For the purpose of protecting data from being written to whilst being read, or written to simultaneously, the Z Threads are placed in a wait state at the same time as the X Threads, and started again at the same time as the X Threads. This means that at any one time, either the Z Threads or the M Thread has access to the Z Threads' to-add lists.

However, the Z Threads may be blocked whilst accepting new connections, so the Z Threads indicate if they are in a safely executing state. The Z Threads relieve from the MThread the job of accepting and creating new connections, which leaves the M Thread better able to maintain responsiveness.

The X and Y Threads may also declare themselves as safely executing in order to reduce the latency that comes with waiting for all X or Y Threads to disengage.

4.3 Tardis Store

FIG. 28 gives an overview of the array of Slots residing within the Tardis Store in shared memory. Each Slot has an index to the first and last Event Cells in its Event Cell queue. It also has an index to the first event in the read and write lists. All Event Cells and Data Cells are from a Cell Pool, although which pool does not matter.

In order to store an event, X Threads first look-up the event id in a Slot Mapping Array. This returns an index to the array of Slots. The Slot contains all the entities the X Thread needs to perform its operations (indices, lock, Guaranteed Cell Pool, unify flag etc.). With this information, the X Thread can obtain and populate the Event Cell and required Data Cells. The X Thread can also insert the Event Cell in the Slot's queue after getting hold of the lock for that Slot (as there could be multiple X Threads trying to insert Event Cells in the same Slot's queue). The event queue for each Slot is time-ordered (based on each Event Cell's timestamp). The last Event Cell in the queue has the largest timestamp the first in the queue is the smallest. The event queue is represented by the first and last Event Cell indices.

The event lists shown in FIG. 29 have their roles switch between the read and write lists each update. These lists are represented by an index to the first Event Cell in the list (the oldest). The lists are separated (broken) from the queue by clearing the index pointers between the newest event in the list and the oldest event in the queue. Hence the Y Threads merely manipulate Slot and Event Cell indices.

When a switch occurs at the end of an update, the event list nominated as the write list becomes the read list (from which Monitors can access the events) and the event list nominated as the read list becomes the write list (which Y Threads will manipulate during the next update).

The event lists are strictly controlled via several variables for each Slot. These define:

1. The maximum number of events allowed in an event list.

2. The maximum number of unified events allowed in an event list.

3. The maximum number of non-unified events allowed in an event list.

The variables are adhered to in the order of the potential events. Table 1 below gives some examples for a potential event queue of: "U, U, N, U, N", with the last event at the head:

TABLE 1

| Max Events | Max Unified | Max Non Unified | Added Unified | Added Non Unified |
|---|---|---|---|---|
| 1 | 1 | 1 | 0 | 1 |
| 10 | 10 | 0 | 3 | 0 |
| 5 | 5 | 5 | 3 | 2 |
| 4 | 3 | 3 | 2 | 2 |
| 3 | 2 | 2 | 1 | 2 |

The three variables provide flexible control over the lists. Similarly, there are variables accessible via CCI to monitor the demand for places in an event list (from queued events), and the events which get into an event list (listed events).

Initially, max events is 1, max unified is 1 and max non unified is 1, as in the case of the first example in the table above. This gives behaviour similar to that of Tardis 2.1, where only one event can be made available to Monitors per update, and it is the first potential event in the event queue.

For an event that is received by the Tardis, it can "leave" the Tardis in one of three ways:

Discarded—An event is discarded if it is never considered for placing into an event list. This could be because an X Thread determined it could discard the event, that is, not insert it in an event queue. An event is also discarded if it is placed in a queue, but subsequent changes to the Slot's unify flag and a subsequent call to clear the queue out resulted in it being discarded.

Expired—The event made it into an event queue, but was removed by a Y Thread from the event queue because it did not meet the criteria to get into a read list and synthetic time passed it by (non unified).

Listed—The event made it into an event queue and into a read list and was made available to Monitors. Eventually it was cleared out of a write list.

4.3.1 Guaranteed Cell Pools

The Cell Pool holds a Guaranteed Cell Pool dedicated for each Slot as well as the Shared Cell Pool, which it uses to store the incoming events and data. When a cell (event or data) is required for a Slot, the Slot's Guaranteed Cell Pool Manager is used. If the Guaranteed Cell Pool Manager is unable to supply a cell (ie. it has no free cells), it attempts to get a cell from the Shared Cell Pool Manager.

The total number of cells allocated on start-up by the Cell Pool (Ntc) is given by the following formula:

$Ntc = (Ngc*Ns) + Nsc$ where,

Ngc is the number of guaranteed cells per Slot, ie. per Guaranteed Cell Pool

Ns is the number of Slots, and

Nsc is the number of shared cells within the Shared Cell Pool.

The Shared Cell Pool and the Guaranteed Cell Pools behave in the same way, they maintain a linked list of free cells and they have a lock for accessing that list. Each cell has a Cell Pool Manager pointer so that it can be returned to the appropriate Cell Pool Manager's free cell list.

Hence no entity in the Tardis needs to make a distinction between a guaranteed cell and a shared cell

5. Tardis Clock

A Tardis Clock is a process, which sends clock tick commands to the Tardis' Synthetic Time CCI server. This action triggers an update in the Tardis and provides the mechanism for the Tardis to move through synthetic time and make events available to Monitors. The rate at which clock ticks are received by the Tardis in real time is the update rate in real time. It should be noted that if the Tardis' synthetic time window is less than the Tardis Clock's period, then it is possible that the Tardis' synthetic time could move ahead of real time.

5.1 Clock Ticks

Clock ticks occur when a set of rules defined by a virtual FPGA (Field Programmable Gate Array) is satisfied. The inputs to the FPGA is a word in binary form, where each bit corresponds to the availability of a clock event for that bit position.

The FPGA is shown in FIG. 29, with the table representing the fuse bits shown below along with the resulting clock tick expression:

tick = (A & C) or (A & B & C) or (C) or (A & B & C)

The fuse bits allow rules to be applied to the input word bits (A, B, C, . . . ) to determine whether a clock tick should occur. A fuse bit of 1 means it is not blown and the relevant bit is input to the relevant AND gate. The results are combined by an OR gate. If a row of fuse bits is not needed then the fuse bits should all be 0.

Table 2, of clock counters is also maintained, as is shown below. When a clock event with a certain ID is received, the clock event count for that event is incremented. When a clock tick occurs, all clock event counters are decremented (but cannot be less than zero). A bit of the FPGA input word is formed if the corresponding counter is non zero:

TABLE 2

| Clock Event ID | Clock Event counter | FPGA Input word (1) |
|---|---|---|
| 0 | 4 | 1 |
| 1 | 1 | 1 |
| 2 | 0 | 0 |
| 3 | 1 | 1 |

If each row of fuse bits is considered a binary word (W1, W2, W3, . . . ) then a rule will fail if:

rule fail = !I & W

So a tick should not occur when:

tick fail = (!I & W1) & (!I & W2) & (!I & W3)

Therefore a tick should occur when:

tick = !((!I & W1) & (!I & W2) & (!I & W3))

This can be evaluated very quickly. Note that since it is assumed that the Tardis is built for a 64-bit architecture, we can allow for 64 unique clock event IDs and as many rules as required. If we allow for n rules, the fuse bit table uses n 64 bit words.

Event IDs are allocated to clock event sources via CCI, which can also be used as a mechanism to modify the FPGA fuse bit table and the clock event counters.

6. Monitors

Monitors connect to the shared memory segment created by the Tardis on start-up.

This allows the Monitors to be able to read data from the Tardis Store, such as the read lists that have just been processed by the Tardis. Note that they may use a Tardis Store Proxy to do this.

The Monitors need to wait until a switch has occurred, and they need to be able to detect a subsequent switch if one comes before they finish reading from the read list.

To do this, the Monitors wait for the update counter to change indicating a switch. They then read all the data it requires from the array, making local copies of data. It can verify the integrity of the data by checking that the timestamp has not changed.

This is required every time data is read from the array. Even if the timestamp has not changed, if a pointer is then used to get data, the timestamp needs to be checked again to ensure that the pointer hasn't been de-referenced. This means that a Monitor should collect all the data it needs from shared memory first, and then act on that data once its integrity has been verified.

There may be many different types of Monitors, but they need to get data from the Tardis in a similar way.

7. Clients

7.1 Overview

Clients communicate with the Tardis via Input Portal Connections. The Tardis' Z Threads almost continuously check for new Clients so they can accept new Input Portal Connections.

Connections can be made through different Input Portals, so the Tardis may have Clients sending events via sockets, and other paths, such as via shared memory.

The user and the Clients can request the number of available Inputs Portals, the type of available Input Portals, their identifiers and the details for available Input Portals from the Tardis via CCI, and then establish connections on a specific Input Portal (as specified by type and identifier). An identifier is preferably an ordered data value associated with the event by the Client. It may in a preferred embodiment be a integer within a range of natural numbers.

There may be many different types of Clients, but they need to send data to the Tardis in a similar way.

Tardis Appendix/Glossary

A.1 Tardis

The Tardis is the event handling sub-system for Shapes Vector. The Tardis receives events from Tardis Clients and stores the events in shared memory for Tardis Monitors to read.

A.2 Tardis Monitor

Tardis Monitors are the event observation sub-systems for Shapes Vector. They read and process the events made available for Monitors by the Tardis.

A.3 Tardis Client

Tardis Clients connect to the Tardis and send events through an Input Portal Connection. The Input Portal can be of several different types, such as a socket connection or shared memory.

A.4 Input Portal

An Input Portal is an object representing a conduit through which events are sent to the Tardis. Each Input Portal can have multiple Input Portal Connections that are specific connections through an Input Portal through which a single Client sends events to the Tardis. Each Input Portal has a type and an identifier.

A.5 Mutex

Mutexes are mutual exclusion locks that prevent multiple threads from simultaneously executing critical sections of code, which access shared data.

A.6 Semaphore

A semaphore is a non-negative integer count and is generally used to coordinate access to resources. The initial semaphore count is set to the number of free resources, then threads increment and decrement the count as resources are added and removed. If the semaphore count drops to zero, which means no available resources, threads attempting to decrement the semaphore will block until the count is greater than zero.

A.7 X Threads (Event Processing Threads)

X Threads are responsible for obtaining a new event from the Input Portal Connections and processing the event by storing it in the Tardis Store. They also detect timed out Input Portal Connections.

A.8 Y Threads (Array Managing Threads)

Y Threads are responsible for updating the lists of events to be read by the Monitors. They do so by manipulating Slot and Event Cell indices for event queues. Y Threads are each responsible for updating the event queue for a specified range of Slots.

A.9 Z Threads

Z Threads are responsible for accepting new connection requests from new Clients and creating new Input Portal Connections. These Input Portal Connections are added to a list, which is added to the M Thread's list when the Z Threads are waiting.

A.10 Guarantee

Guarantees are a set of pre-allocated Event/Data Cells (created upon start-up), used as the first choice of storage area for events and data for each Slot.

Tardis Features Summary

TARDIS features specifically include:
1. A set of slots where each semantic is associated with a unique slot. No slot is reused as the system evolves.
2. A slot logic, which allows for flexible handling of prioritised events.
3. A synthetic clock which can be set to tick in a flexible user-specified manner.
4. A taxonomy superimposed over the slots in order to group and catalogue like semantics It will be appreciated by those skilled in the art, that the inventions described herein are not restricted in their use to the particular application described. Neither are the present inventions restricted in their preferred embodiments with regard to particular elements and/or features described or depicted herein. It will be appreciated that various modifications can be made without departing from the principles of these inventions. Therefore, the inventions should be understood to include all such modifications within their scope.

| | |
|---|---:|
| Part 1 SHAPES VECTOR | 1 |
| 1 Shapes Vector Introduction | 1 |
| 2 Architectural Components | 8 |
|   2.1 Primary Functional Architecture | 8 |
|     2.1.1 Configuration Interface and I/O Sub-system | 8 |
|     2.1.2 Sensors | 9 |
|     2.1.3 Intelligent Agent Architecture | 10 |
|       2.1.3.1 Knowledge Base | 10 |
|       2.1.3.2 Intelligent Agents and Ontologies | 10 |
|     2.1.4 The Tardis | 11 |
|     2.1.5 Monitor | 11 |
|   2.2 The Hardware | 12 |
|   2.3 System Software | 13 |
| 3 The "Classical" Visualisation Paradigm | 14 |
|   3.1 Geo View | 16 |
|   3.2 Data View | 19 |
| 4 Intelligent Agents | 24 |
|   4.1 Agent Architecture | 24 |
|   4.2 Inferencing Strategies | 26 |
|     4.2.1 Traditional | 26 |
|     4.2.2 Vectors | 27 |
|   4.3 Other Applications | 31 |
| 5 Synthetic Stroboscopes and Selective Zoom | 32 |
|   5.1 Synthetic Strobes | 32 |
|   5.2 Selective Zoom | 33 |
| 6 Temporal Hierarchies | 35 |
|   6.1 Strobes Revisited | 35 |
|   6.2 User Information Overload | 36 |
|   6.3 Data Streams and IA's | 37 |
| 7 Other Visualisation Efforts | 38 |
|   7.1 NetPARS | 38 |
|   7.2 Security Visualisation | 40 |
|   7.3 Network Visualisation | 40 |
|   7.4 Data Mining | 41 |
|   7.5 Parentage and Autograph | 42 |
| Appendix Part 1- Custom Control Environments for Shapes Vector | 43 |
|   A.1 Strategic Environment | 44 |
|   A.2 Tactical Environment | 44 |
| PART 2 SHAPES VECTOR MASTER ARCHITECTURE | 46 |
| 1. Introduction | 46 |
|   1.1 Shapes Vector Master Architecture | 46 |
|   1.2 Precis of this part of the specification | 47 |
| 2. The Agent Architecture | 48 |
|   2.1 Agent Architecture | 48 |
|   2.2 A Note on the Tardis | 51 |
| 3. Inferencing Strategies | 52 |
|   3.1 Traditional | 53 |
|   3.2 Possiblistic | 53 |
|   3.3 Vectors | 54 |
|   3.4 Inferencing for Computer Security Applications | 58 |
|   3.4 Other Applications | 61 |
| 4. Rules for Constructing an Agent | 62 |
| 5. Agents and Time | 63 |
|   5.1 Data Streams and IA's | 63 |
|   5.2 Temporal Event Mapping for Agents | 65 |
| 6. Implications for Higher Level Agents | 66 |
| 7. Higher Level Ontologies | 67 |
|   7.1 Level 2 | 67 |
|     7.1.1 Relationships | 68 |
|     7.1.2 Interrogative Operators | 70 |
|   7.2 Level 3 and Above | 73 |
|   7.3 An Example of Possiblistic Querying | 74 |
|   7.4 An Example of the Use of Consistency | 76 |
| 8. User Avatars | 77 |
| 9. Further Comments on the Architecture | 78 |
| 10.1 AAFID | 79 |
| 10.2 Comparison with the Bass' Comments | 80 |
| 11. A Multi-Abstractional Framework for Shapes Vector Agents | 81 |
|   11.1 Concepts | 82 |
| 12. Summary | 84 |
| Part 3 DATA VIEW SPECIFICATION | 87 |
| 1. Data View Specification | 87 |
|   1.1 Universe | 87 |
|   1.2 Objects | 89 |
|   1.3 Aggregate Objects | 90 |
|   1.4 Object Selector | 92 |
|   1.5 Mass, Charge and Flavours | 93 |
|   1.6 Forces | 95 |
|   1.7 Phantoming | 96 |

-continued

| | |
|---|---|
| 1.8 Markers | 96 |
| 1.9 Radius of Influence Display | 97 |
| 1.10 Pulses | 97 |
| 1.11 Irregular Functions | 97 |
| Part 4 GEO VIEW SPECIFICATION | 99 |
| 1. Introduction | 99 |
| 1.1 Identification | 99 |
| 1.2 System Overview | 99 |
| 1.2.1 General | 99 |
| 1.2.2 Geo View Module Scope | 100 |
| 1.3 Overview | 100 |
| 2. Referenced Documents | 101 |
| 2.1 Standard | 101 |
| 3. Module-wide Design Decisions | 101 |
| 3.1 Design decisions and goals of Geo View | 101 |
| 4. Module Architectural Design | 102 |
| 4.1 Geo View Functional Design | 103 |
| 4.1.1 Geo View General | 103 |
| 4.1.1.1 Event Handling | 103 |
| 4.1.1.2 MasterTable Functionality | 103 |
| 4.1.1.3 CCI Interface | 104 |
| 4.1.1.4 GeoView Processing and Caching | 105 |
| 4.1.2 LayoutHierarchy | 107 |
| 4.1.2.1 Class Hierarchy | 107 |
| 4.1.2.2 Logical Object Hierarchy | 108 |
| 4.1.2.3 Processing | 110 |
| 4.1.3 Layout Structure Template Library (LSTL) | 112 |
| 4.1.3.1 GenericGraph | 113 |
| 4.1.3.2 GenericLine | 114 |
| 4.1.3.3 GenericMatrix | 114 |
| 4.1.3.4 GenericRing | 115 |
| 4.1.3.5 GenericStar | 115 |
| 4.1.3.6 GenericRectangle | 115 |
| 4.1.3.7 GenericTree | 116 |
| 4.2 Concept of Execution | 116 |
| 4.3 Interface Design | 116 |
| 5. Module Detailed Design | 117 |
| 5.1 Geo View Classes | 117 |
| 5.1.1 Geo View Class Summary | 117 |
| 5.2 LayoutHierarchy Classes | 118 |
| 5.2.1 LayoutHierarchy Class Summary | 118 |
| 5.2.2 Event Insertion and Removal Methods | 120 |
| 5.2.2.1 cfInsert | 120 |
| 5.2.2.2 Adding Inverse Attributes | 120 |
| 5.2.2.3 NetworkObject Insertion | 121 |
| 5.2.2.4 Attribute Insertion | 121 |
| 5.2.3 Layout Rule Application Methods | 122 |
| 5.2.3.1 applyLayoutstructureRulesToObject | 122 |
| 5.2.3.2 applyAttachedToRulesToObject | 124 |
| 5.2.3.3 applyLocatedinRulesTo Object | 125 |
| 5.2.3.4 findSatisfiedRules | 125 |
| 5.2.3.5 composeObjects | 126 |
| 5.2.4 Leaf Edge Creation Methods | 127 |
| 5.2.4.1 createEdges | 127 |
| 5.2.4.2 createEdge | 127 |
| 5.2.4.3 updateEdges | 128 |
| 5.2.4.4 addEdge | 128 |
| 5.2.4.5 addGEdge | 129 |
| 5.3 LayoutStnictureTemplateLibrary (LSTL) Classes | 129 |
| 5.3.1 LSTL Template Class Summary | 129 |
| 5.3.2 GenericGraph Methods | 130 |
| 5.3.2.1 Node Separation Factor | 130 |
| 5.32.2 Rank Separation Factor | 130 |
| 5.3.2.3 Orientation | 130 |
| 5.3.3 GenericLine Methods | 130 |
| 5.3.3.1 Axis | 130 |
| 5.3.3.2 Linear Direction | 130 |
| 5.3.3.3 Origin | 131 |
| 5.32.4 Separation | 131 |
| 5.3.4 GenericMatrix Methods | 131 |
| 5.3.4.1 Width Separation | 131 |
| 5.3.4.2 Depth Separation | 131 |
| 5.3.4.3 Delete Policy | 131 |
| 5.3.4.4 Origin Policy | 131 |
| 5.3.5 GenericRing Methods | 132 |
| 5.35.1 Angular Direction | 132 |
| 5.3.5.2 Radius | 132 |
| 5.3.5.3 Separation | 132 |
| 5.3.6 GenericStar Methods | 132 |
| 52.6.1 Root Height | 132 |
| 5.3.7 GenericRectangle Methods | 133 |
| 5.3.7.1 Angular Direction | 133 |
| 5.3.7.2 Start Side | 133 |
| 5.3.7.3 Width Separation | 133 |
| 5.3.7.4 Depth Separation | 133 |
| 5.3.7.5 Width | 133 |
| 5.3.7.6 Depth | 133 |
| 5.3.8 LSTL Class Interface | 134 |
| 5.3.8.1 Memory Allocation | 134 |
| 5.3.8.2 Relative Placement | 135 |
| 5.3.9 T Interface | 135 |
| 6. Appendix for GeoView | 135 |
| 7.1 Abbreviations | 135 |
| 7.2 Definition of Terms | 137 |
| Part 5 TARDIS SPECIFICATION | 139 |
| 1. Tardis Specification | 139 |
| 1.1 Introduction | 139 |
| 1.2 Assumptions | 140 |
| 2. Overview of the Tardis | 140 |
| 2.1 Components | 141 |
| 2.2 Overview of Operation | 142 |
| 3. Tardis Concepts | 142 |
| 3.1 Events | 142 |
| 3.2 TimeStamp | 144 |
| 3.3 Shared Memory | 145 |
| 3.4 Time | 145 |
| 3.4.1 Universal Time | 145 |
| 3.4.2 Synthetic Time | 145 |
| 3.5 Process and Thread Activity | 146 |
| 4. Functional Overview of the Tardis | 147 |
| 4.1 Tardis Threads | 147 |
| 4.2 Tardis Operation | 149 |
| 4.3 Tardis Store | 151 |
| 4.3.1 Guaranteed Cell Pools | 153 |
| 5. Tardis Clock | 154 |
| 5.1 Clock Ticks | 154 |
| 6. Monitors | 156 |
| 7. Clients | 157 |
| 7.1 Overview | 157 |
| Tardis Appendix/Glossary | 158 |
| A.1 Tardis | 158 |
| A.2 Tardis Monitor | 158 |
| A.3 Tardis Client | 158 |
| A.4 Input Portal | 158 |
| A.5 Mutex | 159 |
| A.6 Semaphore | 159 |
| A.7 X Threads (Event Processing Threads) | 159 |
| A.8 Y Threads (Array Managing Threads) | 159 |
| A.9 Z Threads | 160 |
| A.10 Guarantee | 160 |
| Tardis Features Summary | 160 |
| Claims defining the invention are as follows: | 166 |

The claims defining the invention are as follows:

1. A system for creating human observable objects in a modelling system consists of:
   one or more representations of real or virtual objects;
   a virtual universe;
   a mapping from a representation of a real or virtual object to a virtual object having at least one of visual, aural or haptic attributes wherein the position of a said virtual object in said universe is in accordance with layout rules, each rule expressed in terms of the representations of first and second real or virtual objects and the interrelationship between said first and second real or virtual objects and a related position determination.

2. A system according to claim 1 wherein said universe is two or three-dimensional.

3. A system according to claim 1 wherein said human can observe said universe from any position with any orientation.

4. A system according to claim 1 wherein a virtual object can be deleted or changed.

5. A system according to claim 1 wherein a virtual object is added.

6. A system according to claim 1 wherein said mapping is changed.

7. A system according to claim 1 wherein virtual objects are grouped.

8. A system according to claim 1 wherein a human temporarily changes the attributes or position of one or more virtual objects.

9. A system according to claim 1 wherein a function determined by a human determines a set of selected real or virtual objects that have a corresponding virtual object's attributes or position changed.

10. A system according to claim 9 wherein said human controls the degree of change.

11. A system according to claims 9 or 10 wherein a further function determined by a human determines a subset of said selected real or virtual objects that have a corresponding virtual object's attributes changed.

12. A system according to claim 1 wherein a human temporarily changes the attributes or position of one or more virtual objects for a predetermined period.

13. A system according to claim 9 wherein a corresponding virtual object's attributes or position are changed for a predetermined period.

14. A system according to claims 12 or 13 wherein said period begins when a predetermined event occurs in said universe.

15. A system according to claims 12 or 13 wherein said period begins at a predetermined time.

16. A system according to claims 12 or 13 wherein said period begins periodically.

17. A system according to claim 16 wherein said periodicity is changed by said human.

18. A system according to claim 1 wherein a human determines the position of a virtual object.

19. A system according to claim 1 wherein a human determines a set of real or virtual objects for which a predetermined layout rule applies.

20. A system according to claim 19 wherein said layout rule determines the relative position of virtual objects of said set to each other.

21. A system according to claim 1 wherein a human chooses an inter-relationship and all real or virtual objects having that relationship are positioned relative to each other according to a predetermined layout rule.

22. A system according to claim 20 wherein said layout rule determines the scale of representation of said one of more virtual objects relative to each other.

23. A system according to claim 1 wherein a human determines the real or virtual object represented as a virtual object that has at least one of visual, aural or haptic attributes or position determined by applying a predetermined time related function.

24. A system according to claim 23 wherein said virtual object exists in said universe for a predetermined time period.

25. A system according to claim 1 wherein said mapping determines an attribute value according to the first attribute, condition pair of an ordered list of pairs where the condition is satisfied by the representation of the real or virtual object.

26. A system according to claim 1 where there exists more that one possible position for a said virtual object and a priority rule determines the position of said virtual object in the universe.

* * * * *